US008350145B2

(12) United States Patent
Angel

(10) Patent No.: US 8,350,145 B2
(45) Date of Patent: Jan. 8, 2013

(54) PHOTOVOLTAIC GENERATOR WITH A SPHERICAL IMAGING LENS FOR USE WITH A PARABOLOIDAL SOLAR REFLECTOR

(75) Inventor: Roger P Angel, Tucson, AZ (US)

(73) Assignee: Arizona Board of Regents on Behalf of University of Arizona, Tucson, AZ (US)

( * ) Notice: Subject to any disclaimer, the term of this patent is extended or adjusted under 35 U.S.C. 154(b) by 588 days.

(21) Appl. No.: 12/463,016

(22) Filed: May 8, 2009

(65) Prior Publication Data

US 2009/0277498 A1   Nov. 12, 2009

Related U.S. Application Data

(60) Provisional application No. 61/127,298, filed on May 12, 2008.

(51) Int. Cl.
*H02N 6/00* (2006.01)
*H01L 31/042* (2006.01)
*H01L 31/00* (2006.01)

(52) U.S. Cl. ..................... 136/246; 136/248; 136/259

(58) Field of Classification Search ............... 136/246, 136/259, 248
See application file for complete search history.

(56) References Cited

U.S. PATENT DOCUMENTS 2,904,612 A * 9/1959 Regnier ..................... 136/246
(Continued)

FOREIGN PATENT DOCUMENTS
DE          3104690          8/1982
(Continued)

OTHER PUBLICATIONS

Reply to EPO Communication Pursuant to Rules 161(1) and 162 EPC from corresponding EPC Application No. 09 747 260.9, based on PCT/US2009/043378.

(Continued)

*Primary Examiner* — Mark F Huff
*Assistant Examiner* — Allison Bourke
(74) *Attorney, Agent, or Firm* — Snell & Wilmer L.L.P.

(57) ABSTRACT

The invention is a generator for photovoltaic conversion of concentrated sunlight into electricity. A generator according to the invention incorporates a plurality of photovoltaic cells and is intended for operation near the focus of a large paraboloidal reflector pointed at the sun. Within the generator, the entering concentrated light is relayed by secondary optics to the cells arranged in a compact, concave array. The light is delivered to the cells at high concentration, consistent with high photovoltaic conversion efficiency and low cell cost per unit power output. Light enters the generator, preferably first through a sealing window, and passes through a field lens, preferably in the form of a full sphere or ball lens centered on the paraboloid focus. This lens forms a concentric, concave and wide-angle image of the primary reflector, where the intensity of the concentrated light is stabilized against changes in the position of concentrated light entering the generator. Receiving the stabilized light are flat photovoltaic cells made in different shapes and sizes and configured in a concave array corresponding to the concave image of a given primary reflector. Photovoltaic cells in a generator are also sized and interconnected so as to provide a single electrical output that remains high and stable, despite aberrations in the light delivered to the generator caused by, for example, mispointing or bending of the primary reflector. In some embodiments, the cells are set back from the image formed by the ball lens, and part of the light is reflected onto each cell small secondary reflectors in the form of mirrors set around its perimeter.

45 Claims, 42 Drawing Sheets

U.S. PATENT DOCUMENTS

| | | | |
|---|---|---|---|
| 3,427,200 A * | 2/1969 | Ernest et al. | 136/246 |
| 3,552,941 A | 1/1971 | Giffen | |
| 3,756,797 A | 9/1973 | Akeyoshi | |
| 4,088,470 A | 5/1978 | Bourg et al. | |
| 4,180,414 A * | 12/1979 | Diamond et al. | 136/246 |
| 4,313,746 A | 2/1982 | Juras | |
| 4,436,373 A | 3/1984 | Kirsch | |
| 4,473,065 A | 9/1984 | Bates | |
| 4,525,196 A | 6/1985 | Fecik et al. | |
| 4,805,006 A * | 2/1989 | Yamaguchi et al. | 257/436 |
| 4,830,678 A * | 5/1989 | Todorof et al. | 136/259 |
| 4,999,059 A * | 3/1991 | Bagno | 136/248 |
| 5,118,543 A | 6/1992 | McColl | |
| 5,129,934 A | 7/1992 | Koss | |
| 5,147,437 A | 9/1992 | Bristol | |
| 5,169,456 A | 12/1992 | Johnson | |
| 5,281,249 A | 1/1994 | Hampton et al. | |
| 6,091,017 A * | 7/2000 | Stern | 136/246 |
| 6,257,022 B1 | 7/2001 | Caplan et al. | |
| 6,301,932 B1 | 10/2001 | Allen et al. | |
| 6,541,694 B2 | 4/2003 | Winston | |
| 6,739,729 B1 | 5/2004 | Blackmon et al. | |
| 6,895,145 B2 * | 5/2005 | Ho | 385/35 |
| 7,076,965 B2 | 7/2006 | Lasieh | |
| 7,297,865 B2 * | 11/2007 | Terao et al. | 136/246 |
| 2001/0036024 A1 | 11/2001 | Wood | |
| 2003/0005954 A1 * | 1/2003 | Emoto et al. | 136/244 |
| 2004/0107731 A1 | 6/2004 | Doehring et al. | |
| 2005/0051205 A1 | 3/2005 | Mook et al. | |
| 2005/0166957 A1 * | 8/2005 | Imoto et al. | 136/263 |
| 2006/0231133 A1 | 10/2006 | Fork | |
| 2006/0243319 A1 | 11/2006 | Kusek | |
| 2007/0089774 A1 | 4/2007 | Lasich | |
| 2007/0089778 A1 * | 4/2007 | Horne et al. | 136/246 |
| 2007/0256726 A1 | 11/2007 | Fork et al. | |
| 2007/0272666 A1 | 11/2007 | O'Brien | |
| 2008/0000516 A1 | 1/2008 | Shifman | |
| 2008/0047605 A1 | 2/2008 | Benitez et al. | |

FOREIGN PATENT DOCUMENTS

| | | |
|---|---|---|
| DE | 202007016715 | 3/2008 |
| EP | 1903155 | 3/2008 |
| EP | 1956662 A2 | 8/2008 |
| EP | 1956662 A3 | 12/2009 |
| GB | 770097 | 3/1957 |
| JP | 58-194751 | 11/1983 |
| JP | 63-021229 | 1/1988 |
| TW | 332104 | 11/2007 |
| WO | WO 2005/042420 | 5/2005 |
| WO | 2008013976 | 1/2008 |
| WO | 2008043871 | 4/2008 |
| WO | 2009008996 | 1/2009 |
| WO | 2010091391 | 8/2010 |

OTHER PUBLICATIONS

The International Preliminary Report on Patentability from related Int'l Application No. PCT/US2009/043377 (corrected version) dated Jan. 20, 2011.

Reply to EPO Communication Pursuant to Rules 161(1) and 162 EPC from related EPC Application No. 09 747 261.7, based on PCT/US2009/043381.

Reply to EPO Communication Pursuant to Rules 161(1) and 162 EPC from related EPC Application No. 09 747 259.1, based on PCT/US2009/043377.

Dan Friedman, National Solar Technology Roadmap: Concentrator PV, Magament Report NREL/MP-520-41735, Solar Energy Technologies Program, Jun. 2007, pp. 1-3 (draft version), U.S. Department of Energy.

Geoffrey S. Kinsey, et al., Multijunction Solar Cells for Dense-Array Concentrators, pp. 625-627, 2006, 1-4244-0016-3, IEEE.

David Faiman, Large-Area Concentrators, 2nd Workshop on "The path to ultra-high efficient photovoltaics," Oct. 3-4, 2002, pp. 1-8, JRC Ispra, Italy.

Anja Royne, et al., Cooling of Photovoltaic Cells Under Concentrated Illumination: A Critical Review, Solar Energy Materials & Solar Cells, 2005 (available on-line Oct. 28, 2004), pp. 451-483, 86, Elsevier B.V.

The International Search Report and Written Opinion from corresponding Int'l Application No. PCT/US09/043377 dated May 28, 2010.

The International Search Report and Written Opinion from related Int'l Application No. PCT/US09/043381 dated Aug. 25, 2009.

The International Preliminary Report on Patentability from related Int'l Application No. PCT/US09/043381 dated Aug. 16, 2010.

The International Search Report and Written Opinion from related Int'l Application No. PCT/US09/043378 dated Jun. 9, 2010.

Geoffrey S. Kinsey et al., Concentrator Multijunction Solar Cell Characteristics Under Variable Intensity and Temperature, Progress in Photovoltaics: Research and Applications, May 1, 2008 (online), pp. 503-508, 16, John Wiley & Sons, Ltd.

Sarah Kurtz, Opportunities and Challenges for Development of a Mature Concentrating Photovoltaic Power Industry, Technical Report NREL/TP-5200-43208, Jun. 2011 (revised), pp. 1-32, U.S. Department of Energy.

Ugur Ortabasi et al., Dish/Photovoltaic Cavity Converter (PVCC) System for Ultimate Solar-to-Electricity Conversion Efficiency General Concept and First Performance Predictions, pp. 1616-1620, 2002, 0-7803-7471-1, IEEE.

Examiner's Report in European Application No. 09747259.1.

Examiner's Report in Great Britain Application No. 1019206.0.

AU; Examination Report dated May 9, 2011 in Application No. 2009246637.

GB; Examination Report dated Sep. 16, 2011 in Application No. GB1019160.9.

AU; Examination Report dated Oct. 4, 2011 in Application No. 2009246639.

DE; Office Action dated Jan. 10, 2012 in Application No. 11 2009 001 131.4-45.

AU; Examination Report dated May 10, 2011 in Application No. 2009246638.

KR; Notification of Provisional Rejection dated in Aug. 29, 2011 in Application No. 10-2010-7025551.

PCT; International Preliminary Report on Patentability dated Mar. 29, 2011 in Application No. PCT/US2009/043378.

GB; Examination Report dated Sep. 16, 2011 in Application No. GB1019139.3.

GB; Examination Report dated Jan. 11, 2012 in Application No. GB1019139.3.

USPTO; Notice of Allowance dated Aug. 24, 2011 in U.S. Appl. No. 12/463,026.

Examination Report dated Jul. 10, 2012 in European Application No. 09747261.7.

Examination Report dated May 21, 2012 in European Application No. 09747260.9.

Office Action in Mexican Application No. MX/a/2010/12356.

Combined Search and Examination Report dated Jul. 24, 2012 in Great Britain Application No. 1203267.8.

Examination Report dated Jul. 24, 2012 in Great Britain Application No. 1019139.3.

Office Action dated Jul. 3, 2012 in Chinese Application No. 20090116968.8.

\* cited by examiner

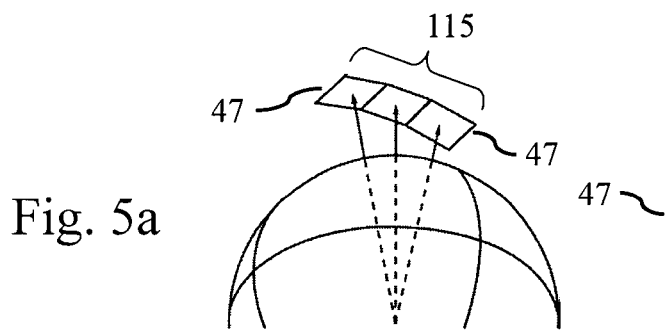
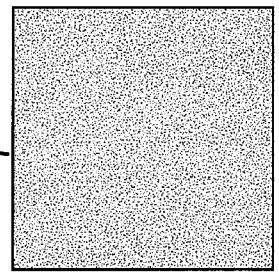
Fig. 5a Fig. 6a
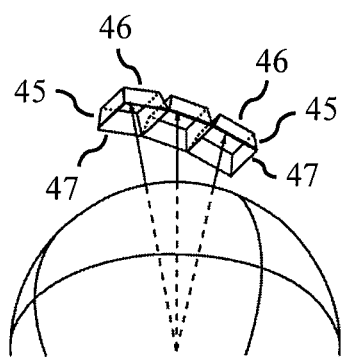
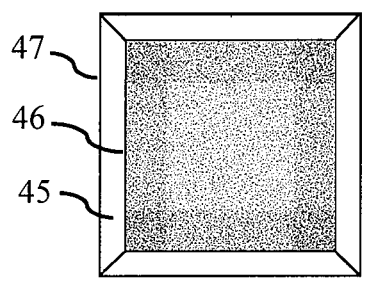
Fig. 5b Fig. 6b
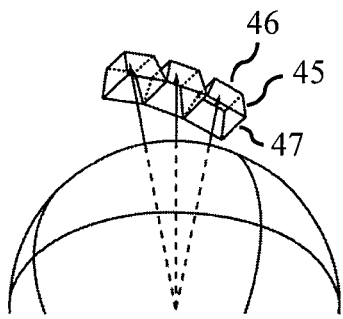
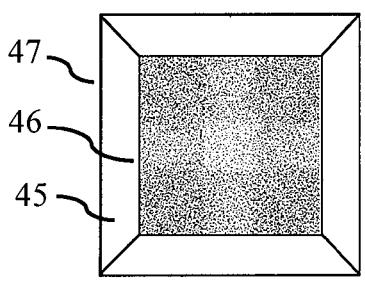
Fig. 5c Fig. 6c
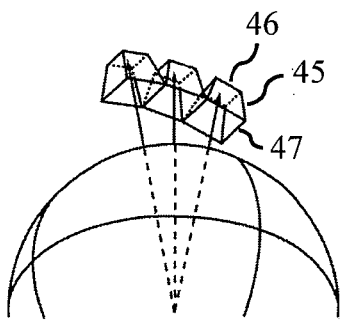
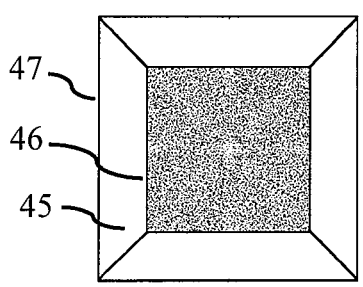
Fig. 5d Fig. 6d
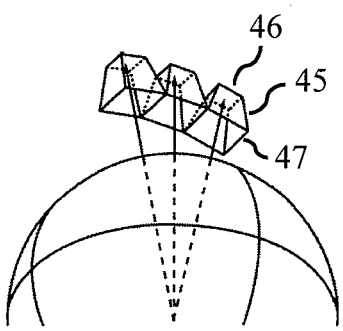
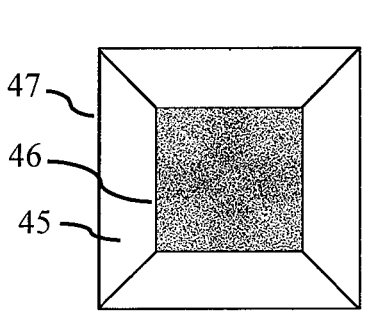
Fig. 5e Fig. 6e Fig. 18a
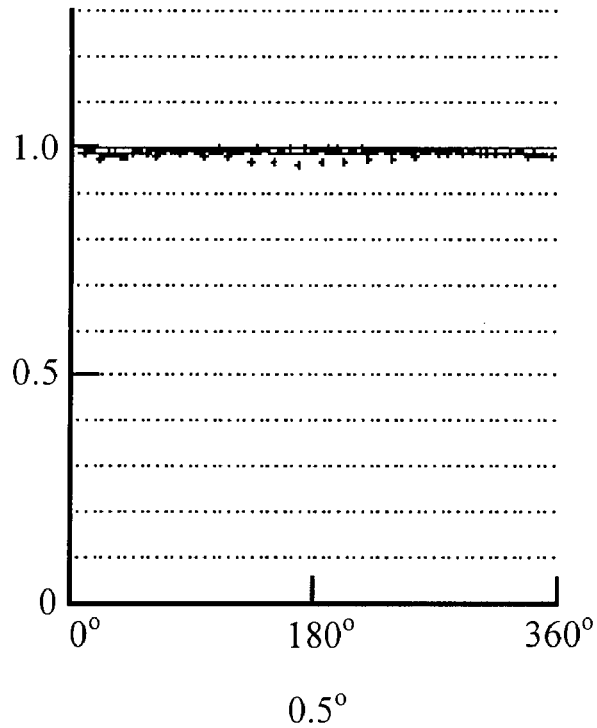
0.5°
Fig. 18b
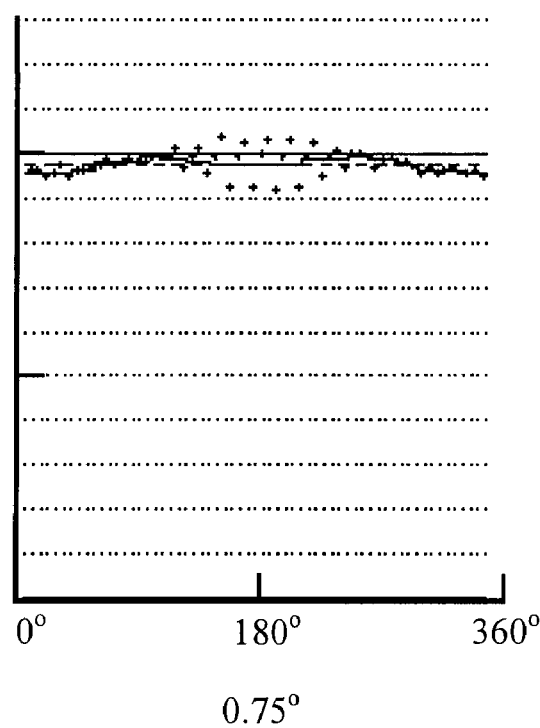
0.75°
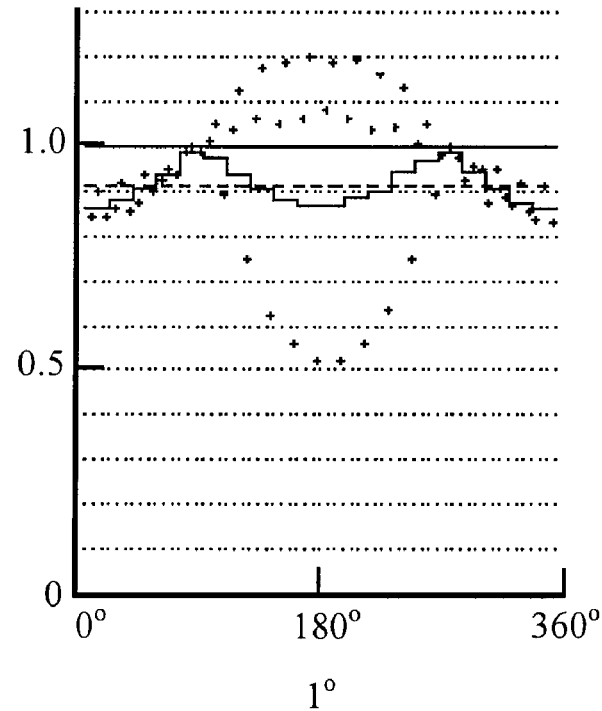
1°
Fig. 18c
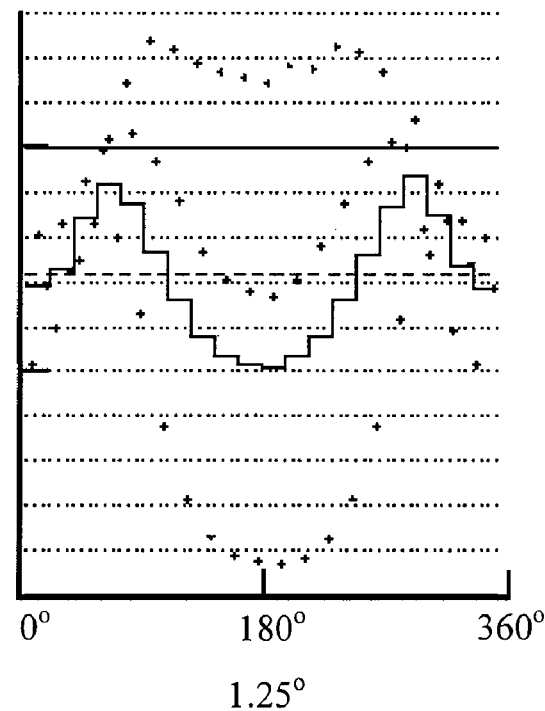
1.25°
Fig. 18d

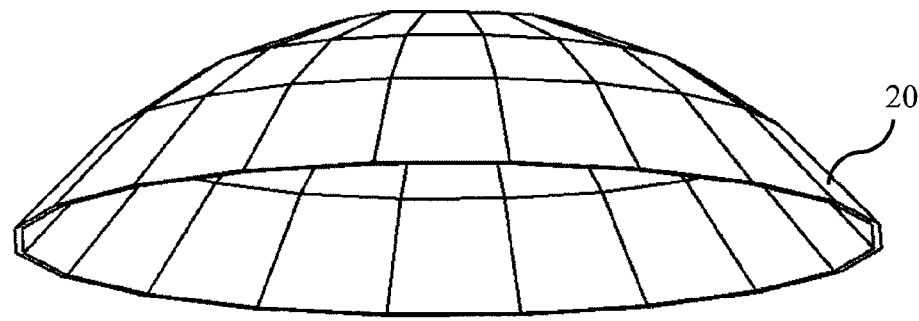
Fig. 41a
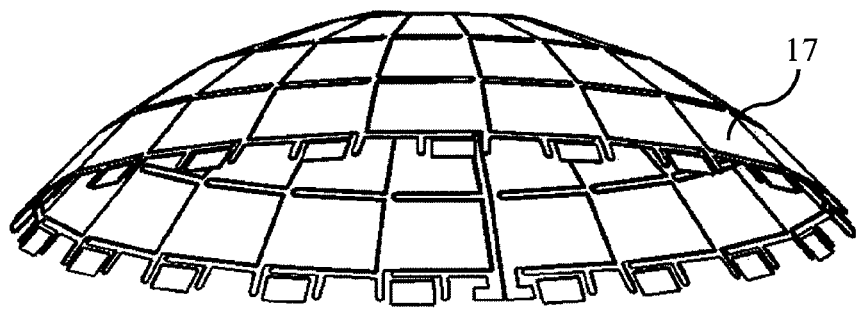
Fig. 41b
Fig. 41c
Fig. 41d

PHOTOVOLTAIC GENERATOR WITH A SPHERICAL IMAGING LENS FOR USE WITH A PARABOLOIDAL SOLAR REFLECTOR

CROSS-REFERENCE TO RELATED APPLICATIONS

This application is based upon and claims the benefit of the filing date of provisional patent application Ser. No. 61/127,298, filed May 12, 2008, entitled "Solar Photovoltaic Generator," the entire disclosure of which is incorporated herein by reference. This application discloses subject matter related to application Ser. No. 12/463,001, filed contemporaneously herewith, entitled "Solar Concentrator Apparatus with Large, Multiple, Co-Axial Dish Reflectors," by Roger P. Angel and Warren B. Davison, the entire disclosure of which is incorporated herein by reference. This application also discloses subject matter related to application Ser. No. 12/463,026, filed contemporaneously herewith, entitled "Method of Manufacturing Large Dish Reflectors for a Solar Concentrator Apparatus," by Roger P. Angel and Blain H. Olbert, the entire disclosure of which is incorporated herein by reference.

This invention was funded by the United States Government under the Department of Energy contract No. DE-FG36-08G088002. The U.S. government has certain rights in this invention.

BACKGROUND OF THE INVENTION

Climate change is recognized as a significant problem that has received considerable attention. As a result of worldwide generation of energy from fossil fuels, large amounts of greenhouse gases are accumulating in our atmosphere. Many experts believe that if something is not done soon to slow or even reverse this accumulation, our climate and the world in which we live will suffer catastrophic consequences. Experts predict that a rise in global temperatures of just a few degrees will melt polar ice, and result in a rise of sea levels enough to put many coastal cities under water. The extinction of many species of plants and animals is also predicted by some scientists. In view of these and other significant adverse effects from burning fossil fuels to generate energy, there is a significant need for a method and apparatus that can generate energy in a cost-effective manner without the generation of significant greenhouse gases.

Solar energy systems are unlikely to have a significant impact on reducing greenhouse gases in the atmosphere until electricity can be generated using solar energy at a cost that is competitive with electricity generated by burning fossil fuels. Cost is critical to solar energy systems. In fact, cost cannot be over emphasized, because it is so important that cost alone can make the difference between success and failure. As long as solar generated electricity costs more than electricity generated by burning fossil fuels, there is little chance that solar power is going to have a significant impact on reducing greenhouse gases in our atmosphere. There has been a long felt need for an apparatus and method of manufacture for a solar conversion system that has a low total system cost and that is capable of generating electricity at a cost that is competitive with electricity generated by burning fossil fuels.

In the past, efforts at generating solar electricity directly from photovoltaic cells have not been entirely satisfactory, due to relatively high capital cost, particularly as compared with alternative methods of generation of electricity. Utility scale applications of solar energy have mostly used thermal systems where solar rays were concentrated to provide heat that was then converted into electricity through use of an engine driving an electromagnetic generator. Thermal systems have commonly used large optical reflectors to heat a working fluid with focused sunlight. Conversion efficiency was relatively low in systems with sunlight concentrated to only moderate levels in one dimension by trough reflectors.

Photovoltaic conversion with multijunction cells has been used to generate electricity from sunlight, including arrangements with sunlight concentration to improve efficiency, but the cost of complete concentrating photovoltaic systems was too high to be commercially competitive. An underlying reason for this high cost has been that, in most previous attempts using concentrating photovoltaic systems, the unit for concentration and conversion of solar power has been too small, consisting typically of one photovoltaic cell powered by one small mirror or lens to focus sunlight on the cell. Small units were preferred for converting concentrated sunlight into electricity because at small size they could be simply and passively cooled, and single cells are readily made insensitive to tracker pointing errors, but they were expensive to manufacture and deploy on the huge scale needed for utility scale power. Because the relatively high cost of such previous devices using concentrating photovoltaic systems was not competitive, such devices have had little impact and account for only a very small fraction of the total electricity generated annually.

There has been a long felt need for a system of photovoltaic generators that deliver high power concentrated sunlight at low cost per unit of power, and which can generate electricity from sunlight at a cost that is competitive with alternative conventional methods of generating electricity by burning fossil fuels.

OBJECTIVES AND FEATURES OF THE INVENTION

It is the goal of the present invention to overcome the limitations of the past by providing photovoltaic generators of higher power rating, designed to work efficiently with big solar reflectors that deliver high power concentrated sunlight at low cost per unit of power. Such generators, each comprising many photovoltaic cells, utilize active cooling and internal optics to keep the light evenly spread across all the photovoltaic cells despite bending and mispointing of the primary reflector.

A principal objective of the present invention is to facilitate generation of electric power at low cost per unit energy, using photovoltaic conversion of solar energy. One aspect of the present invention involves conversion of sunlight that has already been concentrated in two dimensions by a large dish reflector pointed at the sun. The present invention is intended for operation with an apparatus which provides concentrated solar energy delivered at low cost, but at relatively high input power levels, typically in the range 2-20 kW. Conversion at such power levels results in more localized waste heat than can be cooled simply by thermal conduction to a finned structure.

The present invention is especially adapted for use in connection with the apparatus for strongly concentrating sunlight disclosed in application Ser. No. 12/463,001, filed contemporaneously herewith, entitled "Solar Concentrator Apparatus with Large, Multiple, Co-Axial Dish Reflectors," by Roger P. Angel and Warren B. Davison. The large dish reflectors used in the present invention may be advantageously made using the method of manufacturing disclosed in application Ser. No. 12/463,026, filed contemporaneously herewith, entitled "Method of Manufacturing Large Dish Reflectors for a Solar Concentrator Apparatus," by Roger P. Angel and Blain H. Olbert. These inventions together provide the lowest cost for concentrated solar energy when the solar power brought to each single focus is about 8 kW. This cost minimum results from a system optimization that includes designing for the lowest cost of materials and manufacture. Thus a steel structure which integrates the functions of supporting, arraying and tracking the reflectors is used, and is optimized for the lowest mass of steel per kilowatt of solar power brought to focus. The reflectors are thin glass monoliths made by a manufacturing process specifically optimized for low cost when produced at the rate of 30 square kilometers per year, sufficient to add generating capacity of about 7 gigawatts (peak electricity) per year.

A second objective of the present invention is to configure photovoltaic cells in a compact generator unit which performs only the energy conversion function of a complete system, with the additional functions of collecting and concentrating the solar energy cleanly separated in the design. By designing such separation, manufacturing costs may be independently minimized for each function to provide very large scale production at the lowest capital cost. A generator unit according to the invention comprises a system of photovoltaic cells with their associated optical, electrical and cooling elements contained in a package of small size, to facilitate mass production, transport and replacement, and to minimize blockage of light if the generator is located at the prime focus of a primary reflector.

Another objective of the present invention is to exploit the low cost per unit of power generated by photovoltaic cells used with highly concentrated light. Thus, even if a concentrator photovoltaic cell is 100 times more expensive per unit cell area than a standard silicon photovoltaic cell, when used at a very high solar concentration factor of 1000, it may achieve a reduction in cell cost of approximately ten times per unit of electrical power output. It is therefore an objective of the present invention to provide a practical apparatus adapted to operate cells at very high solar concentrations of up to 1000 or more.

It is a further objective of the invention to generate the maximum possible electrical power from a given input of concentrated solar energy from a given, cost-effective apparatus for optical concentration and tracking the movement of the sun. When cell cost per unit power output is effectively reduced in accordance with the present invention, the dominant cost of a complete solar electricity generating system is likely to be that of the apparatus for optical concentration and tracking in the complete system, not the cost of the photovoltaic cells. In this cost regime, the high conversion efficiency of around 40% achieved by multifunction photovoltaic cells used in accordance with the present invention is especially valuable. The higher the generator efficiency that can be achieved, the lower the fraction of the cost per unit of electrical power contributed by a given concentrator system.

It is a further objective that the generator of the present invention should be able to operate consistently with high overall conversion efficiency even when operated with a low cost and lightly-built concentrator system and supporting structure. Such a system may provide the generator with sunlight that is not ideally centrally concentrated and which may move about relative to the generator entrance as a result of wind gusting and mechanical flexure. Thus it is an objective that the generator shall, despite such deficiencies in input, provide individual photovoltaic cells or grouped cells with substantially equal amounts of solar radiation, so that the photovoltaic cells will individually generate substantially equal electrical current and when connected in series will maintain consistently high output power.

It is a further objective that concentrated light delivered to the generator of the present invention be directed to the photovoltaically active areas of the photovoltaic cells, and not to the light-insensitive busbars on the cells or to any gaps between them, so as to maximize conversion efficiency.

An additional objective of the present invention is to provide a generator of high reliability for low lifetime energy cost. The present invention thus features an optical system that avoids localized hot spots in the illumination within a photovoltaic cell, and features efficient cooling to minimize thermal cycling as well as operating temperature.

An important feature of the invention is its incorporation of novel optics within the generator to satisfy the above objectives. The optics in accordance with the present invention provide for the desired uniformity of illumination across many or all of the photovoltaic cells in spite of non-uniformity of the entering light and in spite of mispointing. The internal generator optics in accordance with the present invention may be configured so that essentially all the concentrated sunlight entering the generator is directed toward the active area of the photovoltaic cells. A further feature of the internal generator optics is to maintain uniformity of cell illumination and high throughput despite very high concentration of light at the cells. In general, an optical concentration system built to illuminate multiple photovoltaic cells at high concentration tends to have low tolerance to mispointing and bending. However, the generator of this invention features an optical concentration system with relatively high tolerance to mispointing and bending, so that a low cost delivery apparatus can be used. The internal generator optics used in the present invention are designed to also relax as far as possible the requirements and manufacturing tolerances placed on the optical concentration system and support structure used to supply the input energy to the system, with the goal of lowering the overall system cost. The internal structure can be tailored for use with specific primary reflectors, to ensure efficient illumination no matter the reflector size and shape.

SUMMARY OF THE INVENTION

In accordance with the present invention, an electro-optical generator is provided for operation at the focus of a curved collector or mirror, preferably paraboloidal and preferably concentrating 2-20 kW of sunlight into a compact focal region. The generator preferably incorporates a plurality of actively cooled photovoltaic cells to produce electricity from concentrated sunlight. In operation, a generator is rigidly mounted at the focus of the provided collector or mirror, and this rigid assembly is pointed at the sun by a provided two-axis tracker. Multiple replicated generators configured in accordance with the present invention are well suited for utility scale electricity production.

In accordance with the present invention, a generator will preferably comprise multi-junction photovoltaic cells that have a relatively high conversion efficiency, as compared to other photovoltaic cell designs. In the present invention, the multi-junction photovoltaic cells are preferably illuminated at concentrations up to or above 1000 times solar level, in order to strongly reduce cell cost per unit power output.

A significant aspect of the present invention is its use of a field lens in the form of a full sphere or ball centered at the focus of the primary reflector that supplies it with concentrated sunlight. A ball lens in accordance with the present invention provides substantially uniform and stable illumination of the photovoltaic cells despite uneven and variable distribution of light entering the generator. Uniformity and stability of illumination is at a premium for most preferred embodiments of the present invention, which employ many photovoltaic cells connected electrically in series within a generator. In this configuration, efficiency is compromised if these cells do not receive substantially the same solar power input and deliver the same electrical current output. The present invention's relatively high tolerance to uneven and variable distribution of the input light allows the solar generator to be highly efficient even when it is powered by a low-cost delivery apparatus that is subject to flexure, wind buffeting, misalignment and optical manufacturing errors that cause uneven and variable input illumination.

In the present invention, the region of stable illumination provided by the ball lens is found at the concave image of the primary collector. Since this image provided by the present invention does not move relative to the generator even with moderate mispointing, the illumination is substantially stabilized at a concave surface fixed within the generator and corresponding to the stabilized image, called the "receiving surface". It is desirable for the configuration of photovoltaic cells in the generator to be matched to the image formed by the lens of the primary collector used to power the generator. Thus, a generator according to this invention is preferably matched to the primary collector with which it is used, both to the specific shape and focal ratio of the collector. For example, if the primary collector delivering light to the generator is square, the concentrated light is distributed across the receiving surface as the concave image of the square collector formed by the ball lens on that surface.

The highly preferred shape for the lens used in a generator according to the present invention is a sphere, because a spherical lens in the present invention images over a wide angle and can thus be used with primary collectors of short focal length. In addition, a spherical lens may be provided with small diameter and short focal length, which makes a small image of the primary reflector and achieves high concentration. A spherical lens is preferred also because it can be fabricated at low cost. Fused silica glass with low OH content is the highly preferred material for the spherical or ball lens, because it has very low absorption of light across the solar spectrum. In practice, a lens of such material can achieve high throughput. Based on the refractive index of silica across the solar spectrum, the image where the light is stabilized will under typical conditions (illumination by an f/0.5 paraboloid) be preferably located on an approximately spherical surface concentric with the ball lens of radius "a" at a radius "b" given by $$b \sim 1.546 a. \quad (1)$$

A significant aspect of some embodiments of the present invention is their use of "secondary reflectors". In these embodiments the cells are not set directly coincident with the receiving surface to receive stabilized light provided by the ball lens, but are recessed (or offset) behind the receiving surface with secondary reflectors in between the receiving surface and the photovoltaic cells. The purpose of the secondary reflectors is to redirect the smooth, continuous flux of concentrated sunlight at the receiving surface into discrete regions that illuminate just the photovoltaically active areas of the separate cells. Light passing through a given area of the receiving surface into a secondary reflector reaches the recessed photovoltaic cell both directly and by reflection from inward-sloping, mirrored walls that extend from the receiving surface down to the perimeter of the photovoltaically active area of a cell. The entrances to the secondary reflectors are configured such that the set of secondary reflectors tile seamlessly the full illuminated area of the receiving surface. The recessed and separated photovoltaic cells are held in a concave array behind the receiving surface. The operation of the secondary reflectors of this invention depends on the near-normal incidence of the light delivered by the ball lens over each secondary reflector.

The function and operation of the secondary reflectors of this invention are both quite distinct from that of optical funnels previously used in conjunction with photovoltaic cells. Typically the function of such optical funnels was to homogenize light that was both unevenly and variably distributed and spread over a wide range of angles of incidence at the funnel entrance.

The secondary reflectors of this invention provide several advantages. The first advantage is highly efficient use of the solar energy input, because essentially all of the incoming light stabilized by the ball lens is directed toward the photovoltaically active areas of multiple flat cells within. A second advantage of secondary reflectors is in simplified manufacture of the cell array. The cells arranged behind a concave array of secondary reflectors remain in a concave array, but are spaced apart for convenient side-by-side placement of bypass diodes and wiring. A generator with such separated cells is preferably mass produced at low cost with flat receiver assemblies, each carrying one cell, and made in the shapes and sizes needed to fit a concave array. In this way, standard flat photovoltaic cells may be assembled on standard one-sided printed circuits by mature electronics fabrication methods and with minimal special requirements. A third advantage of secondary reflectors is in efficiency of cell cooling by forced flow of coolant. Efficient flow to cool the localized regions of high heat concentration behind the cells is obtained by using the gaps between these regions (that result from use of the secondary reflectors) as exhaust manifolds. Higher net output power is thus achieved, because efficient coupling results in higher conversion efficiency and in less parasitic loss of generator output to drive cooling pump motors.

A generator may be designed in accordance with the present invention for a given paraboloidal reflector based on the following considerations. Ray tracing calculations for generators according to this invention used with primary reflectors with focal ratio f≧0.5 show an intensity at the receiving surface that remains virtually unchanged for ray deviation angles δ up to a maximum of $$\delta_m \approx a/2F, \quad (2)$$

where "F" is the focal length of the primary paraboloid. Ray deviations in practice arise from a number of causes such as the finite angular size of the sun (δ=0.004 radians at the limb) or errors in manufacturing and pointing.

The concentration of sunlight provided by the ball lens depends on location across the receiving surface, increasing away from the center. For illumination by a paraboloid of focal length F, the concentration $C_1$ on a spherical receiving surface of radius "b" at any point at angle θ subtended at the center of the ball lens is given by:

$$C_1 = \left(\frac{F}{b}\right)^2 \left(1 + 2\left(\tan\frac{\theta}{2}\right)^2 + \left(\tan\frac{\theta}{2}\right)^4\right). \quad (3)$$

As an example of ball lens design and properties, consider a generator designed to work with an f/0.5 circular primary reflector, i.e of focal length equal to 0.5 D, where "D" is the diameter of the reflector. At the edge of a spherical receiving surface the edge angle $\theta_e$=53.1° and the concentration $C_1$ is a factor 1.56 higher than at the center, (θ=0) from equation (3). If combined ray deviations from the primary reflector are anticipated to be as high as ±1° (±0.017 radians), then the generator will preferably incorporate a silica ball lens of radius a=0.035 F, from equation (2). Given b=1.546a from equation (1), and D=2 F, it follows that F/b=18.5. The concentration at the center of the receiving surface where θ=0 is given simply by (F/b)²=342, and is equal to 533 at the edge ($\theta_e$=53.1°), from equation (3).

The above considerations demonstrate the relationship between concentration and mispointing tolerance at the receiving surface of generators according to this invention. For a generator using a ball lens according to this invention, the limiting angle for mispointing is related to the central concentration by $C_1 \approx 0.1/\delta_m^2$. Thus, for example, a silica ball chosen to be used with the above reflector to produce a geometric concentration $C_{1center}$=400 at the receiving surface center and $C_{1edge}$=625 at the edge will provide illumination independent of mispointing angle δ up to $\delta_m$=0.016 rad or 0.9°.

When secondary reflectors are used in conjunction with a ball lens, edge reflected light is added to that directly incident from the ball lens onto the photovoltaically active areas, and the average level of concentration of light at the cell is increased in comparison to that at the receiving surface. The average of the increased concentration is termed the secondary concentration, $C_2$. The overall concentration "C" seen by a cell is equal to the product of the geometric concentration for the ball lens $C_1$ and secondary reflectors $C_2$ and the total optical throughput η, thus C=η $C_1 C_2$. Embodiments with deep secondary reflectors have higher concentration $C_2$ and thus require smaller concentration $C_1$ for a given total concentration C. An important consequence is that generators with deep secondary reflectors and consequently higher secondary concentration have, for given overall concentration, increased tolerance to mispointing and other ray deviations, since the tolerance set by the need for good imaging by the ball lens given by equation (2) applies only to the ball concentration $C_1$.

In accordance with the present invention, a preferred embodiment of a generator may be provided with a plurality of photovoltaic cells assembled in a concave array around the receiving surface. The cells may be connected simply in series to deliver electrical power with high efficiency, provided that all photovoltaic cells receive individually substantially the same optical power and generate substantially the same current. The area of the receiving surface associated with each photovoltaic cell is thus preferably configured to become smaller with increasing radius, in inverse proportion to the predictable increase in concentration with radius as given by equation (3). For specific embodiments of the invention configured for a given primary reflector, tiling patterns for the receiving surface for equal power were constructed by first dividing the primary reflector area (as projected perpendicular to the axis) into equal areas. The image on the receiving surface of the primary reflector so divided is then also divided into areas receiving equal power. For example, for an embodiment of the invention to be used with a square primary reflector, the receiving surface may be divided according to the image on that surface formed of a regular square grid projected on to the primary reflector.

In the first and simplest embodiment of the invention, a plurality of individually flat photovoltaic cells in the generator is illuminated directly by concentrated light from the ball lens and the cells are made in different shapes and sizes to tile the curved receiving surface out to the image perimeter. In some embodiments the flat cells are shaped as facets of a polyhedron that approximates the receiving surface. In some of these embodiments the cells are configured individually to receive identical amounts of power, as outlined above. In some embodiments the receiving surface has spherical curvature, concentric with the ball lens and with the radius chosen to yield the sharpest image of the primary collector for the range of ray mispointing characteristic of the collector optics. In other embodiments, the receiving surface may be non-spherical, for example an oblate spheroid, for improved imaging of the primary reflector on the receiving surface. Such improved imaging is desirable to better stabilize output power of a generator to be used with an especially deeply dished primary reflector, or to stabilize output power against especially large angles of mispointing.

A limitation to such simple embodiments with closely packed and directly illuminated photovoltaic cells as described above is that some light is lost to gaps between the cells and to the light-insensitive edge busbars which may cover 10% or more of the cell area.

According to the present invention, such limitations are ameliorated in other embodiments by use of secondary reflectors. Differing depths of secondary reflectors are used in different embodiments, providing differences in cell separation, in the additional light concentration $C_2$, and in the variation in concentration across a cell caused by edge brightening. Increased depth provides for larger cell separation and increased light concentration, and may reduce non-uniformity of illumination across a photovoltaic cell introduced by edge brightening. In some preferred embodiments the secondary reflectors take the form of mirrored frames around the photovoltaic cell. In other preferred embodiments the reflection at the side walls of the secondary reflectors takes advantage of total internal reflection, accomplished by placing in front of each cell a prismatic window of solid glass with inward sloping polished edge walls. Total internal reflection avoids the slight energy loss inherent in external reflection, as used in secondary reflectors with the mirrored frames described above.

In one preferred embodiment (referred to as type two) using secondary reflectors, the reflectors are shallow, and the gaps opened between adjacent active cell areas are relatively narrow. In this case, the secondary concentration $C_2$ is typically low, $C_2$~1.4, and the illumination across any one photovoltaic cell is characterized by strong edge brightening. Joule losses are not expected to increase significantly from the non-uniform illumination, because the increased currents in the narrow current-carrying traces across the cell near the bright edges flow over only short paths at the bright edges. Higher temperatures from the brightening along the edges are minimized in some embodiments by lateral diffusion into thermally conductive cell substrate, to avoid reduced conversion efficiency and shortened lifetime from overheating.

In a specific embodiment of type two, for use with a circular primary reflector, the secondary reflectors are implemented as prismatic windows, and groups of cells are electrically connected in parallel to improve mispointing tolerance. The groups of cells are radially oriented and axisymmetric, so that all groups yield the same power and deliver the same current. Bypass diodes for the radial groups are set around the circumference of the receiving surface. For one preferred embodiment a passive method of heat transfer is preferred. Waste heat from many photovoltaic cells is conducted through ceramic substrate material into a fluid chamber behind. A large heat pipe or thermosiphon may be used to cool the cells by boiling in a fluid chamber which causes vapor to rise up finned pipes to be cooled by natural convection. The recondensed fluid returns to the chamber by gravity. In one advanced implementation, the photovoltaic cells and bypass diodes are soldered to a ceramic cup and connected by a concave copper printed circuit on the ceramic cup. For another embodiment, which may be more readily manufactured, the cells are soldered to individual flat ceramic substrates that are mounted in a skeletal support, and cooling is by actively pumped liquid coolant.

An especially preferred embodiment (referred to as type three) of a generator, for use at the focus of a square primary reflector, incorporates a ball lens and uses deep, approximately square secondary reflectors at the receiving surface. These provide relatively large gaps between cells and are chosen with a depth specifically to minimize non-uniformities in illumination across individual photovoltaic cells. The highest uniformity is achieved for the square cells when the four edge mirrors of a secondary reflector are chosen with a depth and slope angle oriented so that each mirror reflects edge light just as far as the center of the cell. The result is relatively uniform illumination, with standard deviation $\sigma_1/<I>=0.12$, effectively no edge brightening, and significant secondary concentration, $C_2 \sim 2.6$. The angular tolerance $\delta_m$ to mispointing from the above analysis is close to 1 degree even for a concentration as high as 1000.

In a preferred implementation of this highly preferred generator, the secondary reflectors are made as silvered replicas and are mounted into a liquid-cooled, cup-shaped framework, separate from the cell assembly. Each photovoltaic cell is mounted onto a small receiver assembly with projecting bypass diode(s) and notched sides to allow close fitting. The cells and their receiver assemblies are made to the same general shape but in different sizes, so as to fit together on a concave mounting surface that places each cell directly behind the secondary reflector that illuminates it. The receiver assemblies are attached via screws and thermal grease to the concave mounting surface which takes the form of a continuous cooled copper cup. The receiver assemblies fit together in a checkerboard pattern, with only very short electrical connections needed between adjacent across corners of receivers to complete the series chain. Each receiver assembly has outputs available at all four corners to make such short connections possible.

Active cooling is preferred for this implementation. The convex side of the copper cup is cooled by liquid, which is pumped to a radiator away from the generator, where the liquid is air-cooled by forced convection. The liquid-cooled, convex side of the copper cup is provided in localized regions opposite each cell with heatsink-like pins or fins, short and densely packed to increase the surface area. In these regions the cooling liquid is forced by jets into the gaps or channels between the copper pins for improved heat transfer. The flow requires low pressure, because of the ready escape paths provided to the side of these localized pin/fin regions. As a result, the parasitic power loss for the coolant pumps and fans of this active cooling system is low.

In a fourth alternative embodiment type that gives great flexibility in the choice of concentration, prismatic windows may be extended greatly in depth to form lightpipes. Such lightpipes are preferably configured with entrance apertures differently sized in order to receive equal power, and with exit apertures brought to areas of identical shape and size to illuminate identical rectangular or square photovoltaic cells. Such lightpipes have warped sides. In this alternative embodiment, multiple reflections in the lightpipe cause the output light to be rehomogenized and become uniform, and the secondary concentration factor is a free parameter that can be tailored by choice of the lightpipe geometry.

BRIEF DESCRIPTION OF THE DRAWINGS

FIG. 5a is a schematic diagram illustrating adjacent flat photovoltaic cells placed directly at the receiving surface of a ball lens of a generator according to the present invention.

FIG. 5b is a schematic diagram illustrating photovoltaic cells set behind three secondary reflectors one unit deep, configured around the receiving surface of a ball lens of a generator according to the present invention.

FIG. 5c is a schematic diagram illustrating photovoltaic cells set behind three secondary reflectors two units deep, configured around the receiving surface of a ball lens of a generator according to the present invention.

FIG. 5d is a schematic diagram illustrating photovoltaic cells set behind three secondary reflectors three units deep, configured around the receiving surface of a ball lens of a generator according to the present invention.

FIG. 5e is a schematic diagram illustrating photovoltaic cells set behind three secondary reflectors four units deep, configured around the receiving surface of a ball lens of a generator according to the present invention.

FIG. 6a is a schematic diagram illustrating the intensity of illumination across one of the cells according to FIG. 5a.

FIG. 6b is a schematic diagram illustrating the intensity of illumination across one of the cells according to FIG. 5b.

FIG. 6c is a schematic diagram illustrating the intensity of illumination across one of the cells according to FIG. 5c.

FIG. 6d is a schematic diagram illustrating the intensity of illumination across one of the cells according to FIG. 5d.

FIG. 6e is a schematic diagram illustrating the intensity of illumination across one of the cells according to FIG. 5e.

FIG. 18a is a diagram showing photovoltaic currents in individual photovoltaic cells and parallel groups of photovoltaic cells with no mispointing.

FIG. 18b is a diagram showing photovoltaic currents in individual photovoltaic cells and parallel groups of photovoltaic cells where there is a small mispointing angle.

FIG. 18c is a diagram showing photovoltaic currents in individual photovoltaic cells and parallel groups of photovoltaic cells as the mispointing angle is increased as compared to that shown in FIG. 18b.

FIG. 18d is a diagram showing photovoltaic currents in individual photovoltaic cells and parallel groups of photovoltaic cells as the mispointing angle is increased as compared to that shown in FIG. 18c.

FIG. 39b is a graph showing the relative intensity of solar radiation across the solar spectrum corresponding to the graph of FIG. 39a.

FIG. 41a is part of an exploded perspective view of a concave, multi-cell receiver assembly, showing a monolithic faceted polyhedral ceramic support.

FIG. 41b is part of an exploded perspective view of a concave, multi-cell receiver assembly, showing a copper printed circuit layer.

FIG. 41c is part of an exploded perspective view of a concave, multi-cell receiver assembly, showing photovoltaic cells and bypass diodes.

FIG. 41d is part of an exploded perspective view of a concave, multi-cell receiver assembly, showing prismatic windows.

DETAILED DESCRIPTION OF PREFERRED EMBODIMENTS

Figure 1:
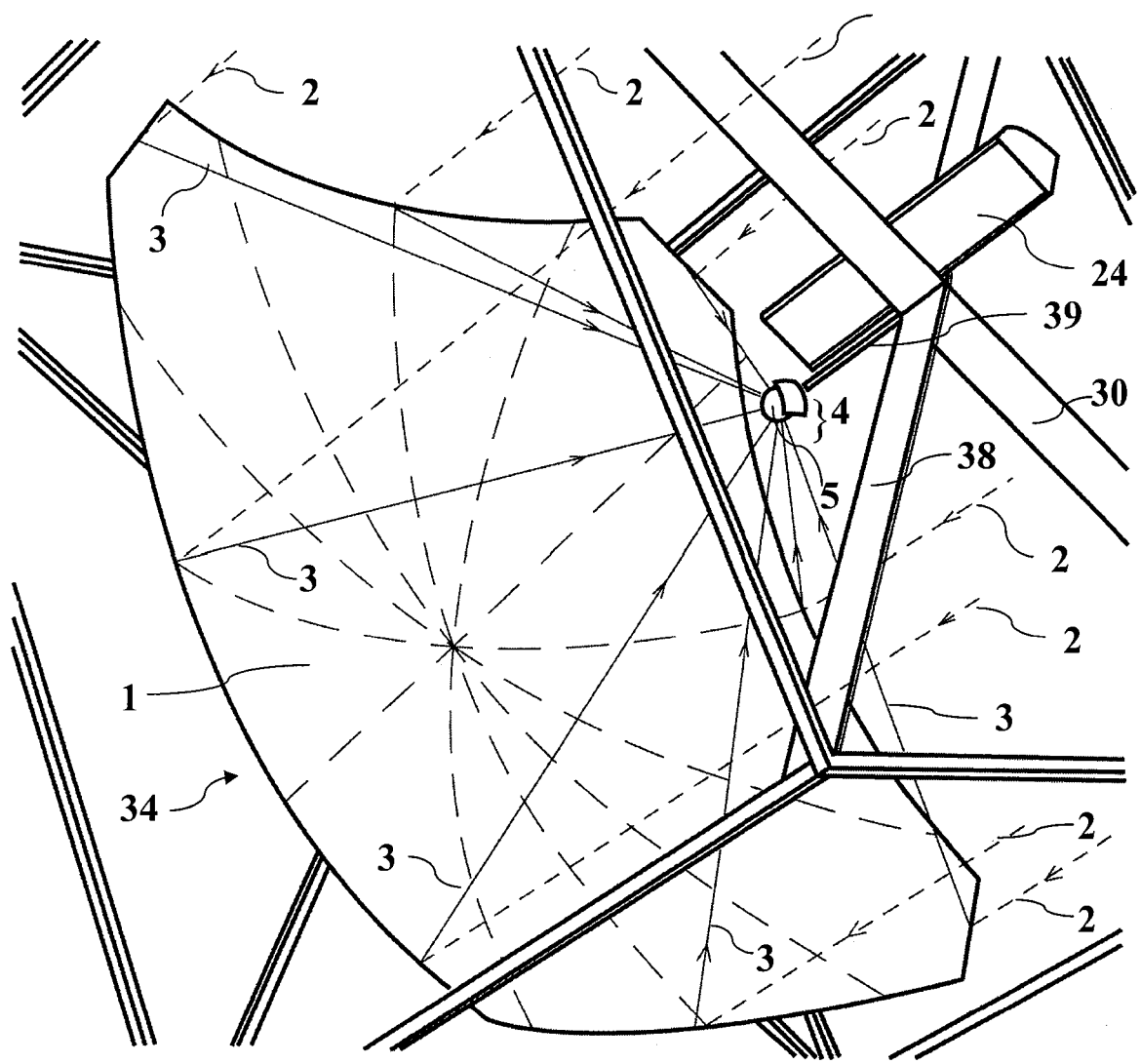
FIG. 1 is a perspective view of a preferred embodiment, showing the location of the ball lens of a generator in position at the focus of a paraboloidal reflector.

FIG. 1 is a perspective view of a generator 4 according to the invention, in operation at the focus of a paraboloidal reflector 1. Sunlight enters the system as radiation or rays 2 which are reflected by the mirror 1. The mirror 1 is shaped so that reflected solar radiation or rays 3 are directed toward the focus 28 where a generator 4 is located. In operation, a generator 4 is designed for use at the focus 28 of a preferably paraboloidal reflector or mirror 1 whose axis is pointed at the sun by a two-axis tracker.

A mirror 1 to supply solar power to a generator according to this invention has preferably a substantially paraboloidal reflecting surface that reflects as much of the sunlight as possible and concentrates it at the location of the generator 4. A paraboloidal shaped reflector 1 is preferred, because it will reflect parallel incoming rays 2 to a focal point 28. In a preferred embodiment wherein the reflector 1 is substantially paraboloidal, deviation of the shape of the reflective surface from the desired paraboloidal shape may be characterized as surface slope errors in the reflective surface of the primary paraboloidal mirror 1, and the design of the present invention provides some tolerance for such errors. This is a desirable feature in achieving cost effectiveness in manufacture and operation.

Figure 2:
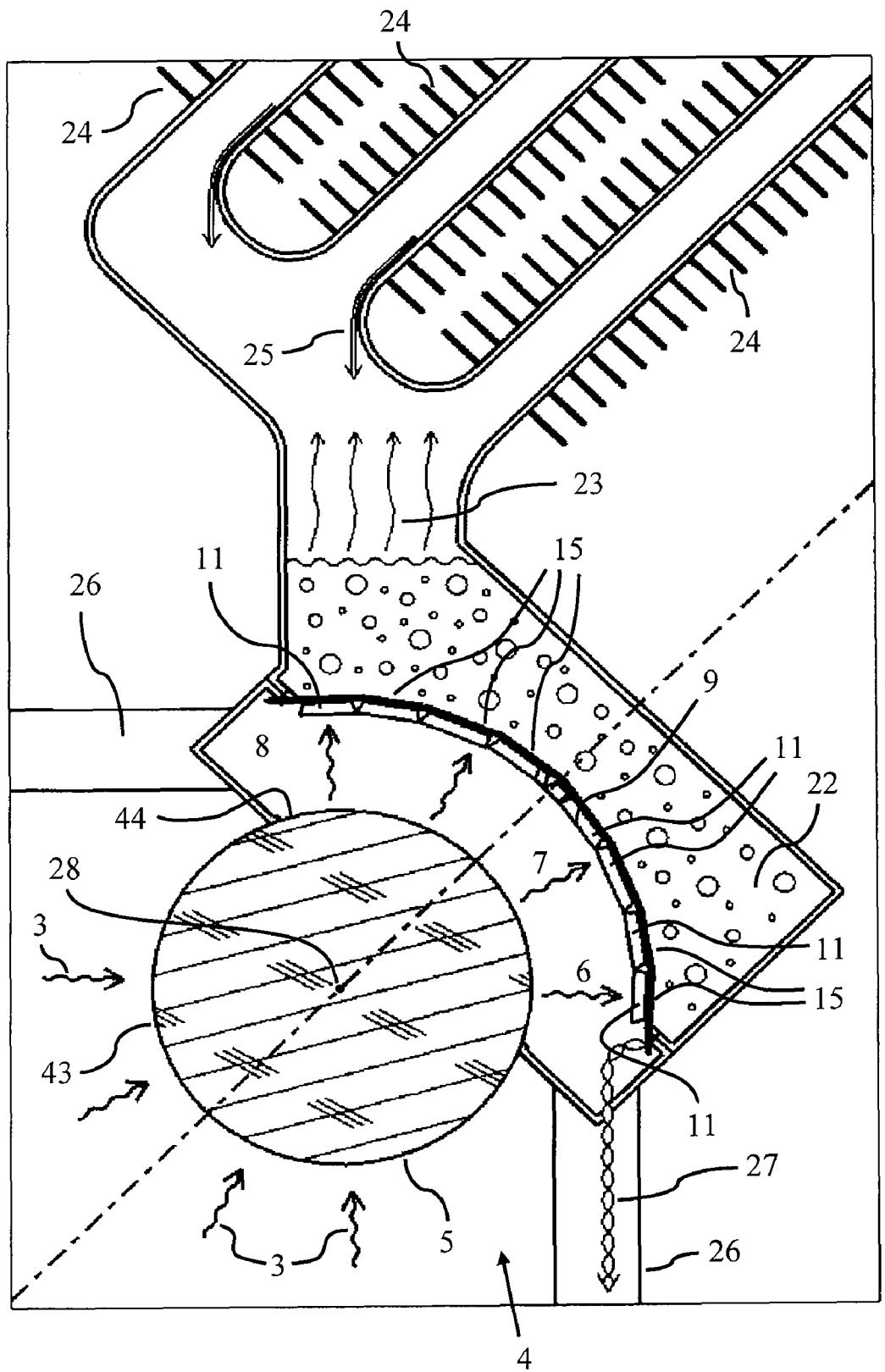
FIG. 2 is a cross-sectional view showing a preferred embodiment of a generator according to the present invention with a coolant structure shown.

Details of a generator 4 used at the focus 28 of the paraboloidal mirror 1 are shown in the cross-sectional view of FIG. 2. A preferred embodiment according to the present invention is the substantially spherically symmetric generator 4, comprising a ball field lens 5 and a concentrically located, concave, bowl-shaped and spherically curved receiving surface 9 around which the concentrator photovoltaic cells 15 are deployed, as shown in FIG. 2. A plurality of photovoltaic cells 15 is used to generate electricity directly from solar radiation. These cells 15 are preferably concentrator photovoltaic cells 15 designed to function in an environment of concentrated solar radiation. The plurality of photovoltaic cells 15 is electrically connected together to combine the electrical power produced by each cell 15 into a total output of electricity from the generator 4. The cells 15 may be individually flat, which allows for the use of concentrator photovoltaic cells 15 manufactured by conventional methods. Referring to FIG. 2, the ball field lens 5 is shown in cross-section. The center of the ball lens 5 is preferably located at the focus 28 of the paraboloidal reflector 1, or very close to the focus 28. The preferred shape for the ball lens 5 is a full sphere, because, in addition to providing excellent wide-angle imaging of the primary collector 1, it can also be manufactured at low cost. In operation, the reflected rays 3 pass through the ball lens 5 and may be refracted by the effect of the optical lens 5, depending upon the angle of reflected rays 3 relative to the lens 5, as will be described in more detail below. The concentrated sunlight that passes through the ball lens 5, indicated by reference numerals 6 and 7 in FIG. 2, forms an image of the primary paraboloidal reflector 1 on a concave spherical, cup-shaped receiving surface 9, located in a position concentric with the spherical lens 5.

A significant aspect of the present invention is that the intensity of the solar radiation 6 and 7 is smoothly distributed across the receiving surface 9 and is stabilized against mispointing of the tracker and surface slope errors in the reflective surface of the primary paraboloidal mirror 1. The ball lens 5 serves to achieve the stabilization of light intensity across the surface 9 against pointing errors of the tracker. Even if the tracker is not pointed directly at the sun, the light intensity at the surface 9 remains relatively unchanged for a significant range of pointing errors. In addition, the ball lens 5 may serve as a transmissive optical aperture to a preferably hermetically sealed cavity 8. The sealed cavity 8 protects the windows 11 and solar cells 15 at the receiving surface 9.

Figure 3:
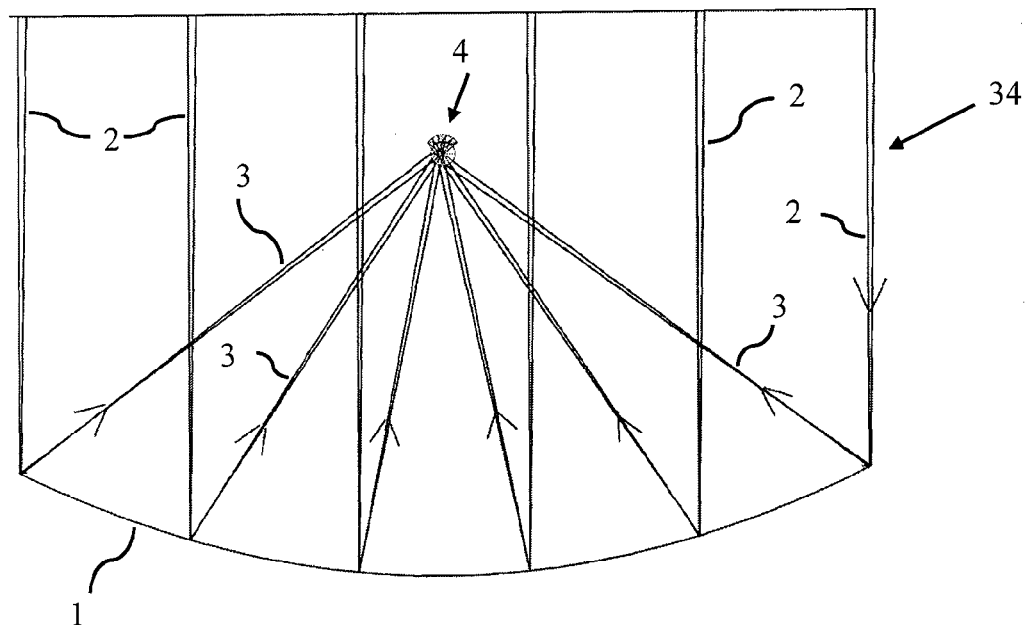
FIG. 3 is a schematic diagram illustrating the path of sunlight rays directed to a generator by a paraboloidal dish.
Figures 4A, 4B:
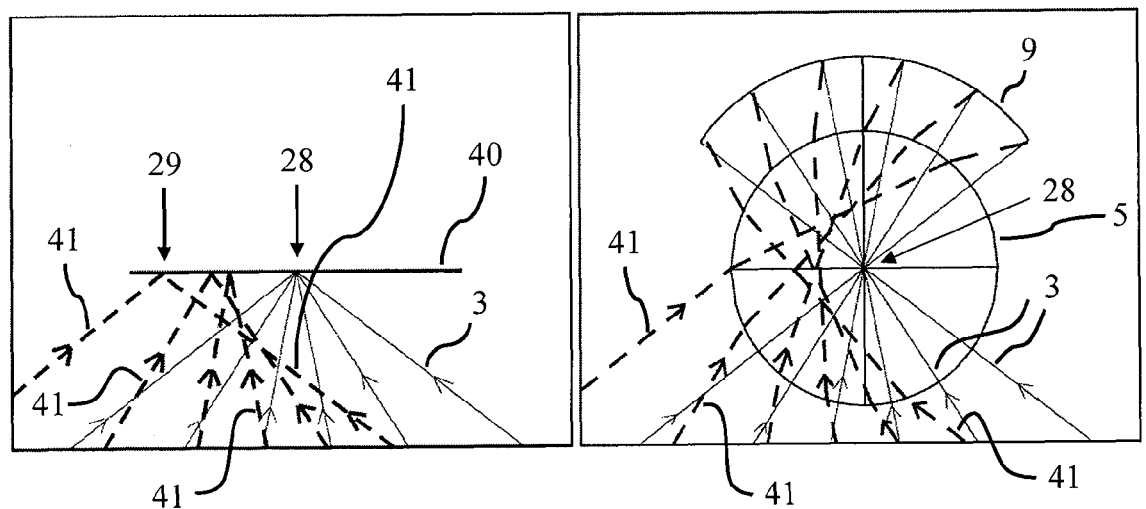
FIG. 4a is a schematic diagram illustrating rays near the focus of the dish, before the generator is installed.
FIG. 4b is a schematic diagram illustrating the same rays after passage through the ball lens.

The optical design and properties of the ball lens 5 to smoothly distribute and stabilize the intensity of light 3 from the paraboloidal reflector 1 at the concave receiving surface 9 is illustrated by FIG. 3, FIG. 4a and FIG. 4b. FIG. 3 is a diagram of rays 3 reflected by a large paraboloidal mirror 1 to the generator 4. The rays 3 are shown in a cross section as reflected from six points spaced evenly along a diagonal across the primary reflector 1.

The action of the lens 5 is illustrated in the detailed depiction of the focal region shown in FIG. 4a and FIG. 4b. Rays 3 from a paraboloid 1 are shown in FIG. 4a as they would fall in the absence of a lens 5, directly onto a flat focal surface 40. In this case the intensity at any point is strongly dependent on both its position in the plane 40 and the mispointing angle of the reflector 1 relative to the direction of the sun. Rays 3 reflected from the paraboloid 1 that were incident parallel to the paraboloid axis are shown as thin lines 3. They meet at a point at the focus 28 of the paraboloid 1. Rays 41 reflected by the paraboloid 1 from an off-axis source are shown as thick dashed lines 41. These rays 41 are shifted away from the central focus 28 and are spread out in radius as far as point 29 by chromatic aberration.

The detail illustrated in FIG. 4b shows the path of the same on-axis rays 3 and off-axis rays 41 when the spherical ball field lens 5 is introduced, centered on the paraboloid focus 28. The lens 5 is chosen to have the same diameter as the flat, axisymmetric disc 40 extending to radius 29 needed to encompass all the rays 41 of FIG. 4a. The on-axis rays 3 enter and exit the lens 5 at normal incidence and are un-deviated, i.e., the rays 3 are not significantly refracted by the lens 5 and are smoothly distributed across the concave receiving surface. Since the receiving surface 9 is located approximately coincident with the concave image of the primary paraboloid 1 formed by the lens 5, the off-axis rays 41 are refracted by the lens 5 and strike the receiving surface 9 at almost the same positions as the on-axis rays 3. Thus the effect of the lens 5 is to direct the off-axis rays 41 to maintain the same smooth distribution across the concave receiving surface 9 as the on-axis rays 3. The intensity at any point is largely independent of the direction of the incoming collimated light 3 and 41, or of deformations in the primary reflector surface 1. Such deformations deviate the angle of the reflected rays 3, but not significantly move the point of reflection on the primary reflector 1. The function and operation of the ball lens 5 is described in more detail below.

It is desirable that the solar radiation striking the photovoltaic cells 15 be substantially stabilized and consistent over a range of pointing errors relative to the incoming solar radiation, so as to avoid a reduction in illumination of any of the cells 15 which could interrupt or reduce the generation of electricity. The various embodiments of a generator 4 described herein all comprise a ball lens 5 and multiple concentrator cells 15 supported about a concave surface of stabilized light 9. The embodiments differ primarily in the mode of optical coupling of the concentrator cells 15 to the concentrated light 6 and 7 at the curved surface 9, but differ also in the pattern of tiling of the cells 15 about the receiving surface 9, and in the strategies used for combining the photovoltaic currents from individual photovoltaic cells 15 to produce a full output from the generator 4.

The different methods of optical coupling of concentrated light from a ball lens 5 into the cells 15 and the rationale for their differences are illustrated by the schematic diagrams in FIGS. 5a, 5b, 5c, 5d and 5e. All five diagrams show concentrated light from the same illustrative area 115 at the receiving surface being coupled into three square cells, but in different ways and into cells of different sizes. FIG. 5a shows the simplest coupling, with three square cells 15 placed directly to cover a designated area 115 on the receiving surface 9. The cells are placed together as close as possible so as to accept for photovoltaic conversion the largest possible fraction of the concentrated light incident on each of the three sections 47 that make up the designated area 115 of the receiving surface. The pattern of illumination of one of the areas 47 is illustrated by FIG. 6a, where the density of random dots is in proportion to intensity or concentration. In this case the density is uniform. Embodiment one below comprises a generator using such directly illuminated cells.

An alternative way to couple light into photovoltaic cells is illustrated in FIGS. 5b, 5c, 5d and 5e. Here light from the receiving surface reaches smaller square cells, set back from the receiving surface, both directly and by reflection from square secondary reflectors 45 in the form of mirrored frames surrounding each cell. All these figures are drawn to the same scale as FIG. 5a, and show light passing through the same region 115 of the receiving surface into secondary reflectors 45 all with the same sized entrance areas 47, but of different depths, and feeding cells of progressively smaller size and with progressively increased concentration. FIGS. 6b, 6c, 6d and 6e are plan views illustrating the mirrored frame 45 of a single secondary reflector and the intensity of illumination across the output 46 of the reflector according to the different configurations of secondary reflectors used in FIGS. 5b, 5c, 5d and 5e, respectively. In each case the density of random dots is in proportion to intensity or concentration of solar radiation. Photovoltaic cells 15 are preferably located immediately behind the secondary reflector outputs 46.

In these examples, a central portion of the light entering 47 reaches the photovoltaically active area of a cell 15 directly, and the remainder reaches it via the tilted reflecting surfaces around the edges of the cell. The reflecting surfaces of a secondary reflector may take the form of front surface mirrors arranged as a mirrored frame 45, as illustrated in FIGS. 5b, 5c, 5d and 5e. Alternatively, a secondary reflector may take the form of a prismatic window, in which light first enters the window entrance face 47, located at or near the receiving surface. The edge light in the latter case is totally internally reflected at the inward sloping polished edges of the prism to exit through the face 46 onto a cell 15. Regardless of whether reflection is internal or external, the effect of the secondary reflectors is to both increase the average concentration of the light on the active area of the cells 15 and to provide space for electrical connections or components between the cells 15. As shown in the progression from FIG. 5b to FIG. 5e, and FIGS. 6b to FIG. 6e, as the reflectors 45 are made deeper, the fraction of the total incoming light that is reflected is increased, the area 46 of the light exiting the reflectors becomes smaller, the concentration higher, and the gaps between the cells 15 located immediately behind the reflectors become larger. The increase in concentration, relative to that of light incident at the receiving surface 9 is termed the secondary concentration, $C_2$. Although the illustrated embodiment has been described with reference to square secondary reflectors 45, other shapes may also be used, for example trapezoidal and polygonal shapes may be used, as described below in connection with alternative embodiments.

In FIG. 5b, the edge reflectors are shallow and intercept and reflect less than half of the entering light 47, the spaces opened between the cells are relatively narrow, and most of the light at the receiving surface 115 is transmitted directly to the photovoltaic cell 15. The illumination across a cell 15 as illustrated in FIG. 6b remains uniform over most of the cell area, but is brighter near the edges, with a near doubling of the light concentration around the sides and still higher concentration in the corners. Embodiment two described below illustrates such coupling.

In FIG. 5c, FIG. 5d and FIG. 5e, the edge reflectors are shown progressively deeper and intercepting progressively more light from the receiving surface, as shown in the corresponding intensity maps in FIG. 6c, FIG. 6d and FIG. 6e, respectively. In FIG. 5c, the reflected light from each side mirror does not reach as far as the center of the cell 15. As shown in FIG. 6c, the concentration varies markedly across the cell 15, from about half the average at the center to about twice the average in the corners. In FIG. 5e, the reflected light from each side reaches beyond the center of the cell, and the concentration, as illustrated in FIG. 6e, is especially high over a centered cross and weaker in the corners. FIG. 5d represents a special preferred case in which the light reflected from each side wall reaches to the center and no further, and in the case of a square reflector coupled to a square cell 15 results in approximately uniform illumination of the cell 15, as illustrated in FIG. 6d.

In the preferred example illustrated in FIG. 6d, the average increase in concentration $C_2$ at the exit 46 and delivered to the cells 15 is around 2.6, compared to the flux incident on the entrance 47 at the receiving surface 9. The uniformity of the concentrated light 46 exiting the secondary reflector is quantified in the diagram of FIG. 7, in which the normalized standard deviation of the intensity exiting the reflector 46 is plotted against the average exiting intensity, for a range of secondary depths increasing from zero in the case of FIG. 6a to a maximum in the case of FIG. 6e. The secondary reflectors yield highest uniformity for a secondary concentration $C_2$ equal to 2.62 when the normalized standard deviation reaches a minimum of 12% (indicated by the reference numeral 300 in FIG. 7), the case illustrated in FIG. 5d. Such uniformity of concentrated light is desirable for maximizing the efficiency and longevity of the photovoltaic cells. Embodiment three below exploits this preferred geometry or "sweet spot" for square secondary reflectors used in combination with a ball lens 5, illustrated in FIG. 5d and FIG. 6d. This provides for relatively wide cell spacing as well as for relatively uniform illumination.

For the specific example illustrated in FIG. 6d, the edge mirrors are tilted at slope angle s=12.7° off the perpendicular to the cell plane and have depth equal to 87% of the width at the entrance 47, the entrance 47 subtends an angle of α=10° from the ball lens center, and the reflection is external. FIGS. 6b, 6c, 6d, and 6e and FIG. 7 were calculated for the same edge mirror slope angle and incoming ray angles as for FIG. 6d, with different depth increasing to a maximum equal to the entrance width for FIG. 6e. An exploration of other designs with different angles "s" and angle "α" shows similarly optimized configurations for uniformity of concentration having a concentration $C_2$ that is only weakly dependent on details of construction of a secondary reflector, and typically corresponds to about the same increase of 2.6 in average concentration seen in FIG. 7.

Secondary reflectors in this invention configured to space apart the multiple photovoltaic cells 15 take advantage of the small angles of incidence of light at the receiving surface 9, which prevail particularly under typical conditions when mispointing errors are small. Small angles of incidence are a fundamental advantage of the optical design of the present invention, based on its use of imaging optics with a ball lens 5 rather than non-imaging optics, and its use of spherical rather than plane symmetry. The stabilization of concentrated light by the ball lens 5 of the invention thus provides a significant improvement over prior systems. Typically, conventional non-imaging homogenizers show an inherent wide spread in angles of incidence, even in the absence of pointing error. More quantitative analysis of the characteristics of secondary reflectors used in different embodiments is given below.

Embodiments of Type One

In these embodiments, photovoltaic cells 15 are located directly at the receiving surface 9, as illustrated in FIG. 5*a* and FIG. 6*a*, fitted closely together on flat facets approximating the receiving surface 9. The cells 15, coincident with areas 47, may be sized so that the power received by each one, and thus the current generated by each directly illuminated cell 15, is essentially the same, to facilitate electrical connection in series. For equal power, the facet areas are scaled as the reciprocal of the concentration given by equation (9) below.

Figure 8:
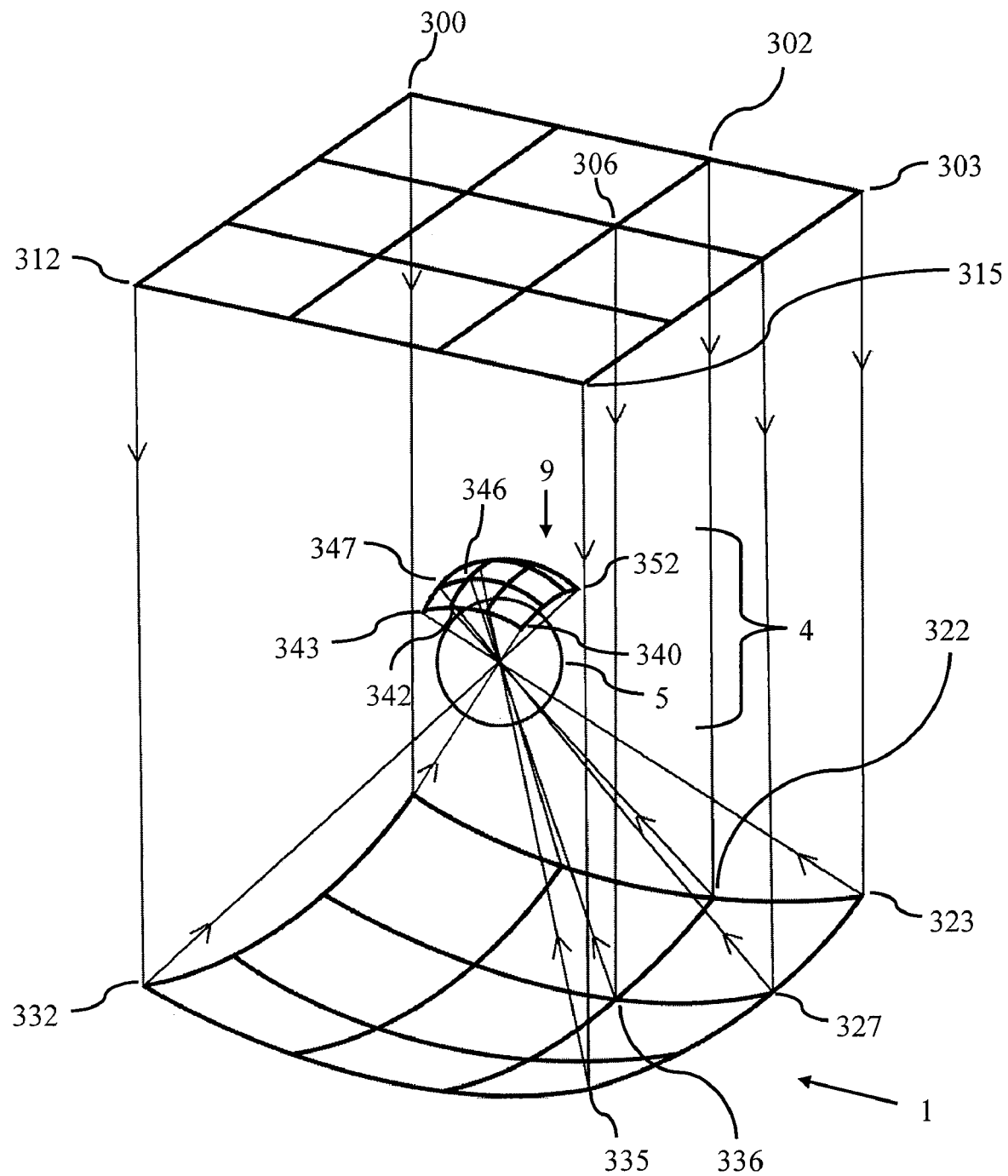
FIG. 8 is a perspective diagram illustrating the corresponding division of entrance pupil and receiving surface.

The preferred facet geometry at the receiving surface 9 is dependent on the shape, size and focal ratio of the primary reflector 1 to be used to illuminate a generator 4. The correspondence between the primary reflector 1 and receiving surface 9 is shown in FIG. 8, which illustrates schematically a generator 4 designed for use with a square primary reflector 1, by which is meant a reflector whose outline is square when viewed looking down the axis from a large distance away. On-axis rays 2 headed toward the primary mirror 1 are illustrated passing through a plane 65 perpendicular to the axis of a paraboloidal primary reflector 1 and bounded by the large square marked by the corner points 300, 303, 315 and 312. The rays 2 from these points propagate to the primary reflector 1, marking out the reflector corner points 320, 323, 335 and 332. The rays 3 reflected from the corners of the square primary reflector 1 pass through the ball lens 5 and the focus 28 to mark out the corners of the receiving surface 9, at points 340, 343, 355 (hidden from view) and 352. The rays 3 all pass as straight lines from the reflector 1 through the ball center point 28 and onto the receiving surface 9. The on-axis rays 3 illustrated are not bent by the ball lens 5 because they are reflected toward the point focus 28 at precisely the center of the ball lens 5 and thus enter and exit the ball lens 5 at normal incidence, when there is no deviation.

The receiving surface for any specified primary reflector 1 may be conveniently divided into areas receiving equal power by the following construction, illustrated in FIG. 8. The large area of entering sunlight 65 is divided into a number of smaller equal areas. Any number of equal areas may be used in this construction, a small number being shown here for clarity. Thus FIG. 8 shows the division of the square of sunlight 65 into nine identical smaller squares, such as the one marked by corners 302, 303, 307 and 306. Equal amounts of solar energy pass through each of the equal area smaller squares and propagate as shown by the rays 2 to fall onto the primary reflector 1 in the marked areas. For example light initially passing through the smaller square with corners 302, 303, 307 and 306 falls on the primary reflector 1 in the area bounded by the corner points 322, 323, 327 and 326. The rays 2 are reflected by the primary reflector 1 as rays 3 that pass straight through the ball lens 5 and the paraboloid point focus 28 and arrive at the receiving surface 9. For example, the light reflected from the area on the primary reflector 1 bounded by corner points 322, 323, 327 and 326 falls on the receiving surface 9 in the area bounded by corners 342, 343, 347 and 346. Each small area on the receiving surface 9 constructed in this way receives an equal amount of sunlight energy. By simple extension of this geometric construction, areas of equal power may be mapped out on any receiving surface 9, by dividing the full area on plane 65 that delivers light to the primary reflector 1 into equal smaller areas. It is a further a property of this optical system (and a significant advantage) that the shape of any of the small areas marked out on the receiving surface 9 is similar to that of the area marked out by corresponding points on the defining plane 65 of entering light. Since in the illustrative example the individual entrance pupil shapes are square, so, approximately, are the equal power shapes on the receiving surface, though the latter are not all of the same size. Even if the reflected rays 3 are somewhat misdirected by the primary reflector 1, the solar energy reflected from an area on the paraboloidal reflector 1 delineated by this construction, such as that bounded by 322, 323, 327 and 328, is still delivered to the corresponding areas of equal power on the receiving surface 9, in this example that are bounded by corners 342, 343, 347 and 346. This is because the receiving surface 9 is the surface of the image formed by the ball lens 5 of the primary reflector 1.

Figure 9A:
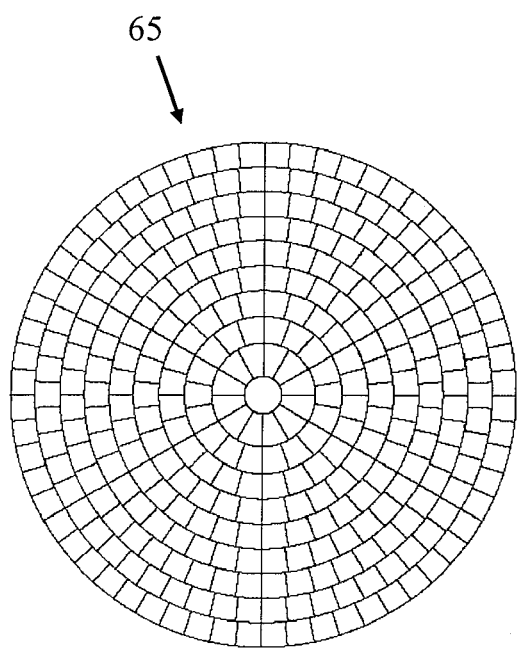
FIG. 9a is a schematic diagram illustrating a circular entrance pupil divided into equal areas by rings and spokes.
Figure 9B:
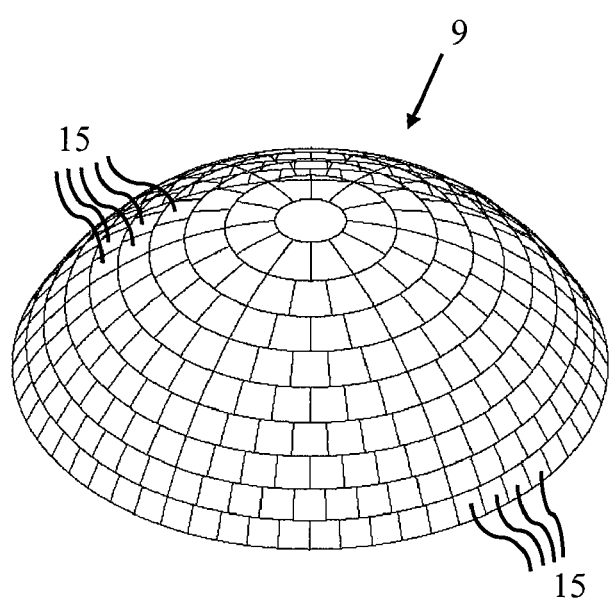
FIG. 9b is a perspective view illustrating the receiving surface corresponding to the entrance pupil of FIG. 9a, with trapezoidal cells receiving equal power.

An illustrative example of construction of areas of equal power at the receiving surface 9 of a generator 4 suitable for use with a large circular primary reflector is shown in FIG. 9*a*. The initial plane surface 65 is circular, and is divided into equal keystone-shaped areas by rings and spokes. The image on the receiving surface 9 of this pattern may be very closely approximated by rings of trapezoids, all of the same size in any one ring, as shown in FIG. 9*b*. In this illustration, the total number of photovoltaic cells 15 is 336 and ten different keystone shaped cell types are required, one type for each ring. The outer trapezoidal areas on the receiving surface 9 are approximately square in this example, while the innermost rings are more distinctly trapezoidal. The non-rectangular shapes of the cells 15 required to tile the equal areas on the receiving surface 9 should not increase manufacturing cost significantly in the case of large-scale mass production, and thus should not be a cost deterrent from exploiting the unique optical and operational advantages of this invention. Indeed, a configuration of the trapezoidal shaped cells 15 may be manufactured where the photovoltaic cells 15 are laid out in close proximity on a circular wafer for separation by laser scribing and may result in a minimum of wasted area on the wafer. A suitable method of laser scribing is disclosed in application Ser. No. 11/441,454, filed May 25, 2006, by O'Brien et al., entitled "Infrared Laser Wafer Scribing Using Short Pulses," Pub. No. US 2007/0272666 A1, dated Nov. 29, 2007, which is incorporated herein by reference.

Figure 10A:
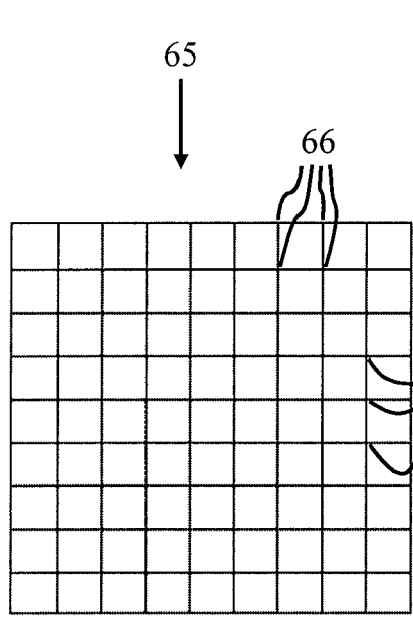
FIG. 10a is a plan view of a square surface divided into equal square areas.
Figure 10B:
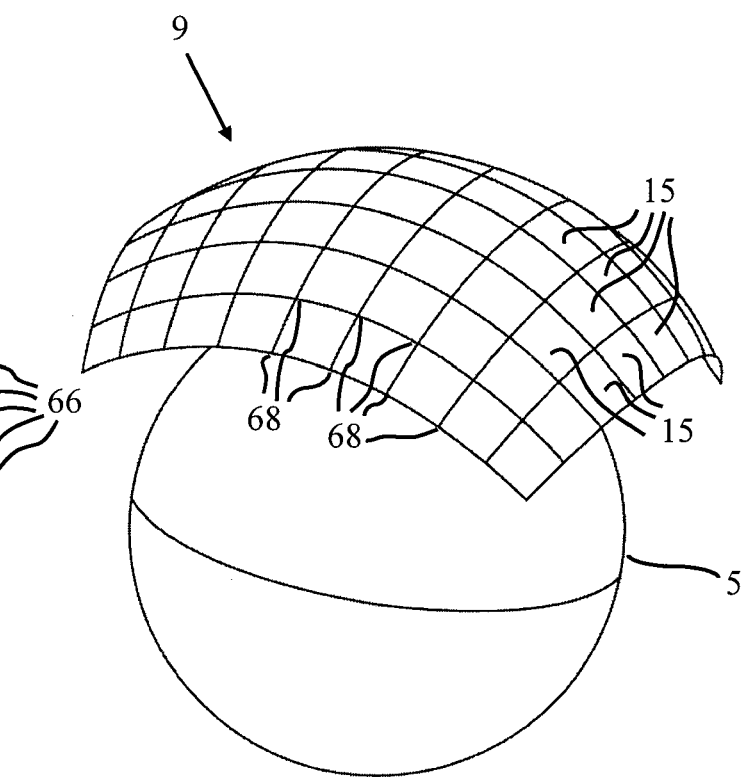
FIG. 10b is a perspective view illustrating a ball lens and receiving surface for a generator to be used with a square primary reflector, and divided into approximately square areas of equal power by the construction of FIG. 8.

A second illustrative example of the receiving surface of this embodiment type, with a tiling pattern suitable for use with a square primary reflector, is illustrated in FIG. 10*a* and FIG. 10*b*. FIG. 10*a* is a plan view of a regular square grid of 9×9 cells of rays at a flat surface 65, where all the squares of the grid, marked by corners 66, have equal area. FIG. 10*b* shows the pattern of cells 15 at the receiving surface 9 constructed by the method illustrated in FIG. 8. The receiving surface 9 is here divided as illustrated in FIG. 10*b*, into 81 approximately square shapes receiving equal power, although having differing areas.

Figure 11:
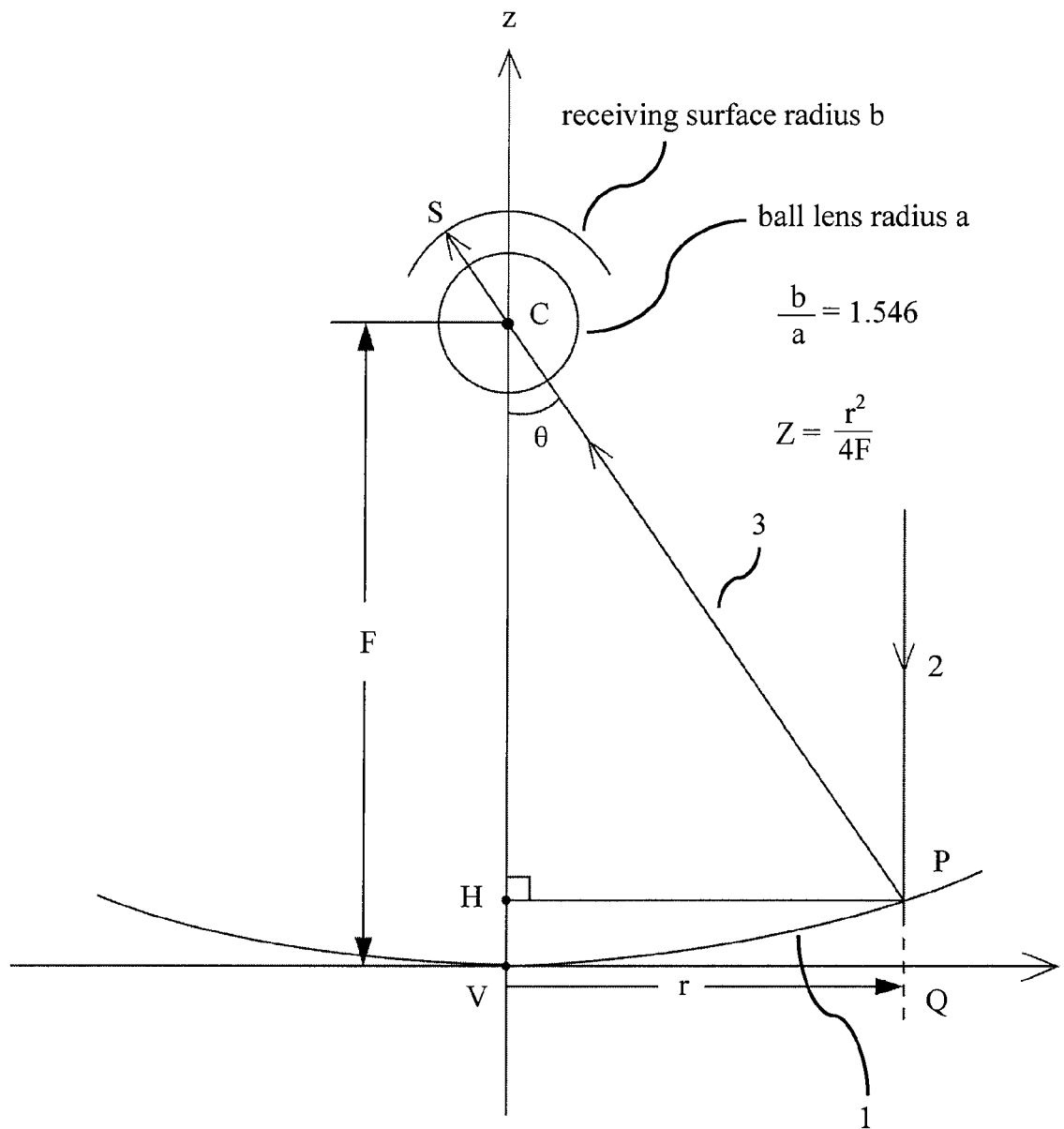
FIG. 11 is a geometric diagram illustrating rays reflected by a paraboloidal mirror into a generator according to the present invention.

The ray geometry for the equal area construction of FIG. 8 is illustrated in FIG. 11. A ray 2, parallel to the paraboloid axis, impacts a primary reflector 1 at point P at radius r measured from the paraboloid axis VC. It is reflected as ray 3 at angle θ measured from the paraboloid axis VC. The angle θ may be related to r by considering the right triangle PHC, whose side HC has length equal to VC−VH. Now VC=F, the focal length of the paraboloid, and HV=PQ=z, the sagittal depth of the paraboloid at point P, equal to $r^2/4\,F$ (from the equation of a paraboloid of focal length "F"). Thus HC=F−$z^2/4$ F. Considering the angle θ=HCP, the desired relationship can be determined by:

$$\theta = \tan^{-1}\left(\frac{r}{F - r^2/4F}\right). \tag{4}$$

With reference to FIG. 10a, the solar power entering any square at the entrance pupil 65 is all delivered to the image of the square on the receiving surface 9, except for only the small losses at the transmitting surfaces and from internal absorption of the ball lens 5. Since the entrance pupil squares all have the same area, and the optical losses are essentially constant across the pupil, all cells across the receiving surface receive the same power, although the concentration increases with radius. Thus the receiving surface apertures determined by the above construction become smaller with increasing radius, in order to compensate for the concentration increase. Thus, for this embodiment, approximately square cells covering a range of different sizes are required, becoming smaller in area with increasing radius, as illustrated in FIG. 10b.

The photovoltaic cells 15 for this embodiment are preferably specially manufactured in different shapes and sizes with on-chip busbars to collect the photovoltaic current at the surface of the cells of minimal area, in order to obtain the maximum photovoltaically active fraction of the cell surface. The photovoltaic cells 15 are also mounted with minimal space allocated for connecting conductors. Bypass diodes, which are connected electrically across each cell to prevent damage in uneven illumination, are located behind the receiving surface to avoid additional light loss.

A weakness of the above embodiment, as with all CPV generators with cells densely arrayed directly in concentrated light, is the inevitable loss of power because not all the area of a cell is light-sensitive. The photovoltaically active fraction of the area of concentrator PV cells 15 is typically no more than 90%, the remaining area being lost to opaque electrical busbars at the edges of the cell. Thus typically 10% or more of the incident energy is wasted in such a configuration.

A second weakness is the difficulty of removing waste heat from behind closely packed cells 15. The bypass diodes 30 associated with the cells 15 and the electrical connections between cells 15 must preferably be located behind the photovoltaic cells 15 to avoid additional loss of light, and in this location they may complicate manufacture and may interfere with the flow of waste heat. Such interference may also give rise to inefficiencies by causing non-uniform temperatures.

Embodiments of Type Two

Embodiments of the second type incorporate shallow secondary reflectors to direct light away from the light insensitive edges of the cells, as illustrated schematically in FIGS. 5b and 6b. An array of secondary reflectors 45 with smaller cells behind each one may be configured in tiling arrangements that deliver the same power to each cell 15, such as those illustrated in FIG. 9b above, for use with a circular primary reflector 1, and FIG. 10b for use with a square primary reflector 1. Alternatively, a tiling configuration that delivers cells 15 with different power levels may be preferred when parallel electrical connections as well as series connections are made. A secondary reflector in this embodiment may take the form of a mirrored frame 45 or a prismatic window 11, as illustrated in the detailed cross section of the prismatic windows 11 in FIG. 12a for on-axis illumination and FIG. 12b for off-axis illumination. The entrances 10 of these secondary reflectors 11 have the same shape and size as the cells 15 they replace in FIG. 9b or FIG. 10b, but will couple now to smaller photovoltaic cells 15 (not shown) located immediately behind exit faces 12. The secondary reflectors may be configured with planar edge reflecting surfaces 13, in which case the cells will have the same corner angles and number of sides as the entrance faces 10, but will be scaled down in size.

Figure 13A:
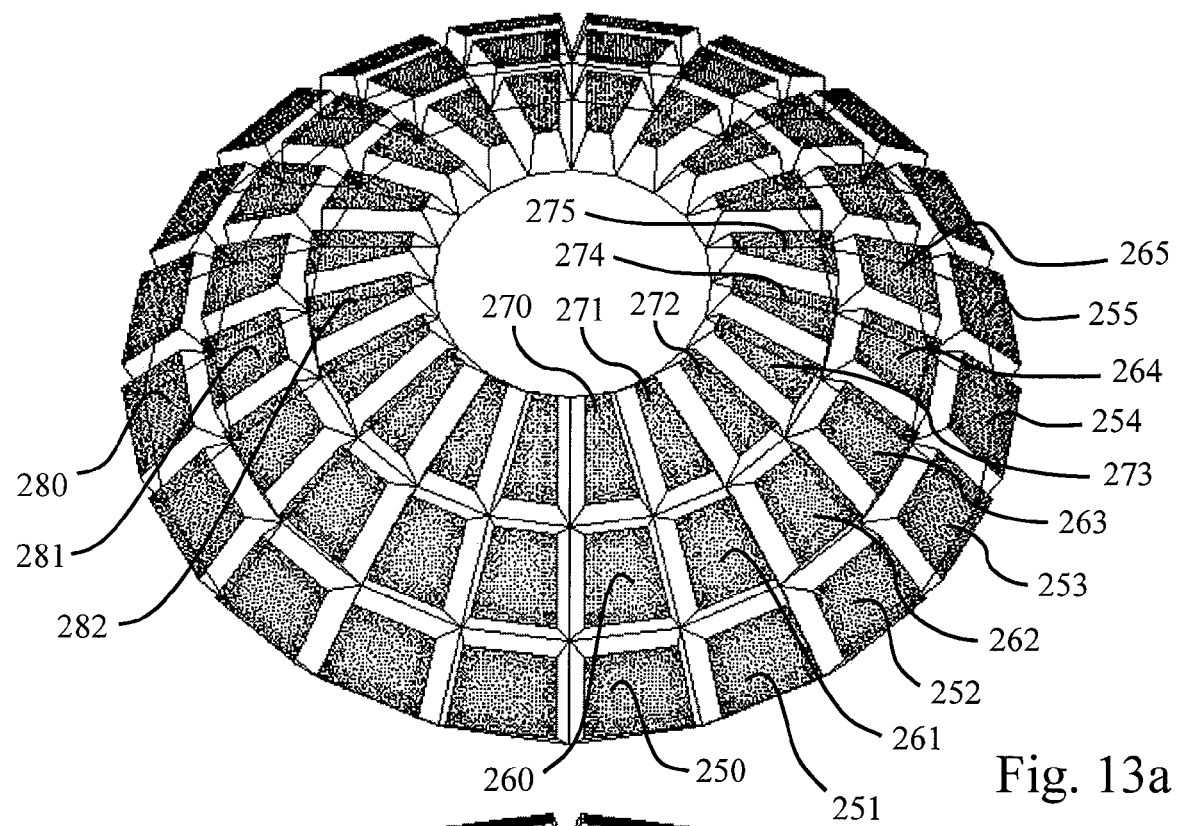
FIG. 13a is a schematic diagram illustrating rings of thin prismatic windows with intensity at the exit faces calculated by ray tracing for on-axis illumination.
Figure 13B:
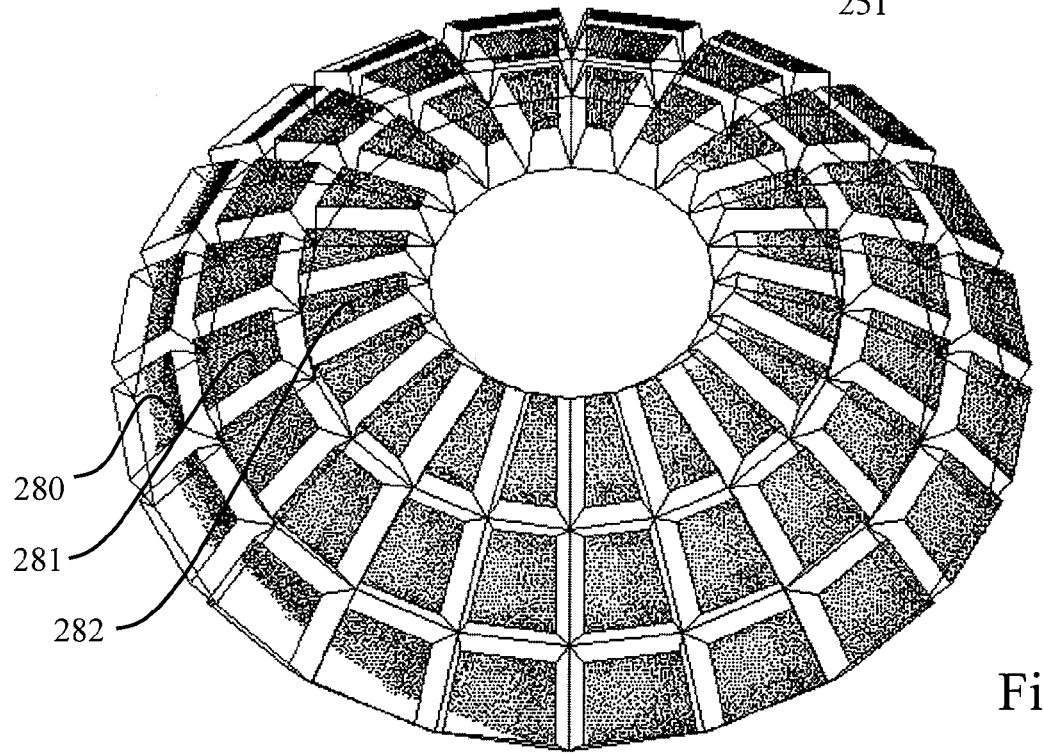
FIG. 13b is a schematic diagram illustrating rings of thin prismatic windows with intensity at the exit faces calculated by ray tracing for off-axis illumination.

An especially preferred embodiment uses shallow secondary reflectors in the form of prismatic windows, and a tiling pattern configured for combined parallel and series electrical connections. FIG. 13a depicts an exemplary configuration of rings of thin prismatic windows suitable for such tiling of a circular receiving surface 9 and appropriate for use with a circular primary reflector 1, with shading indicating the output of concentrated light to the photovoltaically active areas of the concentrator cells 15. In FIG. 13a and FIG. 13b, darker shading indicates higher concentration. The photovoltaic cells 15 and their associated structures are centered on points equally spaced in longitude and in rings of common latitude, as illustrated in FIG. 13a. Referring to FIG. 13a, the locations of prismatic window outputs 12 for specific photovoltaic cells 250 through 279 are provided, it being understood that only about half of the photovoltaic cells in FIG. 13a are shown with reference numerals, for purposes of clarity. An outer ring including photovoltaic cells 250, 251, 252, 253, 254, 255 and 280 is shown. In a preferred embodiment, the cells 250, 251, 252, 253, 254, 255 and 280 in the outer ring have substantially the same shape. A middle ring including photovoltaic cells 260, 261, 262, 263, 264, 265 and 281 is provided. Note that middle ring cell 260 is shaped as a trapezoid having a greater height and smaller base as compared to the corresponding outer ring cell 250. In a preferred embodiment, each of the cells 260, 261, 262, 263, 264, 265 and 281 in the middle ring has substantially the same shape. An inner ring of photovoltaic cells 270, 271, 272, 273, 274, 275 and 282 is also provided. Inner ring cell 270 is shaped as a trapezoid having a greater height and smaller base as compared to the corresponding middle ring cell 260. In a preferred embodiment, each of the cells 270, 271, 272, 273, 274, 275 and 282 in the inner ring have substantially the same shape.

Figure 14:
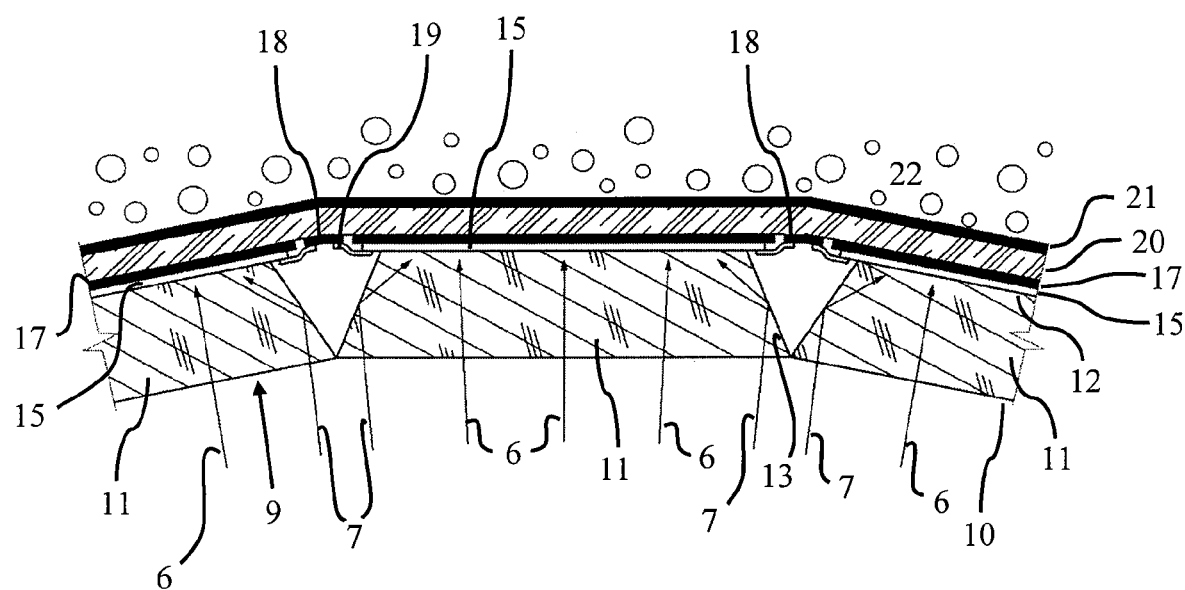
FIG. 14 is a cross-sectional view showing details of an assembly with thin prismatic windows, photovoltaic cells, and a monolithic structure supporting the photovoltaic cells.
Figure 15:
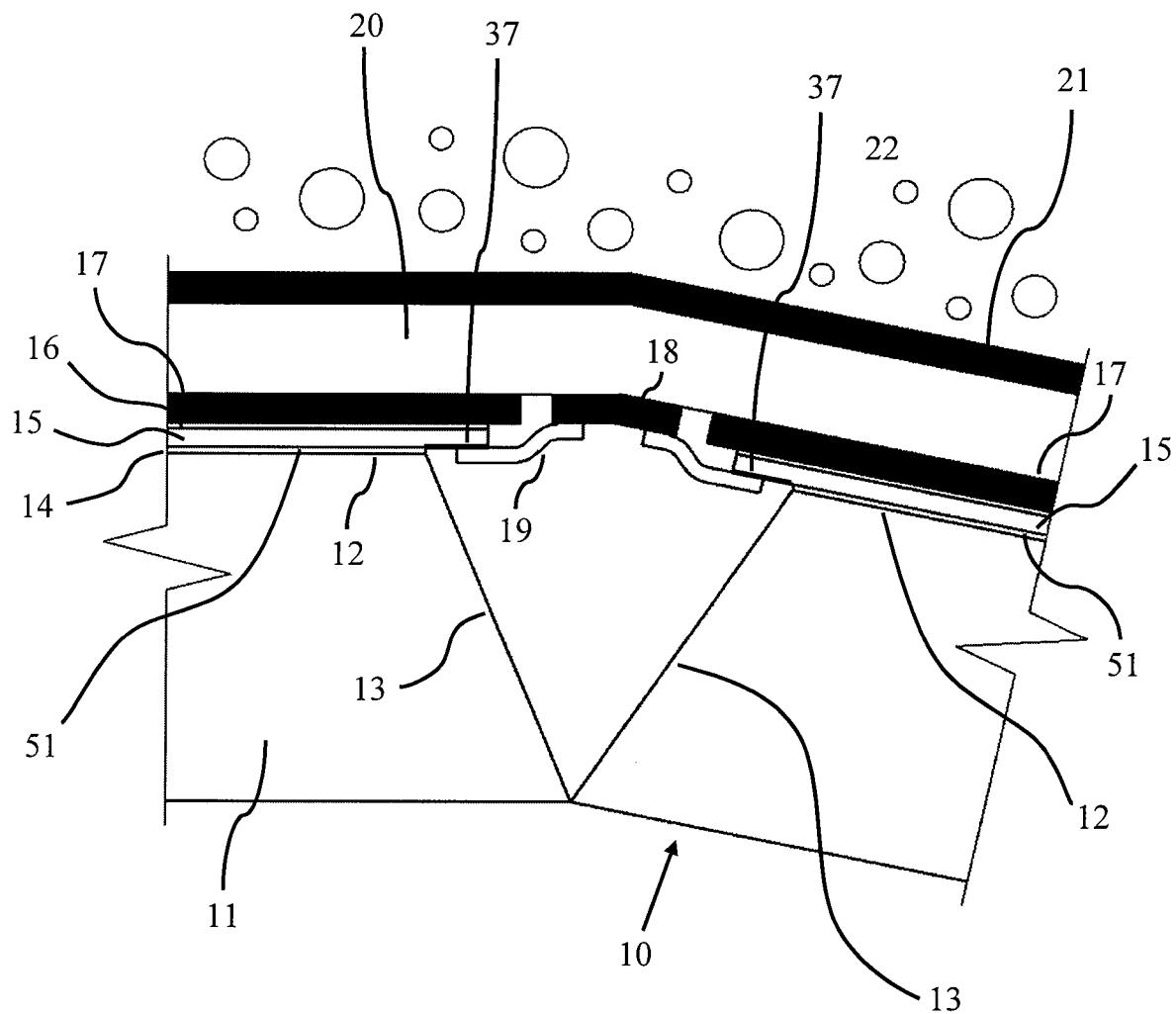
FIG. 15 is a cross sectional view showing details of concentrator cell wiring using a single printed circuit.

Details of a generator 4 according to this preferred embodiment with secondary reflectors in the form of shallow prismatic windows are shown in the overview cross section of FIG. 2, with details of cell coupling and cooling shown in the cross sectional views of FIG. 14 and FIG. 15. In this example of a generator 4 embodiment, the outputs of the prismatic windows shown by shading in FIG. 13a are coupled to flat concentrator photovoltaic cells 15. The cup-shaped receiving surface 9 is illuminated with substantially stabilized concentrated solar radiation 6 and 7. The solar radiation is coupled to the photovoltaic cells 15 through prismatic windows 11. The purpose of the prismatic windows 11 is to direct the substantially continuously distributed solar radiation 6 and 7 away from the busbars 37 on the edges of photovoltaic cells 15 and away from the interconnects 19 and the copper circuit trace 18 between the cells 15; (this solar radiation would otherwise be wasted if it fell on busbars 37 and interconnects 19). In this way, substantially all of the solar radiation 6 and 7 is directed onto the photovoltaically active surfaces 51 of the photovoltaic cells 15 and thus efficiency is maximized. Each prismatic window 11 preferably has a plane parallel entrance face 10 and exit face 12. Each prismatic window 11 has plane polished edges 13. As shown in FIG. 13*a*, the flat entrance faces 10 of the windows 11 are shaped to fit together in a polyhedron that tiles substantially seamlessly the receiving surface 9. The polyhedron facets 10 are polygons, preferably mostly trapezoids, and the concentrator cells 15 are also mostly similar polygons with the same corner angles and number of sides as the entrance faces 10, but of smaller corresponding dimensions. Facets of the polyhedron near the center of the receiving surface 9 (not shown in FIG. 13*a* and FIG. 13*b*) are typically polygons with more than four sides.

The substantially flat exit faces 12 of the prismatic windows 11 are matched to fit the trapezoidal, photovoltaically active areas 51 of the cells 15. The prismatic windows 11 are preferably bonded to the cells 15 with a thin layer of optically transmitting material 14 to minimize losses by dielectric and total internal reflection. Light rays 7 that enter close to the edges of the entrance 10 to a window 11 undergo total internal reflection at the polished edges 13, and are thus effectively brought onto the photovoltaically active cell area 51. The uniformity and concentration of the solar radiation transmitted and reflected to the photovoltaic cell 15 depends on the geometry of the window 11, as described above and illustrated in FIG. 5 and FIG. 6.

Prismatic windows 11 are made preferably mass produced at low cost by precision molding of glass with high transmission to the solar flux. The mold is made with a draft angle so as to form the smaller exit face 12 and sloping faces 13. After these faces 12 and 13 are formed in a single molding operation, the partially formed prismatic window 11 is completed by grinding and polishing the larger, flat entry face 10.

Solar energy not converted into electricity results in heat which is removed from the cells 15 by conduction through the copper-ceramic sandwich 17, 20 and 21. It is desirable to cool the generator 4 by removing excess heat. A preferred method and apparatus for cooling are illustrated in FIGS. 1, 2, 14 and 15, using a working fluid 22 in direct contact with the outer copper layer 21. The generator 4 preferably incorporates finned cooling pipes 24 and uses passive heat-pipe principles for cooling, with the heat absorbed by causing liquid 22 to boil, as illustrated, and best shown in FIG. 2. Referring to FIG. 2, vapor 23 travels to finned cooling pipes 24 and is returned as condensed liquid 25. In the illustrative example shown in FIG. 2, a tree of finned pipes 24 is used, wherein each pipe 24 is oriented parallel to the paraboloidal axis. In the illustrated example, all of the axes of the pipes 24 pass above the top of the receiving surface 9, so that for all useful solar elevations the condensed liquid 25 runs back to the reservoir of coolant 22 behind the receiving surface 9, with no necessity for wicking. It should be understood that this cooling method is illustrative only, and that other means of cooling, such as by pumping the liquid 22 to an external radiator, could be used. For purposes of illustration in FIG. 2, the generator 4 is held with the sphere centered on the paraboloidal focus 28 by struts 26, and electricity generated by the cells 15 is coupled to wires or conductors 27 which may be attached to the struts 26, so that electricity can be brought out and transmitted for use elsewhere. An alternative preferred support for the generator 4 is by an axial post 39 to vanes 38 as shown in FIG. 1. In the preferred embodiment illustrated by FIG. 14 and FIG. 15, the gaps between the cells 15 are small and the thermally conducting substrate is unified as a continuous thin shell 20, in the form of a concave, faceted polyhedral cup 20. A method of manufacture for a such a concave receiver assembly carrying a plurality of photovoltaic cells 15 is described below.

Note that heating of the cells 15 is unlikely to be a problem in the edge and corner regions of higher concentration of the photovoltaically active area 51. The substrate thickness is made comparable in thickness to the narrow regions of edge brightening, so that additional localized heat in the substrate will tend to diffuse laterally into the gap regions where there is no solar illumination or heating. In addition, the direct short path through the copper-clad ceramic to the cooling liquid 22 as shown in FIG. 14 and FIG. 15 minimizes temperature rise.

While heat-sink or thermosiphon type boiling may be used as illustrated in FIG. 2 and FIG. 14 to cool the back side of the ceramic bowl 20, it will be clear to those familiar with cooling technology that alternative methods could be used. Forced liquid flow is one such alternative, which is preferably implemented with closely spaced fins or rods built-in as part of the back surface of the ceramic 20 to increase surface area. In this case the liquid flow is directed between the fins or rods to preserve a high temperature gradient in the liquid 22 at the surface, and thus efficient heat transfer into the liquid 22. In addition, thermal transfer alternatives as described for the following embodiment three below are generally applicable to all embodiments.

Figure 26:
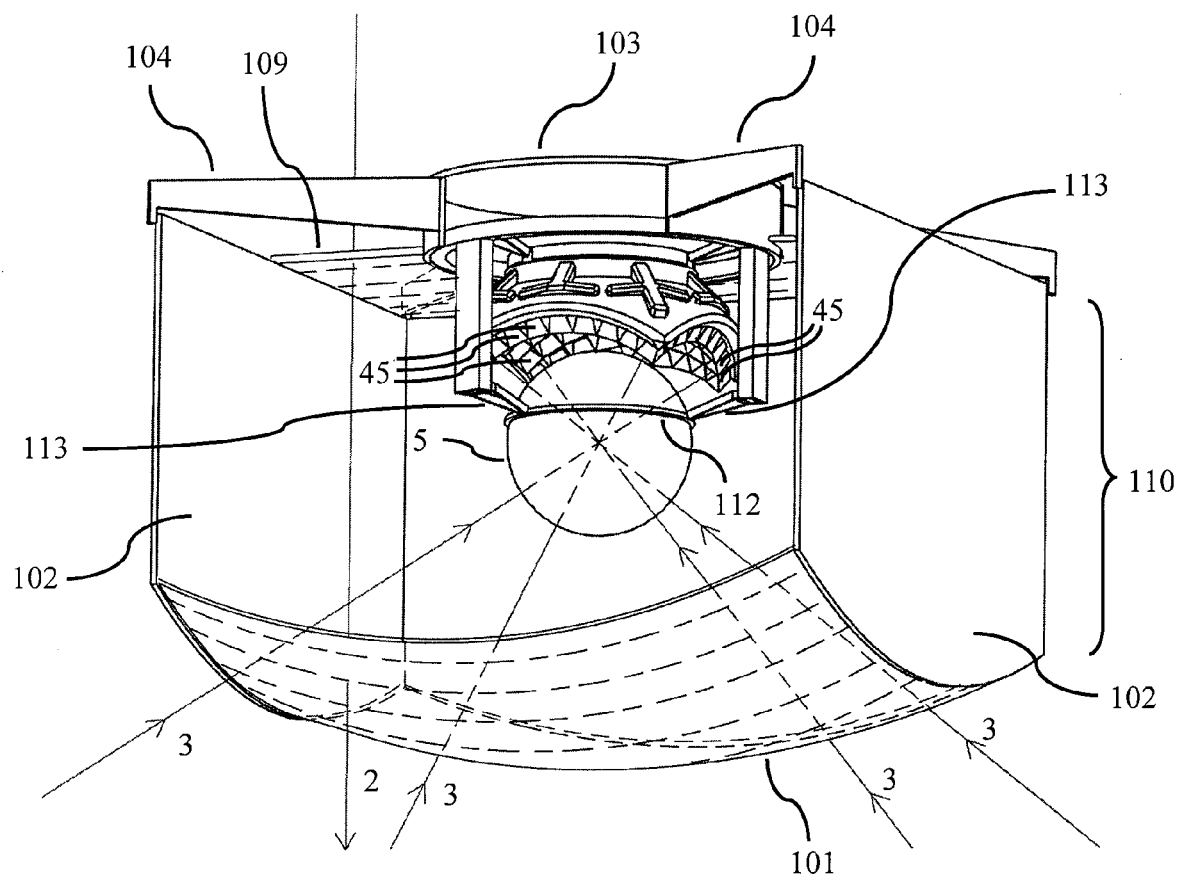
FIG. 26 is a perspective view detailing the generator of FIG. 25, with some components shown in section for clarity.
Figure 40:
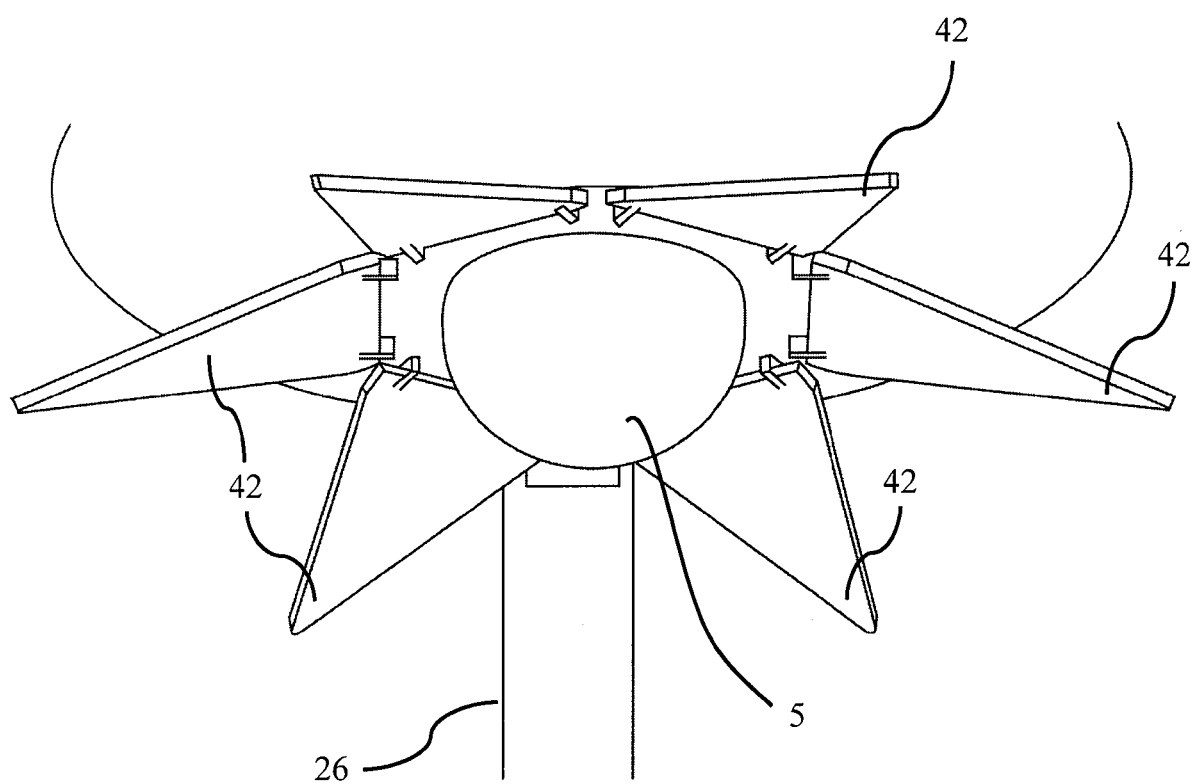
FIG. 40 illustrates a shutter in the form of articulated petals to protect the ball lens entrance surface.

The entry surface of the ball lens 5 may be protected by an articulated petal-like cover 42, which is shown in an open position in FIG. 40. This cover 42 will be closed when the sun is not shining, to protect the ball lens 5 from dust and insects that could be burned on the surface of the ball lens 5 when clouds part. Alternatively, the ball lens 5 of this embodiment may be protected by a transparent window 101, as illustrated in FIG. 26.

Effects of Large Mispointing Angles

Stabilization of the intensity of concentrated light on the cells 15 is built into the optical design, because the re-imaging results in one-for-one correspondence between rays from a point on the dish 1 and its conjugate on the receiving surface 9 as illustrated in FIG. 4*b*. Provided these rays are not displaced too far toward the edge of the ball lens 5, all the photovoltaic cells 15 remain uniformly illuminated. However, this stabilization begins to break down for those rays displaced far from the center of the spherical lens 5 at the paraboloid focus 28, entering the ball 5 close to its edge. Such large ray displacement may arise because of large departures of the dish surface 1 shape from the desired paraboloid and because of the combination of such effects as mispointing and the finite angular size of the sun.

The effect of large mispointing angles is best understood by consideration of the details of the light distribution as mispointing angle is increased. To this end, the response of a ball lens 5 to off-axis illumination has been modeled with a custom built ray-tracing code. The code models reflection and refraction by the paraboloidal primary 1, the spherical ball lens 5, and the prismatic windows 11 in front of the cells 15. The model includes also an opaque disc that supports the ball lens 5 above its center and blocks rays at large mispointing angles that miss the ball lens 5 entirely. The code determines which rays enter which prismatic window 11 after transmission by the ball 5, and these rays are traced through to the cell 15, including multiple internal reflections in the window 11 as necessary.

The character of mispointing errors is illustrated in FIG. 16*a* through FIG. 16*h*. FIG. 16*a* through FIG. 16*h* depict cross section diagrams corresponding to progressively larger pointing errors. The paths of rays through the ball 5 shown in detail in FIG. 16*a* through FIG. 16*h* are of rays 3 reflected from a given line of points across a diameter of an f/0.5 paraboloidal reflector 1. The paths are modeled for collimated rays 2 entering the paraboloidal reflector 1 at different angles to the paraboloid axis (mispointing angles), as indicated.

Figure 16A:
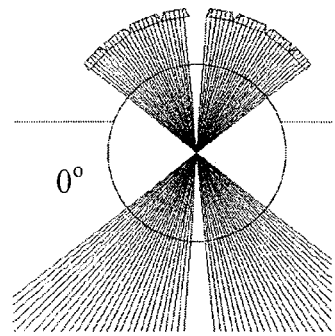
FIG. 16a is a ray diagram illustrating the paths of rays to a receiving surface without any mispointing.
Figure 16B:
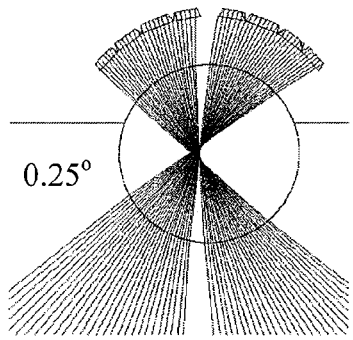
FIG. 16b is a ray diagram illustrating the paths of rays to a receiving surface with a slight mispointing angle.
Figure 16C:
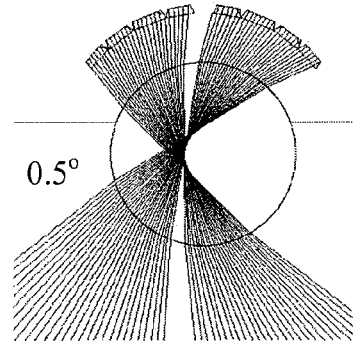
FIG. 16c is a ray diagram illustrating the paths of rays to a receiving surface with a larger mispointing angle than the mispointing angle shown in FIG. 16b.

For on-axis illumination, as shown in FIG. 16*a*, the rays 3 enter and exit the ball lens 5 at normal incidence and are undeviated, i.e. they follow straight line paths from the reflector 1, through the ball lens 5 and on to the receiving surface 9. At the extreme of off-axis illumination shown in FIG. 16*h*, none of the rays intersect the ball lens 5 or reach the receiving surface 9, and the power output drops to zero. The critical mispointing angle $\delta_c$ corresponding to zero output, for any given ball radius "a" and primary paraboloid focal length "F", is given by $$\delta_C = A/F \quad (5)$$

The critical angle for the case illustrated $\delta_c = 1.65°$. It will be seen that the intensity at the curved receiving surface 9 is highly stable against pointing errors up to half the critical angle, due to the imaging property of the ball lens 5. At these larger angles, the area of illumination is shifted off-center relative to the receiving surface 9, to the right in FIG. 16*b* through FIG. 16*h*. The intensity at the receiving surface 9 given by the density of rays shown in FIG. 16*a* through FIG. 16*h* falls to zero near the left-hand edge. If all the photovoltaic cells 15 covering the receiving surface 9 were electrically connected individually in series, each with a bypass diode, then when cells 15 around this edge lose sufficient current their power would be cut out completely by the action of the by-pass diodes.

An Embodiment of Type Two with Optimized Electrical Connections to Increase Tolerance to Mispointing In order to minimize the loss of generator power for mispointing errors larger than $$\delta_C/2,$$

some preferred embodiments combine the electrical outputs from the photovoltaic cells 15 in a way to maintain uniform high current, by taking advantage of the predictable changes in illumination illustrated in FIGS. 16*a*-16*h*. In these preferred embodiments, such loss is avoided by an electrical configuration in which the outputs of photovoltaic cells 15 are combined in radial groups connected electrically in parallel. The goal of these optical and electrical strategies is to keep groups of photovoltaic cells 15 operating close to their maximum power point in their I-V (current-voltage) curve, even when individual photovoltaic cells 15 lose or gain power. Ideally, the peak-to-valley spread in current in the cells 15 or parallel groups of cells 15 for typical flexure and mispointing should be less than 10% of the mean. At this spread, the loss in power from current mismatch of groups connected in series is likely to be less than 2.5%. By making parallel connections, such high performance may be maintained to larger mispointing angles.

Figure 16D:
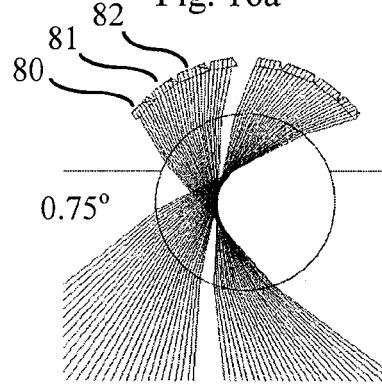
FIG. 16d is a ray diagram illustrating the paths of rays to a receiving surface with a larger mispointing angle than the mispointing angle shown in FIG. 16c.
Figure 16E:
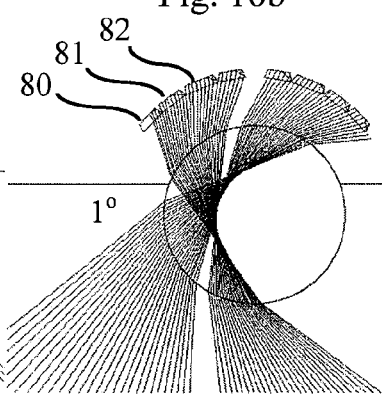
FIG. 16e is a ray diagram illustrating the paths of rays to a receiving surface with a larger mispointing angle than the mispointing angle shown in FIG. 16d.
Figure 16F:
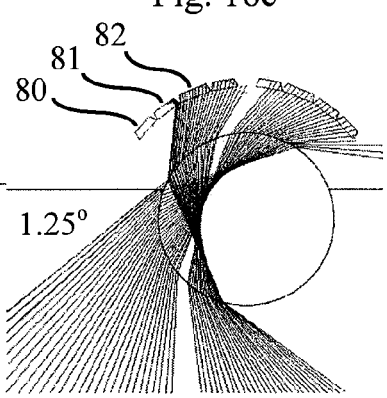
FIG. 16f is a ray diagram illustrating the paths of rays to a receiving surface with a larger mispointing angle than the mispointing angle shown in FIG. 16e.

An embodiment that optimizes electrical connections to minimize the power loss with mispointing takes advantage of systematic and predictable changes in illumination of the imaging optics of the invention. As shown in FIG. 16*d*, FIG. 16*e* and FIG. 16*f*, when the mispointing angle exceeds $\delta_c/2$, edge cell 180 (on the left-hand side) loses power, while there is an accompanying increase in concentration at adjacent cells 181 and 182, closer to the center. For cells 181 and 182, the intensity may exceed even that for on-axis illumination. Thus by connecting radially-oriented groups of cells such as 180, 181 and 182 in parallel groups, cell current differences are spatially averaged. The averaged current for a radial group on the left hand side, in FIGS. 16*e* and 16*f* is then similar to radial average for the cells on the opposite right-hand side of the receiving surface 183, 184 and 185 in FIG. 16*d*, FIG. 16*e* and FIG. 16*f*, where the illumination continues to the edge (and beyond), but is everywhere lower than for on-axis illumination as shown in FIG. 16*a*. These groups of (electrically connected in parallel) cells 15 that are physically located in radial groups of cells 15, are in turn electrically connected in series around the azimuthal direction, in the manner depicted in FIG. 17, for a total power output that is relatively insensitive to mispointing.

Figure 17:
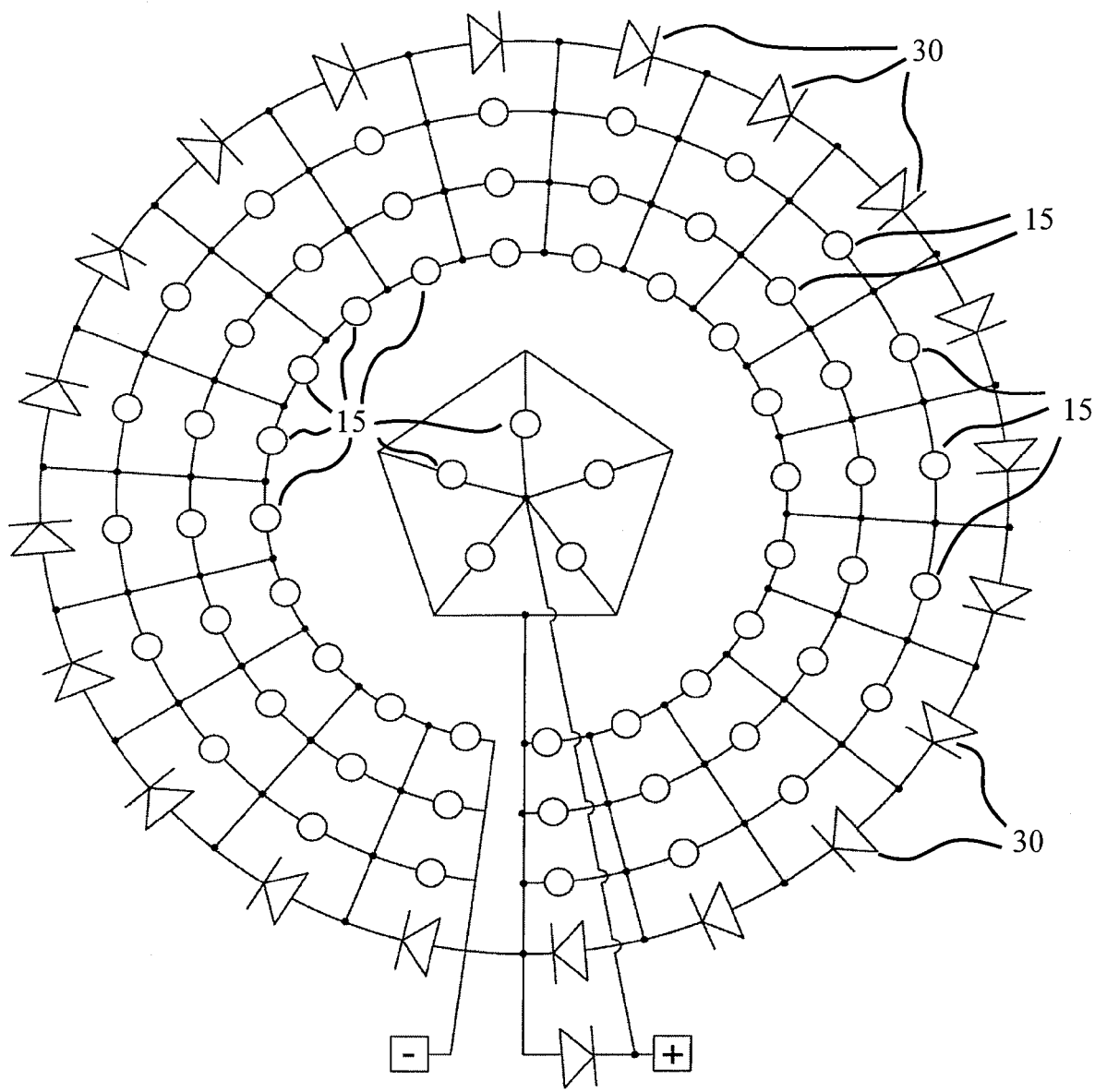
FIG. 17 is a schematic diagram illustrating a configuration for the electrical interconnection of photovoltaic cells to improve tolerance to mispointing of the reflector relative to the sun.

In FIG. 17, the cells 15 are represented schematically by circles. For purposes of clarity, only some of the cells are provided with reference numerals in the drawing. Bypass diodes 30 provide conductivity at times that a cell 15 is not illuminated sufficiently, because a non-illuminated cell 15 might otherwise be damaged by current from the generator. The connections between cells 15 and the bypass diodes 30 may be made by a printed circuit with traces 17 and 18 formed in the inner copper layer.

In accordance with the present embodiment, the preferred tiling patterns for cells 15 across the receiving surface 9 are those which provide for radial groupings that all yield substantially the same current over an increased range of mispointing. Such tiling of photovoltaic cells 15 is straightforward for the case of a circular paraboloidal reflector 1, which is imaged by the ball lens 5 to a receiving surface 9 with a circular perimeter.

The principle of connecting photovoltaic cells 15 in parallel in radially-oriented groups so that cell current differences are spatially averaged may be better explained with reference to the details of illumination intensity shown in perspective views FIG. 13*a* and FIG. 13*b*. FIG. 13*a* is for on-axis illumination and FIG. 13*b* for illumination 1 degree off-axis. The critical angle for the illustrated system is $\theta_c = 1.65°$. In these views, the light exiting secondary reflectors at faces 12 of the prismatic windows 11 is shown as a distribution of black dots. The dots represent the exit point of rays 3 reflected by the primary reflector 1 that entered the system as rays 2 at plane 65 (FIG. 8) with a uniform and quasi random spatial distribution. The dot density in FIGS. 13*a* and 13*b* is thus representative of the concentration of the solar radiation illuminating the photovoltaically active cell areas 51 which are located immediately behind the prismatic window exit windows 12.

One cell 250 from the outer ring, one cell 260 from the middle ring, and one cell 270 from the inner ring form a radially-oriented group. This radially oriented group of cells 250, 260 and 270 are electrically connected in parallel so that their cell current differences are spatially averaged. Similarly, photovoltaic cells 251, 261 and 271 form a radially-oriented group that is electrically connected in parallel. Likewise, photovoltaic cells 252, 262 and 272 are electrically connected in parallel. Similarly, cell 280 in the outer ring is connected in parallel with cell 281 in the middle ring and cell 282 in the inner ring. These groups of cells are in turn electrically connected in series around the azimuthal direction. For example, the first group of cells 250, 260 and 270 are electrically connected in series with the second group of cells 251, 261 and 271, which in turn is electrically connected in series with the third group of cells 252, 262 and 272, and so on.

In FIG. 13*b*, cell 280 and the other cells on the outer ring adjacent to it are not fully illuminated due to a one degree pointing error by the tracker. Considering the effect of this mispointing on the three cells 280, 281 and 282 that are in the same radial group, while cell 280 receives less illumination, the illumination on cell 281, and to some extent the illumination of cell 282, is more intense as compared to the illumination received by those respective cells in the circumstances depicted in FIG. 13*a*. Because the cells 280, 281 and 282 are connected in parallel, the currents generated by the cells 280, 281 and 282 are summed together. Less current from the partially illuminated cell 280 is then added to the increased current from cell 281 due to the increased intensity of illumination that it receives, and to some extent increased current is produced by cell 282 as well. Thus, the reduction in current from cell 280 is offset by the increased current from cell 281 and cell 282. The net effect is that the overall electrical output of the cells is averaged or smoothed out over a range of pointing errors. Thus, this arrangement of photovoltaic cells 15 provides a generator 4 that continues to perform over an extended range of pointing errors by a two-axis tracker used to point the reflector 1 at the sun.

FIG. 13*a* omits, for purposes of clarity, photovoltaic cells 15 that may be located at the center of the arrangement. The electrical connection of the photovoltaic cells 15 for a circularly symmetric embodiment is shown schematically in the wiring diagram depicted in FIG. 17. In this example, there are three rings of twenty trapezoidal-shaped photovoltaic calls, with twenty groups of cells connected in series, where each radial group has three cells connected in parallel. The series chain includes also a center group of five cells, not shown in FIG. 13*a*, which is sized so that in operation, allowing for any central obscuration by the generator 4 and thermal and mechanical structures 24 and 39, the center group connected in parallel produces the same current as the radial cell groups.

The advantage of electrical parallel summing is illustrated quantitatively for a specific generator embodiment for use with a circular primary mirror in FIG. 18*a*, FIG. 18*b*, FIG. 18*c* and FIG. 18*d*. Ray statistics were used to derive the dependence of photovoltaic current received by each cell 15 for rays incident at various off-axis angles. The system modeled had a circular f/0.5 paraboloid reflector 1 and a critical angle $\theta_c = 1.65°$, the same parameters as for the specific embodiment illustrated in cross section in FIG. 16*a*-FIG. 16*h*. The generator is modeled as three rings of twenty cells each as shown in FIG. 13*a*. The radial extent covered by the three rings of cells is as shown in FIG. 16*a* through FIG. 16*h*. The sun was modeled as a uniformly emitting source of ½ degree diameter. The individual currents for all sixty cells were calculated for this source placed on-axis, and at off-axis angles at 0.25° intervals from 0.5° to 1.25°.

In the graphs shown in FIG. 18*a*, FIG. 18*b*, FIG. 18*c*, and FIG. 18*d*, the sixty crosses indicate the current (vertical axis) from each of sixty cells. The current is plotted as a function of azimuth angle (horizontal scale). The current from twenty groups of cells 15 electrically wired together as indicated schematically in FIG. 17 is shown in the histogram graph depicted in FIG. 18*a*, FIG. 18*b*, FIG. 18*c*, and FIG. 18*d*. The power averaged over all photovoltaic cells 15 is shown as the horizontal dashed line. All fluxes are normalized to the on-axis values.

FIG. 18*a*, FIG. 18*b*, FIG. 18*c*, and FIG. 18*d* illustrate the advantage of the radial/parallel electrical connection as mispointing angles are increased beyond half the critical angle. For example, at a mispointing angle of 1° (0.61 $\theta_c$) where the average of all currents (dashed line) is reduced to 94%, the individual cell currents are broadly spread from 45% to 120% of their on-axis levels, but the radially averaged currents vary over a much smaller range of only about 85% to 100%. Series connection of the radial groups of three in parallel thus yields system power at >90% of the on-axis power, and within a few percent of the maximum possible if each photovoltaic cell 15 were operated at its maximum power point. Note that in the radially summed case, the variations in intensity at a given mispointing angle is a function mostly of the focal ratio of the primary reflectors f and $\theta_c$, and is essentially independent of the number of rings of cells 15.

Figure 19:
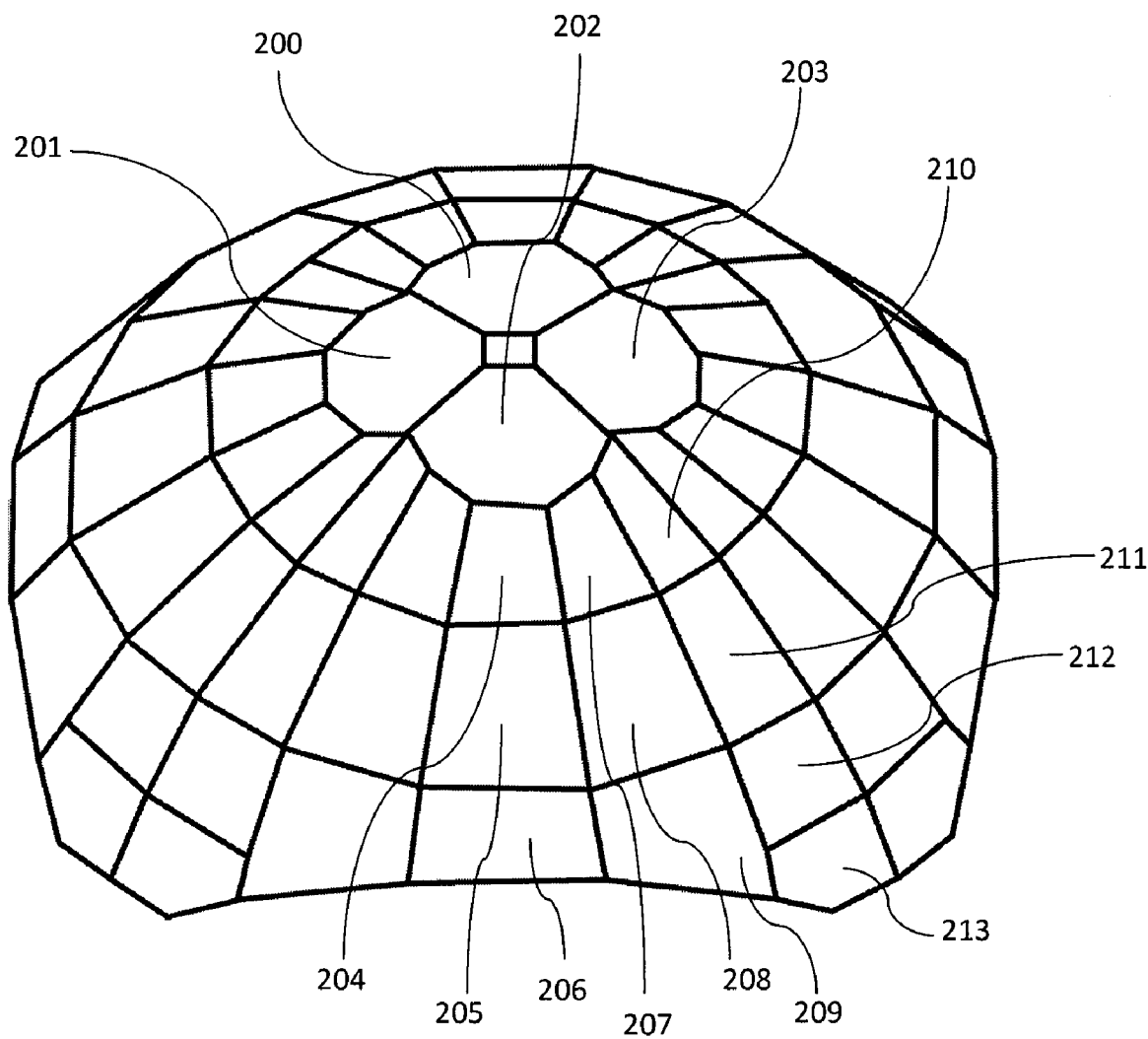
FIG. 19 is a perspective view of a preferred embodiment according to FIG. 2, showing a preferred arrangement and configuration of photovoltaic cells.

An Embodiment of Type Two with Radial Averaging for Use with a Substantially Square Primary Reflector In this embodiment the principle of radial averaging to improve mispointing tolerance is applied to a generator 4 for use with a primary reflector 1 as illustrated in FIG. 1, with a projected entrance aperture in the form of a square with clipped corners. In this embodiment, a more complex tiling of the receiving surface 9 provides groups of cells 15 of approximately radial orientation for parallel connection. FIG. 19 illustrates such a preferred tiling. The primary mirror 1 which is imaged onto the receiving surface 9 in this case is square with cut corners that leave 94% of the full square area. In the illustrated example the focal ratio is f/0.5, as measured from side-to-side of the square, and f/0.4 from clipped corner-to-clipped corner. In this illustrative tiling of the receiving surface, radial groups of matched total optical power are achieved by making the longitudinal spacing of the groups of shorter radius (to the centers of the square sides) wider than for groups of longer radius (to the corners). Referring to FIG. 19, photovoltaic cells on tiles 204, 205 and 206 form a group of cells that are electrically connected in parallel. Photovoltaic cells on tiles 207, 208 and 209 form a group of cells that are electrically connected in parallel. Similarly, photovoltaic cells on tiles 210, 211, 212 and 213 form a group of cells that are electrically connected in parallel. Thus, the grouping of photovoltaic cells for equal power are 204, 205, 206, 207, 208, 209 and 210, 211, 212 and 213. Substantially the same power is also generated by the three central octagon-shaped cells 201, 202 and 203 based upon the amount of solar radiation delivered to those cells. (The fourth central octagon-shaped region 200 is not included, and preferably no photovoltaic cell is fabricated in that region, because it is obscured by the heat pipe assembly 45, losing ~1% of the total received power). In this example of a configuration with non-circular symmetry, sixteen different prismatic window 11 and cell 15 shapes must be manufactured, four times as many as for the circular geometry shown in FIG. 13*a*. In very large scale production, this added diversity should not increase price significantly.

It should be apparent that the examples given above for tiling the receiving surface 9 resulting from circular and square clipped paraboloids are simply illustrative. Other tiling geometries that provide satisfactory performance may be devised in accordance with the principles illustrated by the above examples, depending on the dimensions of the receiving surface produced by any specific concentrator geometry. Generators 4 may be configured to accommodate concentrated light from primary reflectors 1 that differ in terms of their size, shape (for example, hexagonal) and focal ratio of the paraboloid 1 and the ratio F/b of the paraboloid focal length, by suitable choice of the radius of the spherical lens 5, and the optimum sizes and concentrations of the photovoltaic cells 15 to be used. In any specific case, tilings that offer radial groupings producing the same current will be preferred, as in the examples illustrated above.

Optimization of Multijunction Cells for Use with Secondary Reflectors

The photovoltaic cells 15 for those embodiments of this invention using secondary reflectors are preferably optimized for exceptionally high conversion efficiency, by taking advantage of both the room between cells 15 and the predictable, non-isotropic illumination provided by the reflectors. The optimization minimizes resistive or Joule losses despite high concentration, by exploiting the unique illumination and geometric characteristics of the invention. The cells 15 are also preferably custom made in the form of a trapezoids or polygons of different sizes to match precisely the trapezoidal output faces of the secondary reflectors.

Figure 20:
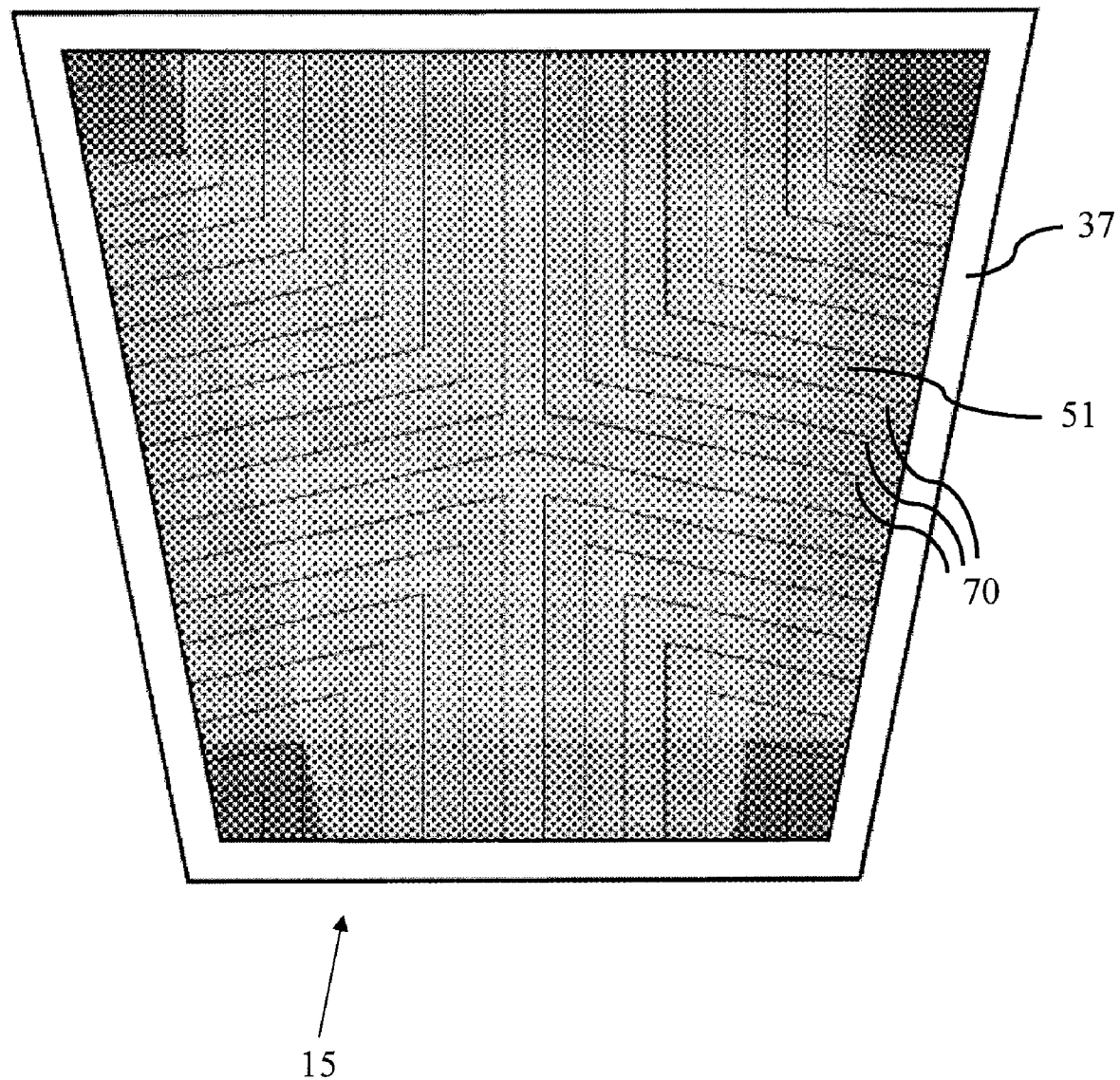
FIG. 20 is a plan view of a trapezoidal photovoltaic cell showing a preferred arrangement of perimeter cell busbars and grid wires across the photovoltaically active area.

FIG. 20 illustrates the features of a cell 15 with photovoltaically active area 51 optimized to minimize resistive losses. Resistive losses increase as the square of the concentration C, and for well-cooled photovoltaic cells 15 these losses set the ultimate limit to concentration. An edge busbar 37 extending around the full perimeter of the cell 15 is used, taking advantage of the space created by the prismatic windows 11 around all sides of the photovoltaically active areas of adjacent cells 15. Such a full perimeter busbar 37 would be undesirable in a cell 15 used in a closely packed array built without the benefit of the prismatic windows 11 of this embodiment, (as for the first embodiments of the invention described above), since it would result in loss of light. However, it is highly preferred for the cells 15 of this embodiment, in order that the thin contact wires 70 that carry the photovoltaic current across the face of the cell 15 may be angled as shown and connect at right angles to the nearest of the busbars 37 around all the side edges of the photovoltaic cell 15. This configuration minimizes the average wire length and hence the resistance and resistive loss of the thin wires 70 that make up the contact wires 70, shown schematically across the photovoltaically active area 51 of the cell 15. (In practice, the grid lines would be more closely spaced than shown in the illustration). The illustrated busbar 37 and wire configuration is especially preferred to minimize Joule losses in this embodiment where the intensity of light is strong near the edges of the photovoltaically active areas of the cells 15. The edge brightening is illustrated for on-axis illumination in FIG. 6b and in FIG. 20 by the density of shading dots. Lighter shading indicates the lowest concentration away from the edges, and darker shading, in the corners, indicates the highest concentration, arising where light is reflected to the cell surface from both adjacent sides of the prismatic window 11.

Under these conditions of illumination with edge brightening (and corresponding center dimming) the current flow from all the brighter regions travels a shorter distance down each wire to the edge busbar 37. It follows that the Joule or resistive losses point-by-point, proportional to the local current squared, is much reduced compared to the typical cell wiring with parallel wires running between only two busbars at opposite edges of the cell. Such cells are thus not optimal for the present invention, for which new types of photovoltaic cells 15 as described here are preferred.

For further reduction of resistive losses, the widths and heights (thicknesses) of the different thin, current-carrying wires 70 across the active cell faces and the edge busbars 37 will preferably be optimized so as to minimize the combined losses from Joule heating and optical obscuration by the contact wires 70. The wire grid elements are preferably made with rectangular cross section, narrow in width and extended in height, so as to minimize shadowing by light reflected by the adjacent inward sloping reflecting surface, while at the same time minimizing resistive losses. The shadows cast by wires near the busbars 37 by both direct and edge reflected light will be minimized, since according to the present invention, the light reflected away from the edges will project in general along the direction of the thin fingers of the metal grid conducting current to the perimeter busbars, and thus cast little shadow. Thus preferred cell designs may include larger than usual ratio of wire thickness to width for reduced optical losses from wire obscuration and shadowing, without increasing resistive loss. Such design optimization is not possible for isotropically distributed angles of incidence that are typical of conventional non-imaging homogenizers.

In summary, embodiments of type two with secondary reflectors in the form of shallow prismatic windows 11 have the potential to yield 10% or more power than embodiments of type one, by eliminating light-insensitive gaps between cells 15. The full potential of prismatic windows 11 is preferably realized by use of a coupling medium between the back of the window 12 and the cell 15, so as to effectively eliminate dielectric boundary losses, and to eliminate light lost to total internal reflection at the exit face 12. Geometric constraints set by total internal reflection at the exit face 12 are given below.

Parallel binning of radially oriented cells 15 as described above has the potential to improve mispointing tolerance, however at present for multijunction cells the total current in each parallel group may be limited by the possibility of breakdown to around twenty amps or less. Thus for an embodiment as shown in FIG. 13a with twenty parallel groups, the total power may be limited to 1 kW. This corresponds to twenty radial groups each operating at a cell voltage of 2.5V and a current of 20 A. Thus a generator according to this embodiment would if so limited be unsuitable for use with a primary reflector 1 of collecting area larger than 3 m$^2$, assuming 33% overall conversion efficiency. Larger reflector areas may be accommodated with the embodiment of FIG. 13a if future manufacturing improvements increase the current limitation for cell breakdown. Alternatively, a higher power generator 4 may be built by using a larger number of narrower radial spokes.

Embodiments of Type Three

Figure 7:
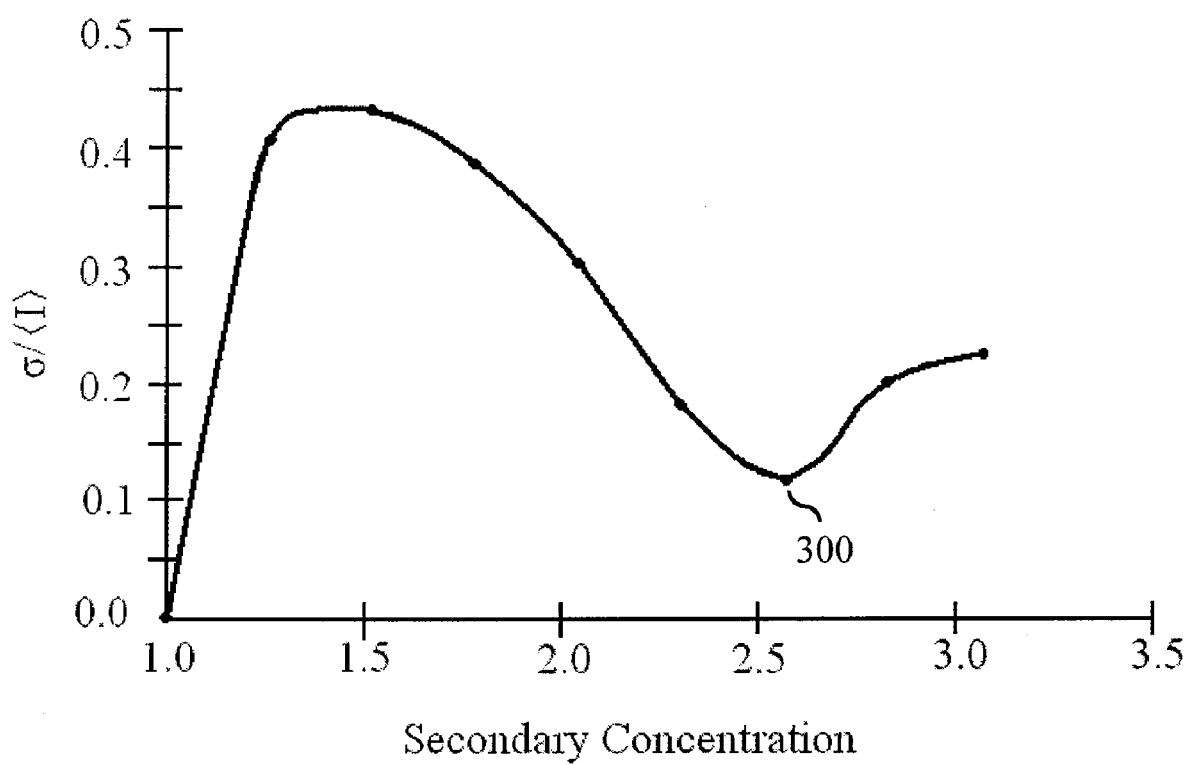
FIG. 7 is a plot illustrating the normalized standard deviation of cell illumination as a function of concentration, for secondary reflectors of different depth as illustrated in FIGS. 5a, 5b, 5c, 5d and 5e and FIGS. 6a, 6b, 6c, 6d and 6e.

Embodiments of this type, highly preferred for use with square paraboloidal primary reflectors 1, incorporate approximately square secondary reflectors as illustrated in FIG. 5d and FIG. 6d, optimized for uniformity of concentration on square cells 15 and operating near the point of highest uniformity 300 as shown in FIG. 7. Secondary reflectors to fit the image at the receiving surface of a square primary reflector 1 are preferably laid out in accordance with an n-by-n square tiling pattern that yields equal power at each tile, such as the tiling pattern illustrated in Figure 10b.

Figure 21:
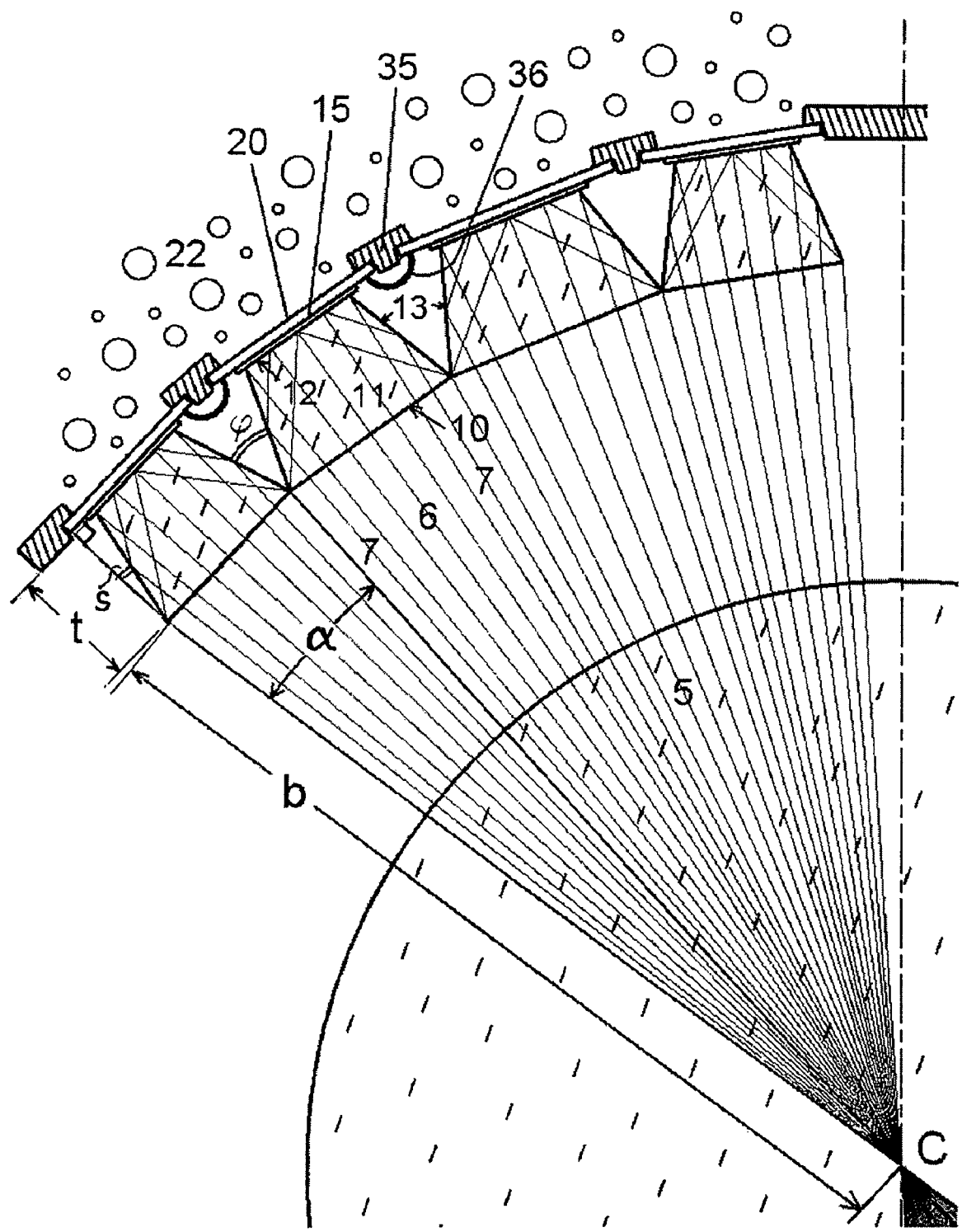
FIG. 21 is a cross-sectional view showing secondary reflectors within the preferred embodiment of FIG. 5d and FIG. 6d, with rays showing uniform photovoltaic cell illumination, and a composite structure supporting the photovoltaic cells.

The essential feature of this embodiment is illustrated by FIG. 21, showing an implementation with secondary reflectors in the form of deep prismatic windows 11. The reflection geometry is chosen so the edge-reflected light covers essentially the full area of a photovoltaic cell 15. This is accomplished by a substantial increase in the thickness of the windows 11 combined with appropriate choice of the side slope angles 13, such that the reflection 7 from each of the four edges of the prismatic window 11 reaches to the center of the exit face 12 of the window 11. The result is relatively high uniformity, and an exit face 12 of the window 11 that is somewhat more than half the dimension of the entrance face 10 of the window 11, and a concentration increase of a factor of approximately three. In the illustration of FIG. 21, the cells 15 are mounted on ceramic substrates 20 in a supporting skeletal framework 35 and cooled by boiling liquid 22.

Figure 22:
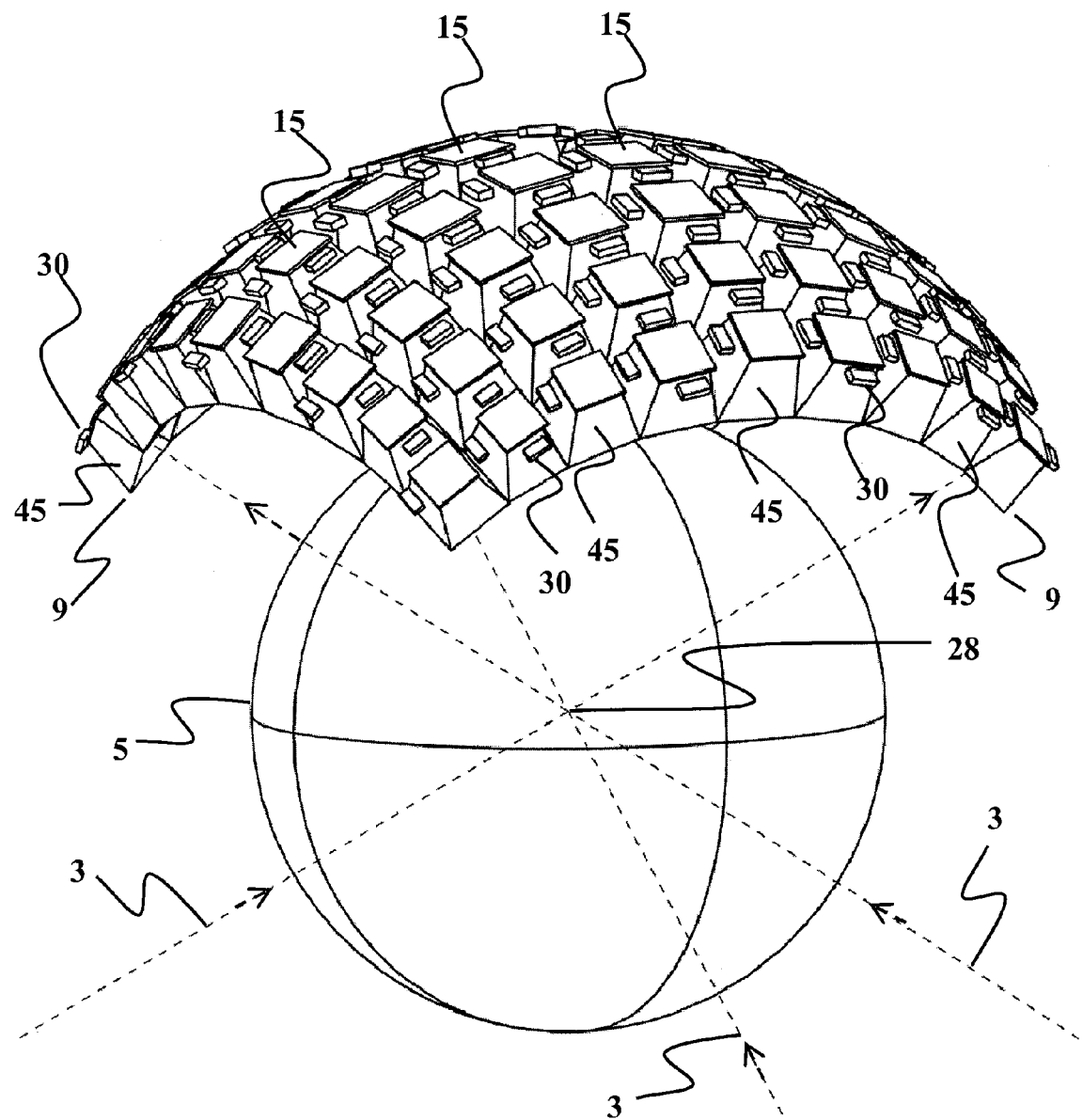
FIG. 22 is a perspective view showing only the optics, cells and bypass diodes of a generator according to FIG. 21.

The main optical and electrical elements of a highly preferred embodiment of a generator 4 according to this embodiment are shown in more detail in the perspective view of FIG. 22. This shows the ball lens 5, a multiplicity of square photovoltaic cells 15 placed behind approximately square secondary reflectors, here shown in the form of mirrored frames 45, and bypass diodes 30. All other structures are omitted in FIG. 22 for the sake of clarity. The secondary concentrating reflectors 45 set around the receiving surface 9 reflect rays of concentrated sunlight 3 to the photovoltaic cells 15. The photovoltaic cells 15 are positioned immediately behind the secondary concentrating reflectors 45, and convert the solar radiation 3 into electricity. The deep secondary reflectors required for uniformity open substantial gaps between adjacent photovoltaic cells 15 where, in this embodiment, bypass diodes 30 and interconnecting wiring are located in close proximity, without interference to either the optical input to the cells 15 or to their electrical and thermal outputs. The plurality of photovoltaic cells 15 are electrically connected together to combine the electrical power produced by each cell 15 into a total output of electricity from the generator 4. The secondary concentrating reflector outputs 46 are preferably configured to accept photovoltaic cells 15 that are flat, as in the illustrated example.

Figure 23:
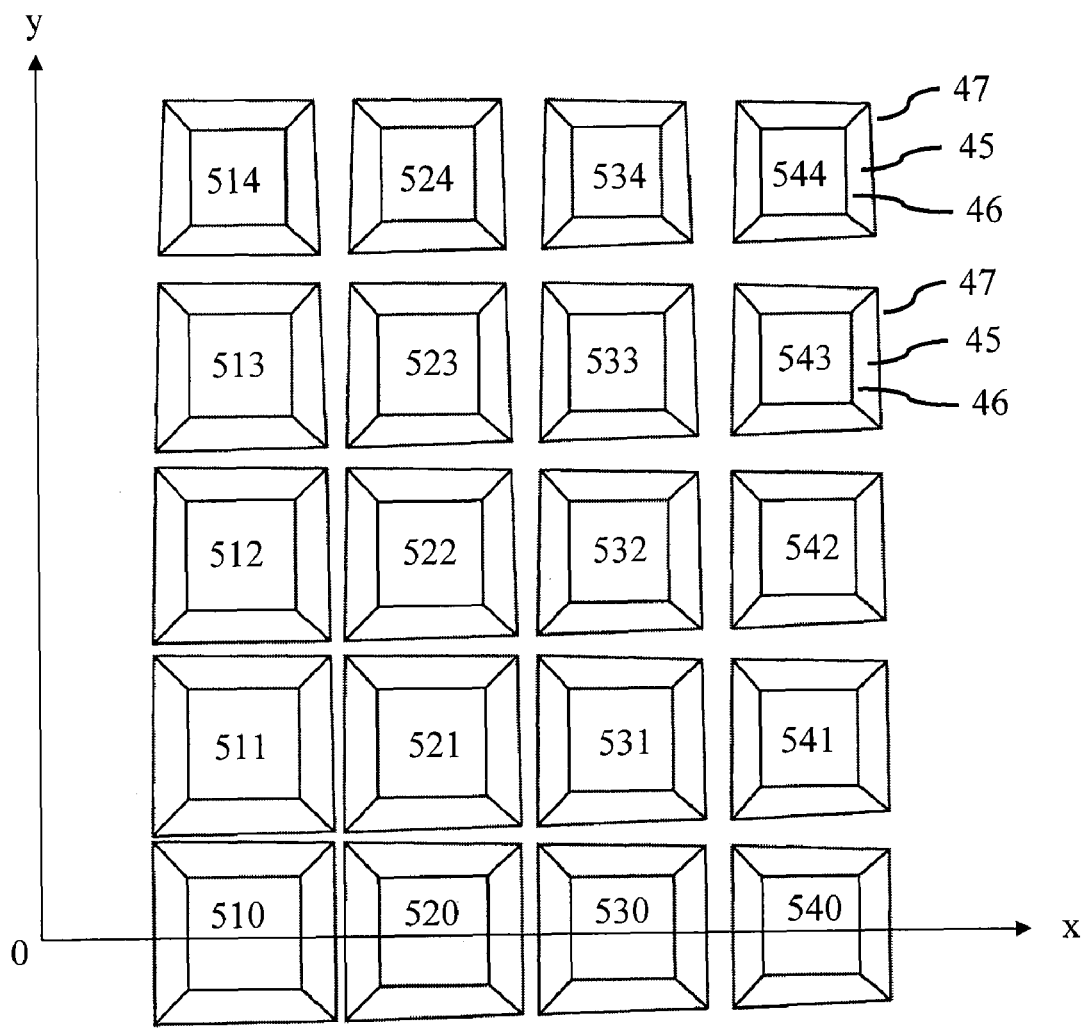
FIG. 23 is a plan view of a preferred set of secondary reflectors
Figure 24:
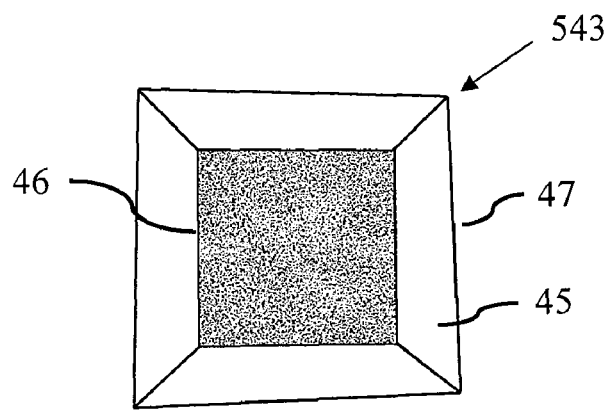
FIG. 24 is a plan view of one of the secondary reflectors of FIG. 23 in which the intensity of illumination exiting the base of the reflector is represented by dot density.

According to this invention the secondary reflectors 45 in a generator 4 to be used with a square paraboloidal reflector 1 are made with entrance apertures 47 shaped as the divisions of the receiving surface 9 illustrated in FIG. 10b, as the images formed by the ball lens 5 of identical squares projected on to the reflector. In this way the secondary reflector entrances 47 tile seamlessly the concave receiving surface 9, forming knife-edges between them, so all the light arriving at the surface 9 enters one or another of them. In such a tiling, the entrances 47 are approximately but not exactly square. Twenty different individual reflector types, four of each type, are needed for an assembly of eighty secondary reflectors in a 9×9 array (with the center one missing). FIG. 23 details in plan view the twenty different types. To illustrate most clearly their differences in size and their slight departures from square symmetry, in FIG. 23 the reflectors are drawn all to the same scale, as they would appear if separated and laid out turned face up, lying with the cells coplanar, and their centers on a regular square grid. (A complete set of eighty reflectors would be illustrated by clocking the set illustrated in FIG. 23 at intervals of ninety degrees about the origin marked O.) The reflectors 510 and 511 drawn at bottom left are nearest the optical axis, while an extreme diagonal reflector 544 is shown top right. The smaller squares shown centered within each reflector represent the exit apertures 46. These are preferably made exactly square, so as to match the square photovoltaically active area of the illuminated cells 15 set spaced very slightly behind the exit apertures 46. Each of the four mirrored surfaces of a secondary reflector will thus be slightly warped, to conform precisely to the slightly out of square upper boundary and exactly square lower boundary illustrated in FIG. 23. Because of this slight warping, the pattern of illumination delivered to the cell 15 will be slightly modified from the illustration of FIG. 6d. FIG. 24 illustrates a calculation of the output flux of secondary reflector 543, for on-axis illumination, where intensity is represented by dot density. The standard deviation of the output flux at the exit aperture 46 is calculated to be 16%, only slightly greater than the 13% standard deviation for the ideal case of square entrance and square exit, marked 300 in FIG. 7

Details of a Specific Embodiment of Type Three

Figure 25:
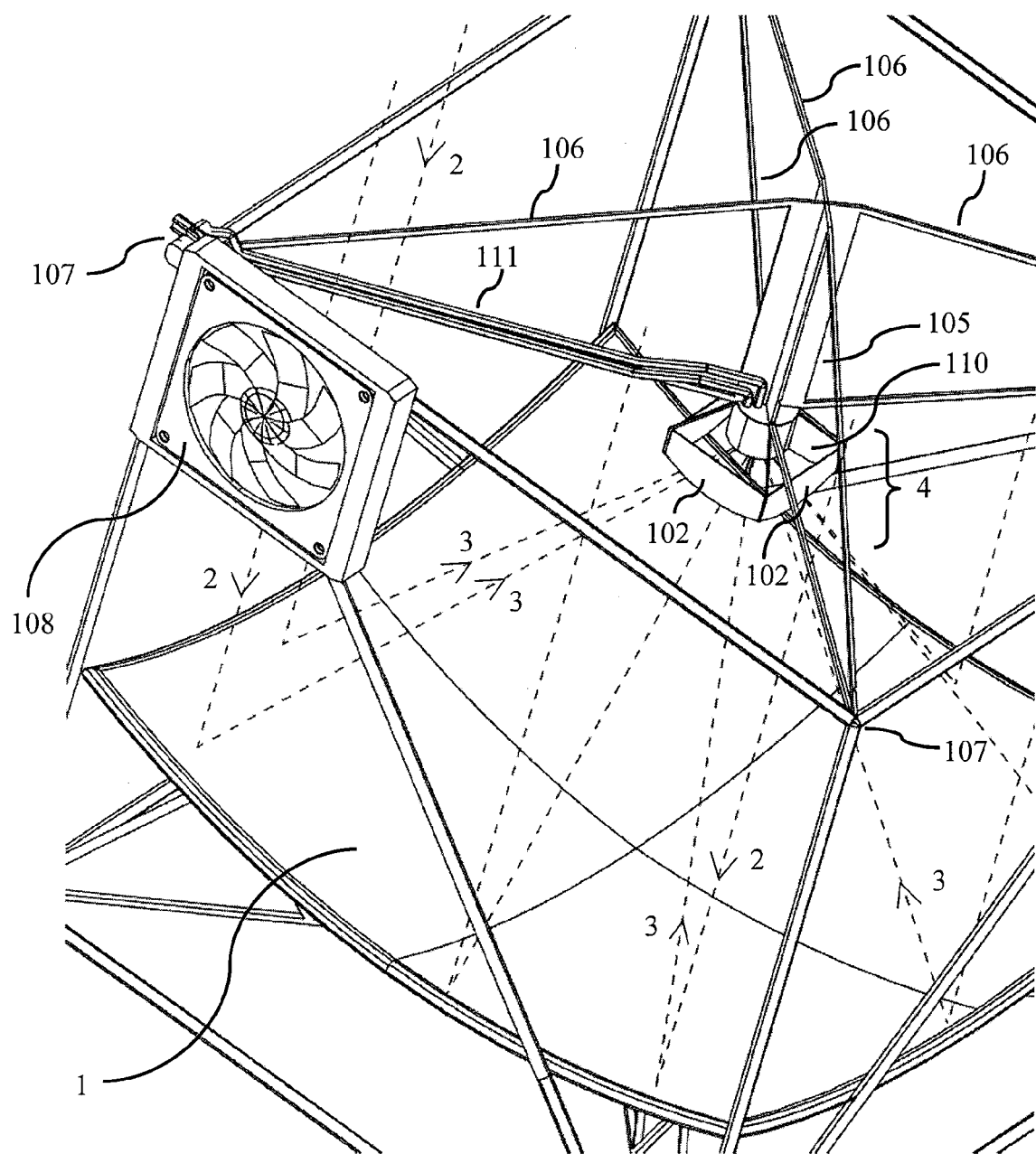
FIG. 25 is a perspective view of a preferred embodiment according to the present invention, showing the generator with a ball lens in use at the focus of a paraboloidal reflector and coolant structure.

The perspective views of FIG. 25 and FIG. 26 show the major structural components surrounding an embodiment according to FIG. 22. FIG. 25 shows a generator 4 positioned for operation near the focus of a square paraboloidal primary reflector 1. FIG. 26 details the generator 4 of FIG. 25 within a sealed enclosure 110, with some components shown in section for clarity. Light rays 3 from the primary reflector 1 enter the generator 4 through the window 101 into a sealed cavity 110, where the main elements of the generator 4, the ball lens 5, secondary concentrating reflectors 45, and solar cells 15 are located. The purpose of the entrance window 101 is to protect the surface of the ball lens 5 against soiling by contaminants, which could be dissociated or ignited by the highly concentrated sunlight incident on the ball 5. The entrance window 101 is positioned at a distance of between $\frac{1}{10}$ and $\frac{1}{3}$ of the paraboloid focal length away from the center of the ball 5, so the concentration of sunlight at the window surface is in the range 10-100. Taking advantage of the protection afforded by the sealed enclosure 110, the ball 5 and the inside surface of the entrance window 101 are preferably coated with antireflection coatings of the tapered index type. Such coatings are highly efficient over the full solar spectrum, but fragile and if exposed would be damaged by volatiles and repeated cleaning. In a protected environment such as that illustrated in FIG. 26, the coatings will remain clean, and will limit reflective losses averaged across the solar spectrum to about 1% for each of the three internal surfaces encountered by a ray 3 traversing the window 101 and the ball lens 5.

The outer surface of the window 101 is preferably coated with a robust antireflection coating of hard dielectric material, to withstand repeated cleanings. The window 101 is preferably made of a low loss glass such as Schott B270. With these provisions, the transmission through the window 101 alone may be expected to be about 97%, and the window 101 and ball lens 5 together about 94%. The window 101 is made preferably with a hyperboloidal figure so that the solar energy reflected by the window 101, amounting to around 3% of the total delivered to the generator 4, is directed to a focus in the vicinity of the vertex of the primary reflector 1. An extension of the generator 4 with additional photovoltaic cells 15 is then located near the vertex to make additional electricity from this light.

Figure 16G:
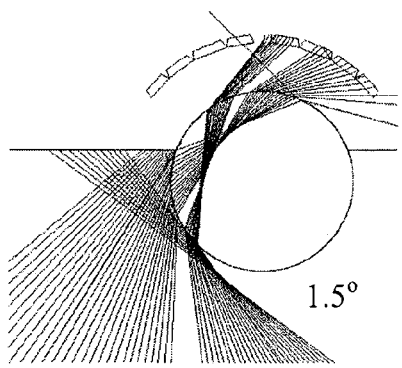
FIG. 16g is a ray diagram illustrating the paths of rays to a receiving surface with a larger mispointing angle than the mispointing angle shown in FIG. 16f.
Figure 16H:
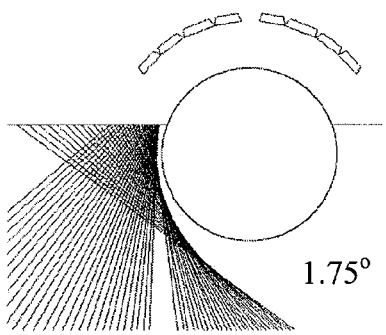
FIG. 16h is a ray diagram illustrating the paths of rays to a receiving surface with a larger mispointing angle than the mispointing angle shown in FIG. 16g.

The entrance window 101 preferably has a square perimeter shape as shown in FIG. 26, large enough so as not to block on-axis or off-axis rays 3 that could otherwise contribute to the generator output. Preferably a second window 109 is included in the sun-facing side of the sealed enclosure, surrounding the generator 4, to allowing for incoming sunlight rays 2 to pass close by the generator 4, on their path to the primary reflector 1. The structure of the sealed enclosure 110 includes substantially square side walls 102 that link the two windows 109 and 101, whitened to prevent overheating at any tracker orientation to the sun. The side walls 102 of the enclosure 110 are preferably thin and in line with the optical axis, to minimize shadowing. The generator core elements shown in FIG. 22 are supported from a flange 103 above, and the side walls 102 are also supported by blades 104 from the flange 103. The flange 103 is preferably held from above from an axial compression tube 105, as shown in FIG. 25. In this example, the compression tube 105 is held by tensioned thin vanes 106 from support points 107 outside the light path to the primary reflector 1. To minimize heating when concentrated sunlight from the primary reflector 1 is badly misdirected and passes to one side of the ball lens 5, as illustrated in FIG. 16g and FIG. 16f, the ball lens 5 is preferably supported by silvered, hollow, water-cooled struts 113 that register with a groove 112 cut into the ball around a line of latitude above its equator. In FIG. 25, liquid coolant is shown pumped along pipes 111 lying in the shadow of the tensioned struts 106 to carry all the heat from the generator away to a radiator 108 with forced convection, mounted outside the primary light path.

The secondary reflectors 45 in a preferred embodiment are made as mirrored frames, with a thin silver coating to increase the reflectivity of a reflecting substrate. This coating may be protected by a thin film of dielectric material such as silica or titania. The silver coating is preferably carried on a smooth substrate made preferably by replication from a mandrel with highly polished surfaces. The surfaces of the mandrel are preferably lapped and polished by stroking without rotation near the center of a warped lap. The surface across the x-y plane of the polishing lap is given preferably by the equation $z=k(x^2-y^2)$, with "k" appropriately chosen to give the right warp amplitude. A thin metallic replica of the mandrel made by electroforming may be transferred to a matching female flanged substrate by mating the two with glue in between. Typically the metallic replica will be only a few microns thick, and the glue thickness on the order of about ten microns, enough to accommodate dimensional errors in the substrate that cause a gap between it and the replica. When the glue is set, the substrate is removed with the replica attached. Both the glue and the substrate are preferably made of thermally conductive materials.

Figure 27:
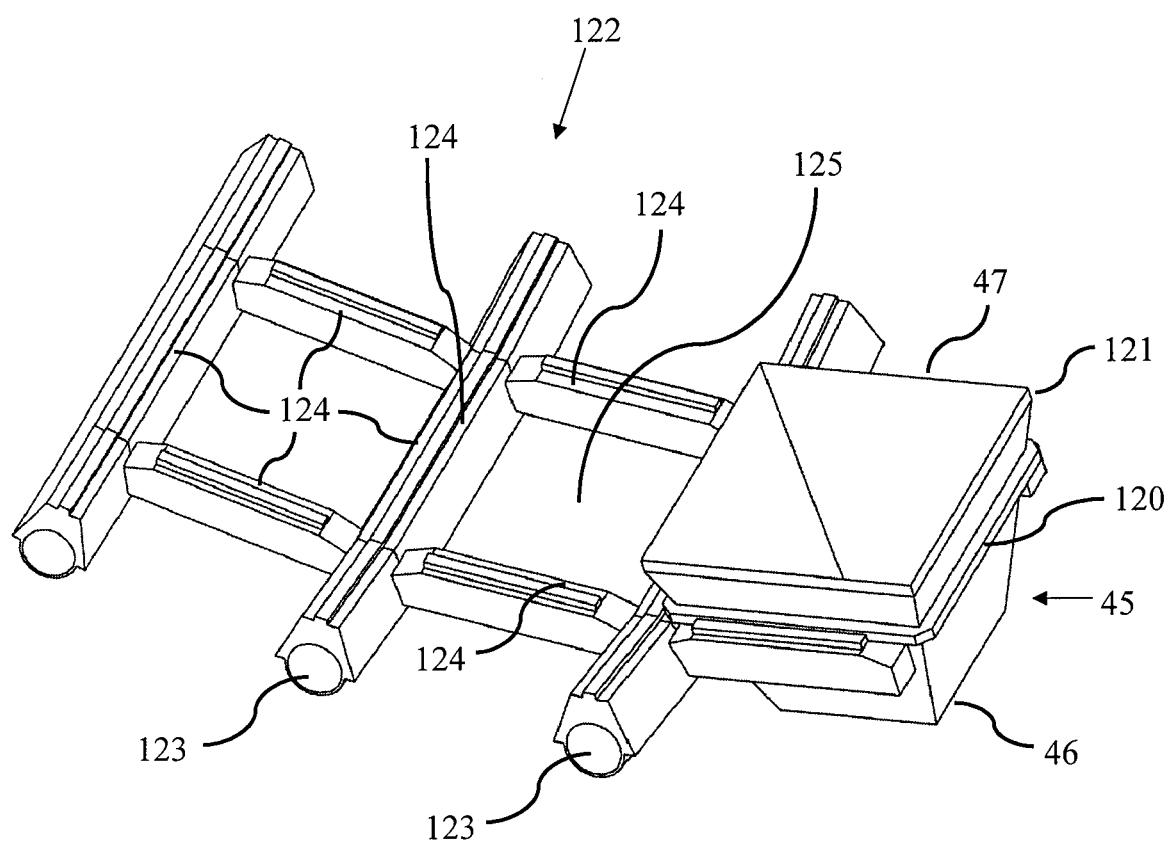
FIG. 27 is a perspective view of a mounted secondary reflector with a cutaway view of a section of the supporting cooled framework.
Figure 28:
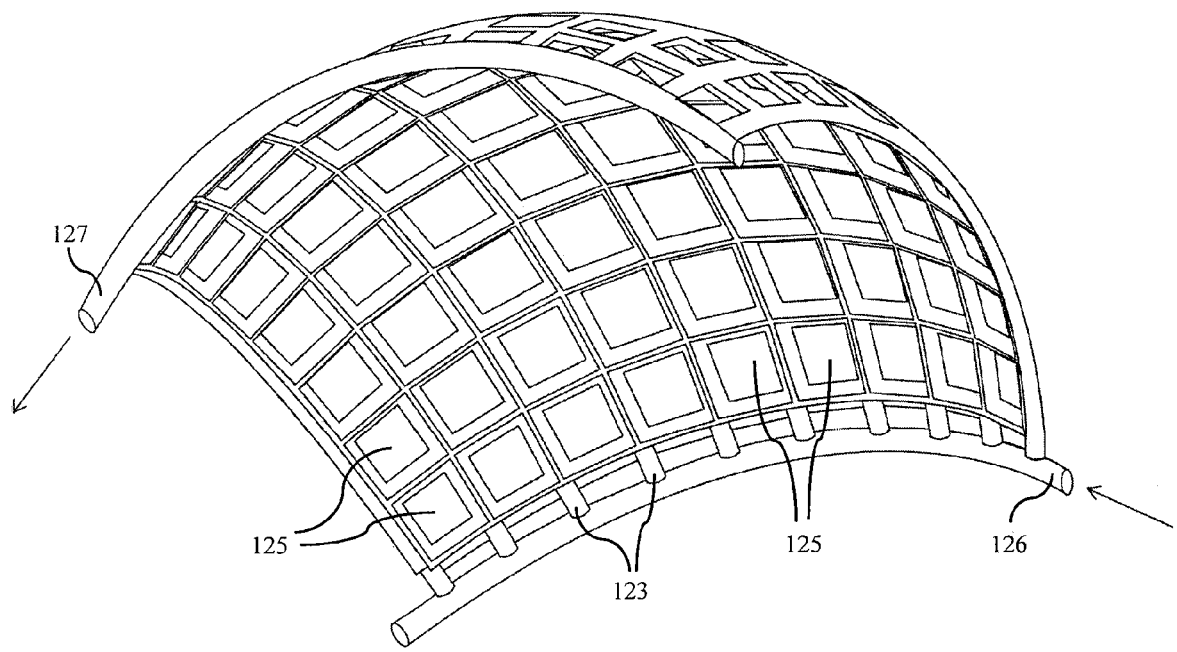
FIG. 28 is a perspective view of a complete framework to support secondary reflectors.

FIG. 27 is a perspective drawing detailing a secondary reflector 45 with a built in mounting flange 120. A full array of secondary reflectors 45 for a generator 4 is assembled from individual replicated secondary reflectors, which are installed into a concave framework 122 with cooling pipes 123. Heat from the solar flux absorbed by the secondary reflector 45 is conducted through the flange 120 and into the coolant pumped through the pipes 123. The reflector is made with a bevel 121 around the entrance aperture to allow adjacent reflectors to meet at a knife-edge, to avoid loss of light rays 7. A reflector 45 is made also with rounded edges around the exit aperture 46 to avoid electrical discharge between the reflector 45 and a cell 15 spaced closely behind. The flange 120 of a reflector 45 is made to register in a seat 124 made around an approximately square hole 125 in the supporting framework 122, with the aid of a thermal interface medium (TIM). The structure 122 to support and cool a concave array of secondary reflectors 45 for a generator 4 is illustrated in the perspective drawing of FIG. 28. Cooling liquid enters through pipe 126, which branches into the pipes 123 that pass by the secondary reflectors 45 mounted in the holes 125. Cooling fluid 22 is collected and exits through a pipe 127. The complete secondary reflector assembly will preferably be made as a structure that is separate from the full concave array of cooled cells, with the outputs 46 spaced less than 1 mm from the cells 15, and will be electrically insulated from the remainder of the generator 4 and operated at an electric potential equal to the average potential of the photovoltaic cells 15.

In an alternative implementation, the secondary reflectors 45 are made as prismatic windows 11 preferably of glass of very low absorption, thus avoiding heating by the light they transmit and reflect. Since glass is also electrically insulating, prismatic windows 11 with touching entrance faces 47 may be attached individually to faces of the cells 15 by index-matching bonding material. This approach has potentially higher throughput, but manufacture and assembly of prismatic windows 11 of highly transmissive refractive material with warped, polished sides could prove expensive. Also the index matching bond may not have long enough life at the desired high concentration level.

Notched Receiver Assemblies for Concave Tiling

Figure 29:
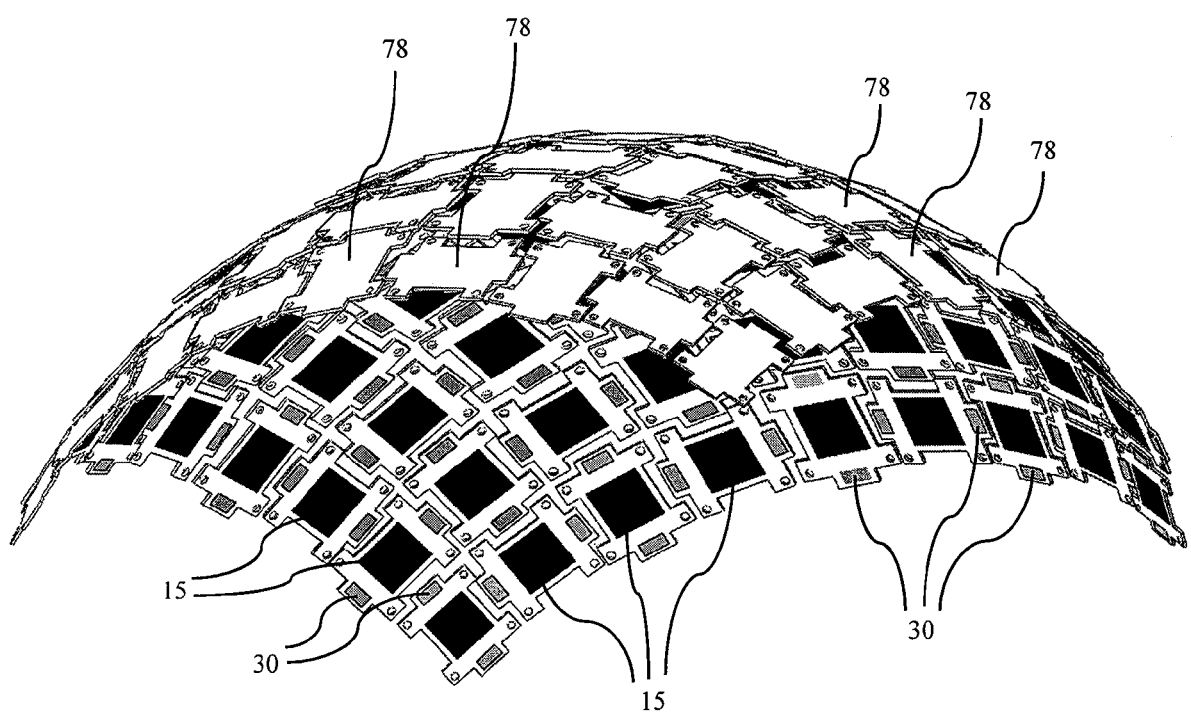
FIG. 29 is a perspective showing schematically an array of 80 receiver assemblies.
Figure 30:
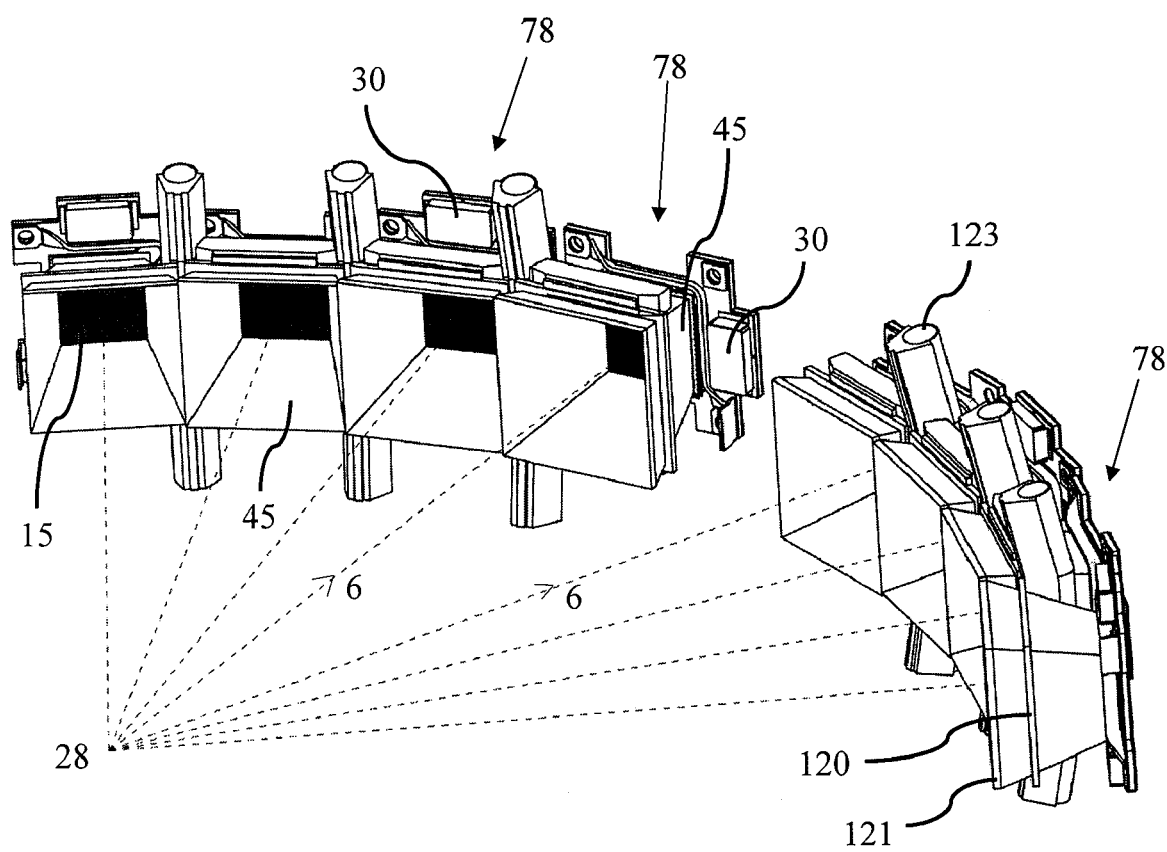
FIG. 30 is a perspective view showing a row of eight secondary reflectors and eight receiver assemblies in a row across the full width of the receiving surface.

A preferred embodiment of this third type takes advantage of the relatively wide gaps opened between photovoltaic cells 15 by the relatively deep secondary reflectors 45 to place the bypass diodes 30 adjacent to the cells 15, as illustrated in FIG. 22. The space is used to advantage in two ways. One is to increase the overall size of a cell 15 to improve its performance, by providing busbars 37 on all four sides and thereby minimizing the resistive losses internal to the cell 15 at high concentration, as described below. Another is to use the room to simplify electrical assembly, by use of small preassembled planar receiver assemblies 78, each carrying a cell 15 and up to two bypass diodes 30 beside the cell 15 and connected by a one-sided printed circuit. The individual receiver assemblies 78 are specially shaped with ears to carry bypass diodes 30, and notches to clear the ears of neighbors, so as to fit closely together in a full concave receiver array behind the concave array of secondary reflectors 45, as illustrated in FIG. 29. A perspective view of eight receiver assemblies 78 in place behind a row of eight secondary reflectors 45 across the full width of the receiving surface 9 is illustrated in FIG. 30. Details of a single receiver assembly 78 are shown in perspective in FIG. 31. A photovoltaic cell 15 and its adjacent bypass diodes 30 are carried on a simple, flat, thermally conductive one-sided circuit board 80, with the circuit formed in direct bond copper 17 and 18 on a ceramic substrate. The cell 15, the diodes 30 and the interconnecting link 85 are attached to the circuit board 80 by solder. Current from the cell busbars 37 is carried to the traces 18 by interconnects 19. A receiver assembly 78 for this embodiment of the invention preferably incorporates a number of special features:

In order to fit together within the geometric constraints set by the secondary reflectors 45, each assembly 78 is made with an active area no more than 3 times the active area of the photovoltaic cell 15 it carries.

Assemblies 78 are provided with ears 81 to carry up to two bypass diodes 30 and notches 82 so they can fit closely together with their neighbors.

In order to fit together on the curved concave surface, receiver assemblies 78 are made with the same general shape but in different sizes like the cells 15 they carry.

Each assembly is made preferably with electrical connections available at all four corners 83 and 84, with diagonally opposite corners at the same potential. By choosing the appropriate two corners on each assembly 78, only very short connections of very low resistance are needed to make the series connection between photovoltaic cells 15, by linking one each of the corners 83 and 84 of one cell 15 to abutting corners of neighboring cells 15.

Each assembly 78 is provided with four mounting holes 86, one in each corner.

Figure 32:
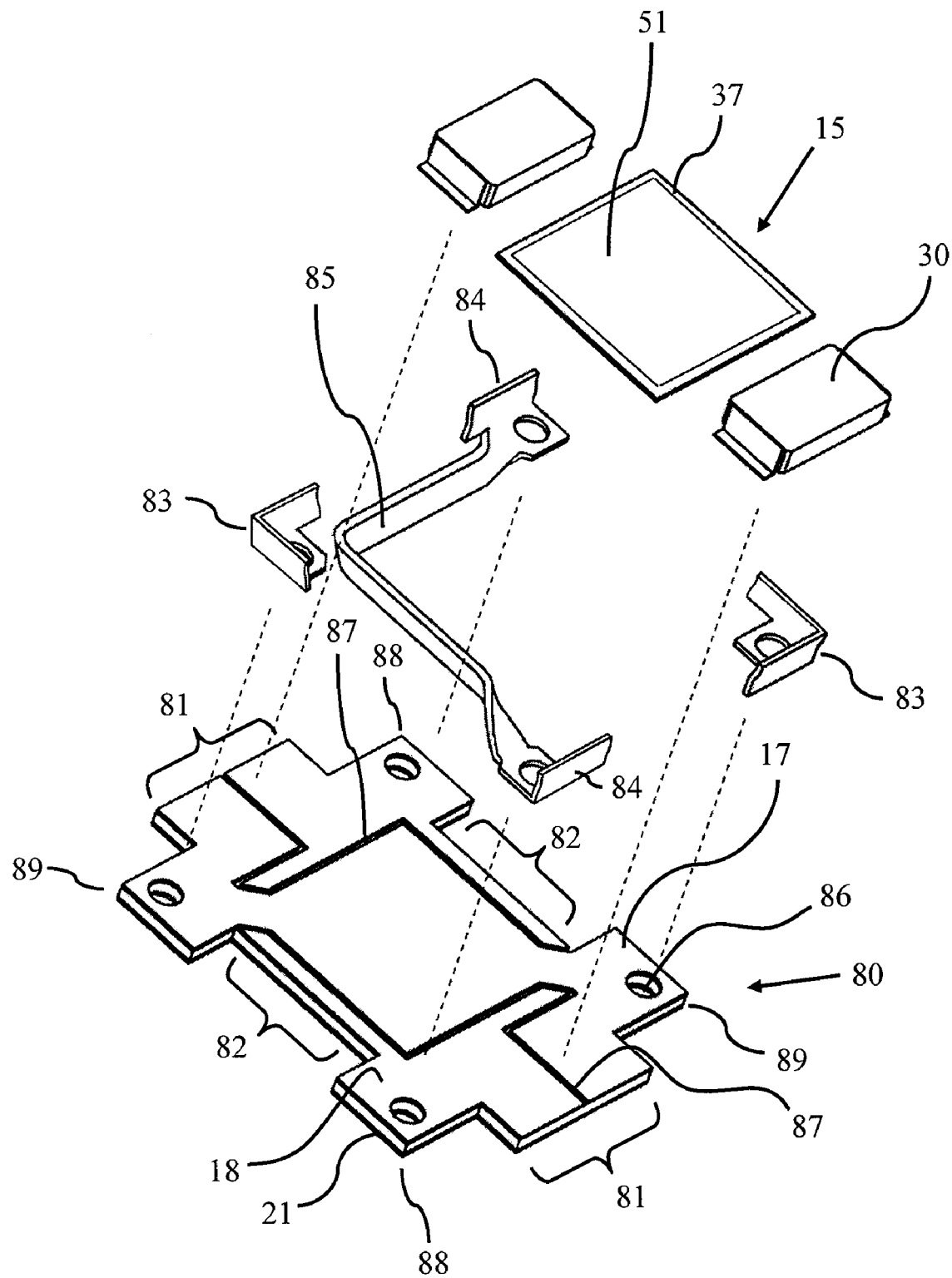
FIG. 32 is an exploded view of a receiver assembly.

Further details of a receiver assembly 78 and a manufacturing sequence may be understood with reference to the exploded view shown in FIG. 32. The lower level shows a circuit substrate 80, made of a ceramic such as alumina, aluminum nitride or beryllia, and faced on the circuit side with traces made in direct bond copper (DBC). The elements to be soldered to the traces are the concentrator photovoltaic cell 15 and bypass diodes 30, shown on the upper level, and the bridging provided by electrical connections 83, 84 and 88 shown on the middle level. The substrate 80 is shaped as a square with rectangular ears 81 protruding on two opposite sides and rectangular notches 82 cut into the other two sides. The ears 81 and notches 82 are configured so the substrates 80 fit together like jigsaw pieces in a concave checkerboard pattern, as illustrated in FIG. 29. The DBC copper trace 17 whose square center underlies the cell 15 extends into two opposite corners 89 of the substrate 80. Two etched dividing lines 87 separate electrically the cell base 17 pad from two L-shaped edge traces 18 that extend to the other two corners 88 of the substrate 80. The two L-shaped traces 18 largely surround the square cell base 17 and are electrically connected by a low resistance bridge 85 that is soldered at each end to connect the corners 88. Bypass diodes 30 are soldered to the substrate so as to bridge electrically the base 17 and L-shaped traces 18. Copper tabs 83 and 84 are soldered to the corners 89 and 88, respectively, to make the series connections between the photovoltaic cells 15. The positive and negative outputs of the photovoltaic cell 15 are both available at two diagonally opposite corners. Holes 86 are provided through all four corners of the substrate 80 and through the soldered electrical connections 83, 84 and 88, for mechanical attachment. Preferably all the elements of the receiver assembly 78 shown in the exploded view of FIG. 32 are soldered together in one heating cycle, preferably with silver/tin eutectic solder. The welded interconnections 19 are made subsequently between the cell busbar 37 and the L-shaped traces 18 to complete the receiver assembly 78.

Figure 33:
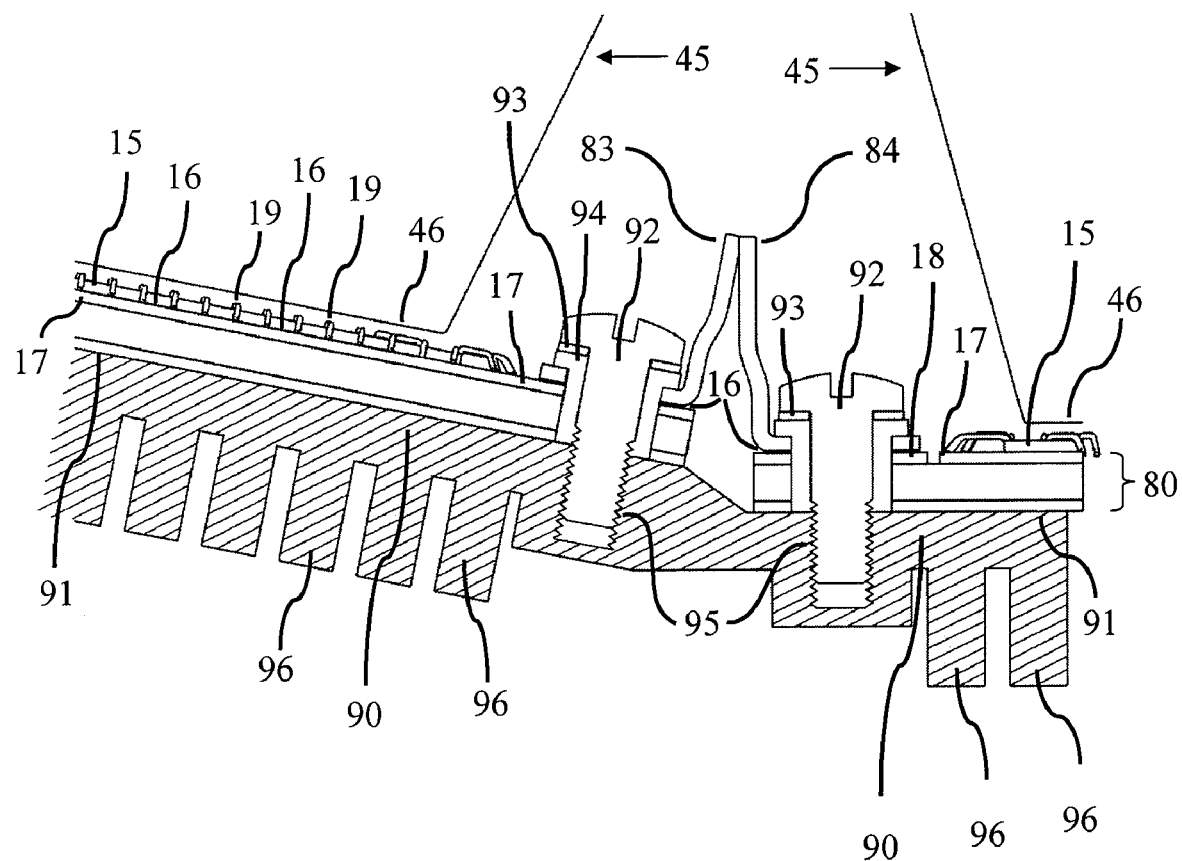
FIG. 33 is a cross section showing details of receiver assembly mounting.
Figure 34:
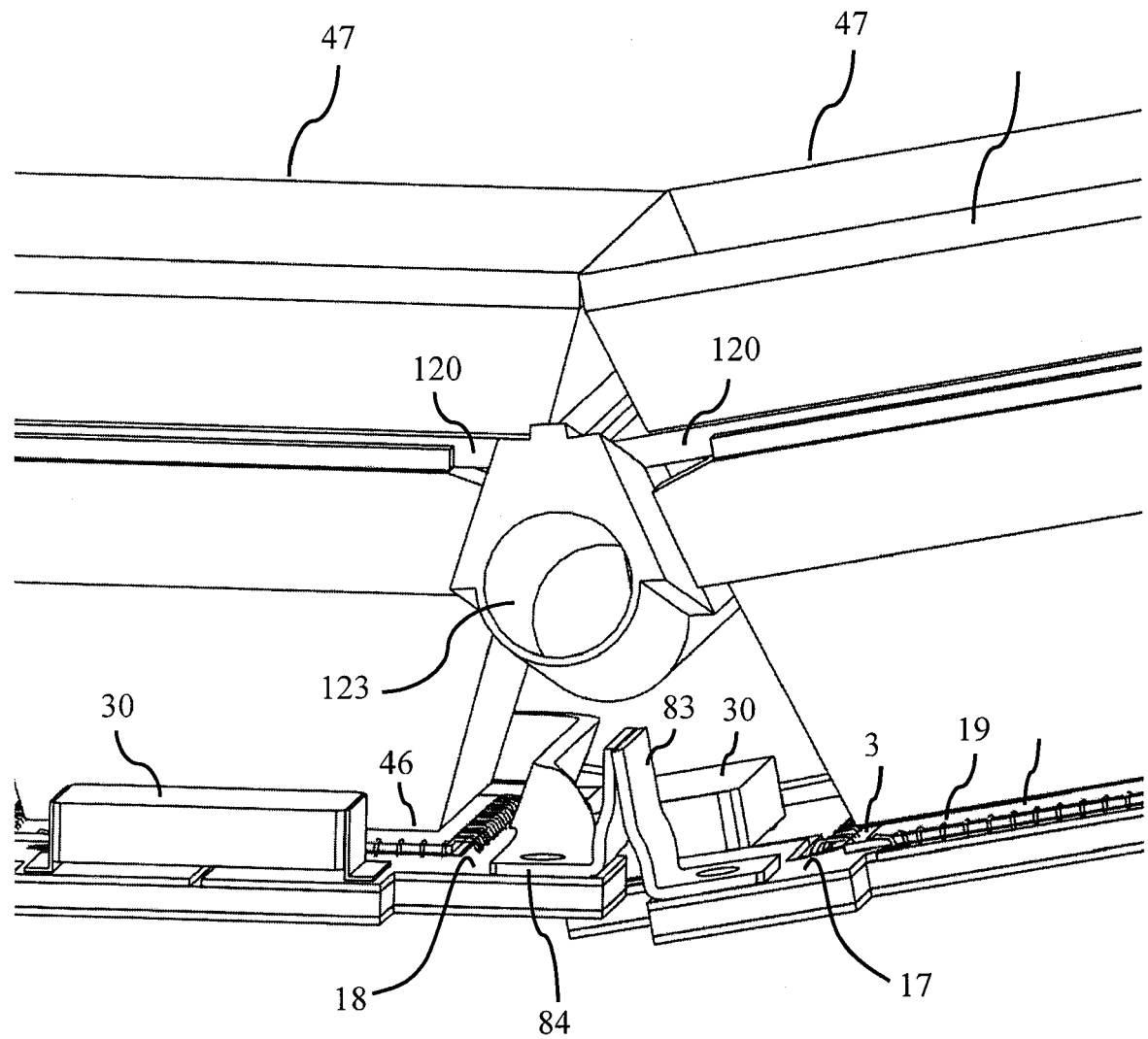
FIG. 34 is a perspective view showing details of secondary reflectors and receiver assemblies.
Figure 35:
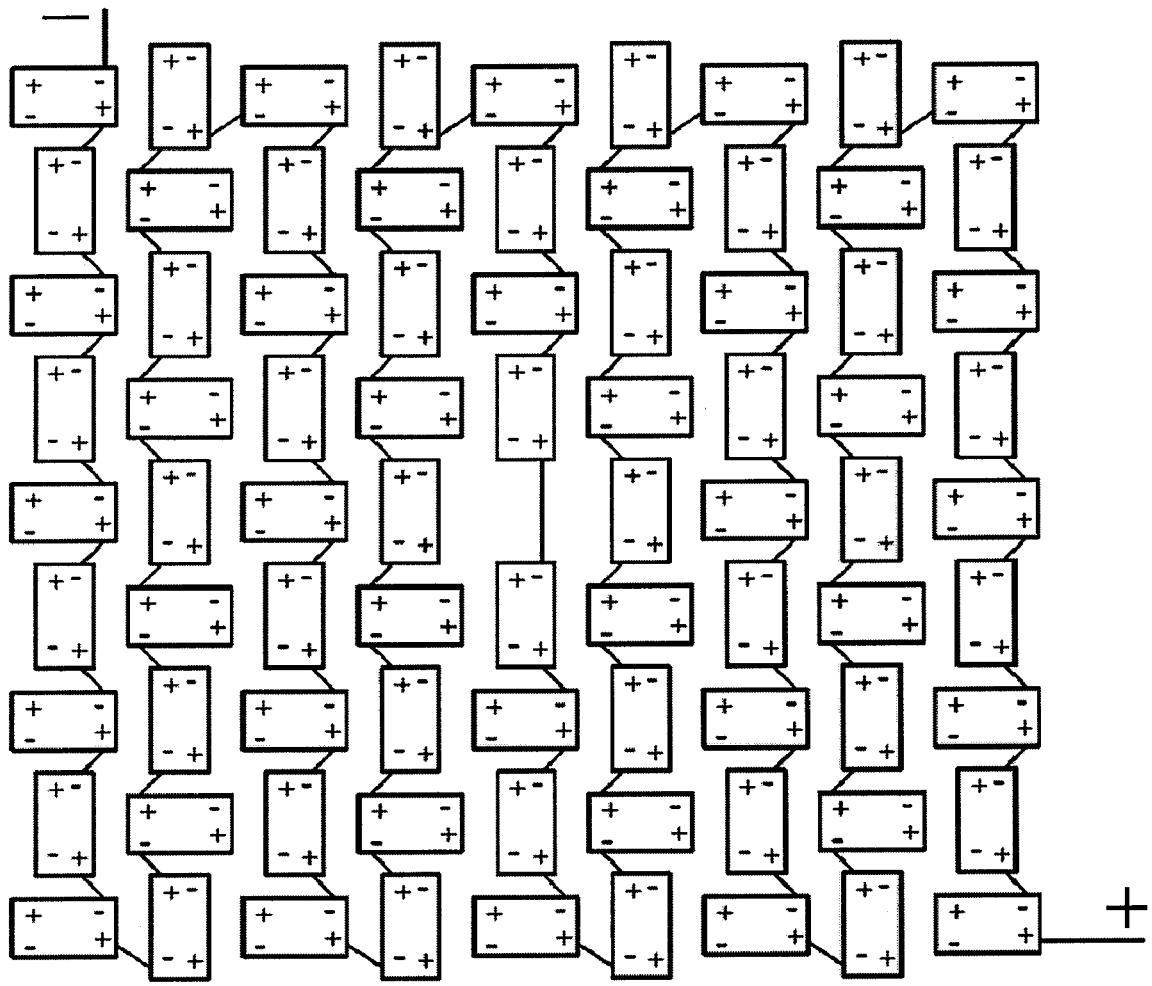
FIG. 35 is an electrical wiring diagram showing the series connection of 80 receiver assemblies.

Details of the attachment of the receiver assemblies 78 to a faceted copper cup 90, and of the electrical series interconnection between two assemblies 78, are shown in cross section in FIG. 33 and in perspective view in FIG. 34. Each receiver assembly 78 is fastened to a supporting faceted concave copper cup 90 by screws 92 passing through the corner holes 86 and into blind tapped holes 95. In order for heat to be conducted across the gap between the substrate 80 and the cup 90, the gap is filled with a thermal interface medium (TIM) 91 such as silver loaded grease. The screws 92 apply axial compression on the receiver assembly 78 and the TIM 91 through washers 93 and a compliant elastomeric material, or through some other elastic element, such as a Belville washer. Elastomeric grommets 94 serve to constrain the receiver assembly 78 to remain centered against repeated thermal cycling, which causes lateral shearing motion between the receiver assembly 78 of low thermal expansion coefficient and the copper cup 90 with higher expansion coefficient. Once the receiver assemblies 78 are screwed down, the series connections between adjacent receiver assemblies 78 are made by solder between a pair of tabs 83 and 84. The bent shape of the soldered tabs 83 and 84 provides resistance to fatigue from differential expansion between adjacent receiver cards. FIG. 35 is a schematic wiring diagram showing how a series connection of eighty receiver assemblies 78 may be made simply by soldering adjacent tabs (with the addition of one wire across the missing center assembly).

Figure 36:
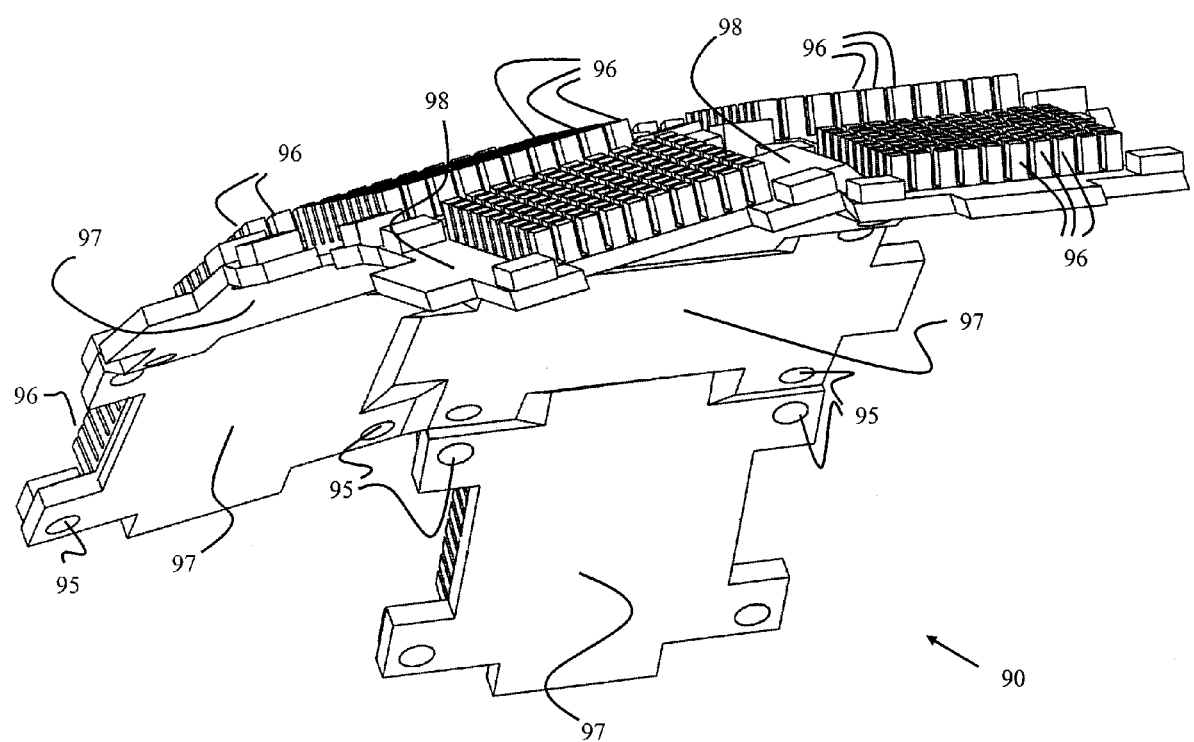
FIG. 36 is a perspective view of a section showing some facets of a monolithic copper cup to support receiver assemblies.

The concave copper bowl 90 to which the receiver assemblies 78 are attached is preferably fabricated with flat facets 97, shaped to receive the individual assemblies 78, as shown in FIG. 36. The facets 97 are each provided with four blind tapped holes to receive the receiver attachment screws 92, holding the receiver assemblies 78 in the right orientation and position to receive the concentrated flux delivered from the exit apertures 46 of the secondary reflectors 45. A preferred method for cooling the bowl 90 in this embodiment is by heat transfer to liquid 22 circulated by a pump to a radiator 108 as illustrated in FIG. 25. To enhance thermal coupling from the copper, the area of the contacting surface immediately behind the photovoltaic cells 15 is increased by forming it into closely spaced features such as fins or pins, in the manner of a heat sink, and the cooling liquid 22 is forced to flow through these features.

Tolerance to Mispointing

For a given primary reflector 1 and a given concentration at the photovoltaic cells 15, the tolerance to mispointing or in general to misdirected rays 3 from the primary reflector 1 may be at least as good for generator embodiments of this third type with deep secondary reflectors 45 and unbinned cells as for embodiments with shallow secondary reflectors 45 and radially binned cells (second type).

Figure 37A:
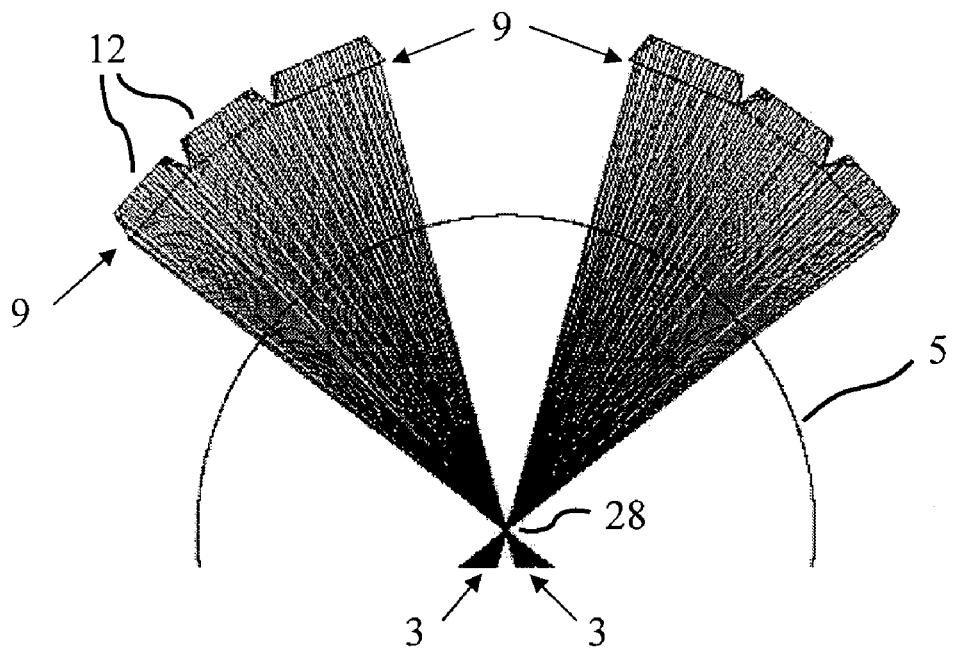
FIG. 37a is a schematic diagram illustrating the geometry of reflection by thin secondary reflectors for on-axis illumination.
Figure 37C:
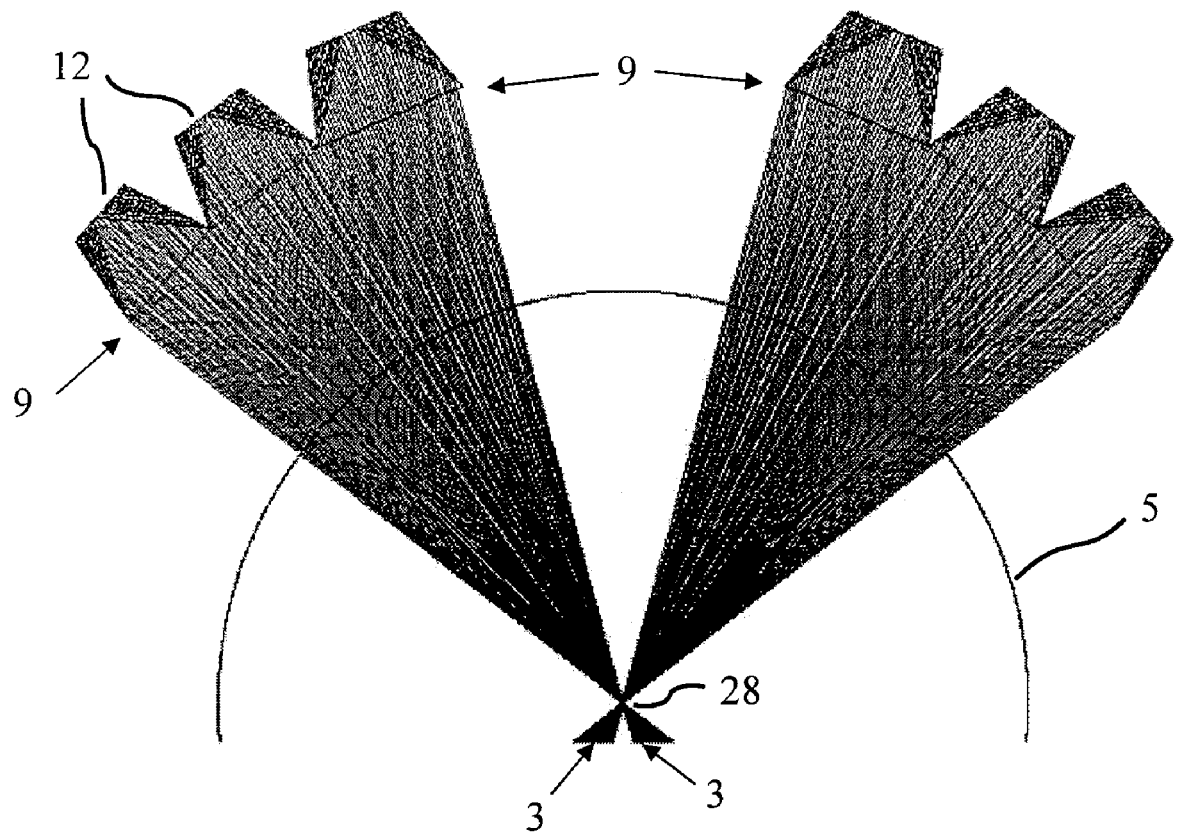
FIG. 37c is a schematic diagram illustrating the geometry of reflection by thick secondary reflectors for on-axis illumination.
Figure 37B:
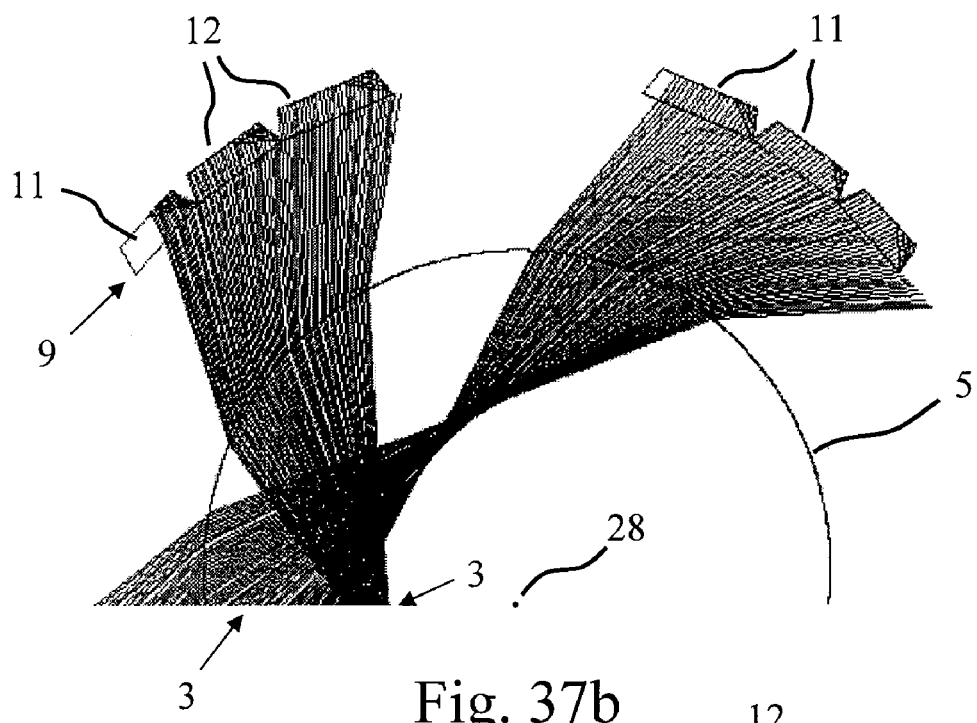
FIG. 37b is a schematic diagram illustrating the geometry of reflection by thin secondary reflectors for off-axis illumination.
Figure 37D:
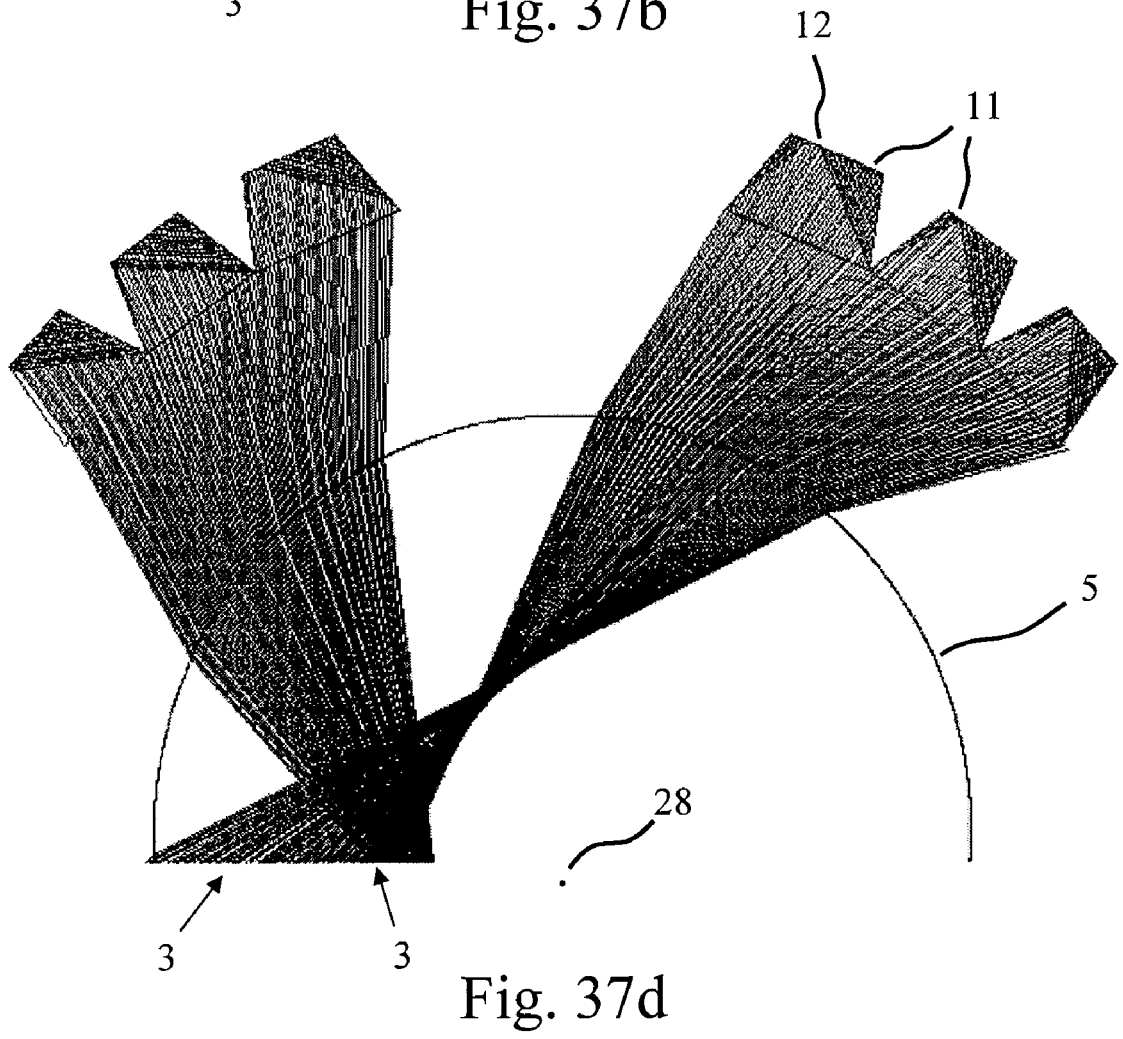
FIG. 37d is a schematic diagram illustrating the geometry of reflection by thick secondary reflectors for off-axis illumination.

The two types are compared in the ray diagrams of FIG. 37a, FIG. 37b, FIG. 37c, and FIG. 37d. All are drawn to the same scale, with rays 3 from the same f/0.5 paraboloid 1. FIG. 37b and FIG. 37d represent light incident at the same off-axis angle and delivered to the same sized photovoltaic cells 15 at approximately the same average concentration for rays from a given radial distance on the primary reflector 1. In the case of the deeper secondary reflectors 45 shown in FIG. 37c and FIG. 37d as deep prismatic windows 11, because concentration increase $C_2$ made by the secondary reflectors 11 is larger, the same overall system concentration is maintained by proportionately decreasing the concentration at the window entrance 10, achieved by increasing the radius of the ball lens 5.

The nature of the trade-off between these two strategies may be better appreciated by reference to FIG. 37a, FIG. 37b, FIG. 37c, and FIG. 37d. For the same total concentration at the photovoltaic cells 15, the system with the thicker windows 11 has a higher tolerance to mispointing because of the larger diameter ball lens 5—the critical angle $\theta_c$ is increased in proportion to the diameter of the ball lens 5. Thus in the illustration, the diameter of the ball lens 5 and $\theta_c$ for FIG. 37c and FIG. 37d are both 30% greater than for FIG. 37a and FIG. 37b, and $\theta_c$ is increased in proportion. The further advantages for thicker windows 11 already mentioned are the added room for connections between the photovoltaic cells 15 and high uniformity of concentration across the cells 15. However, this improved performance comes at the expense of a 30% larger and thus more expensive spherical ball lens 5.

Embodiments of Type Four

Figure 38A:
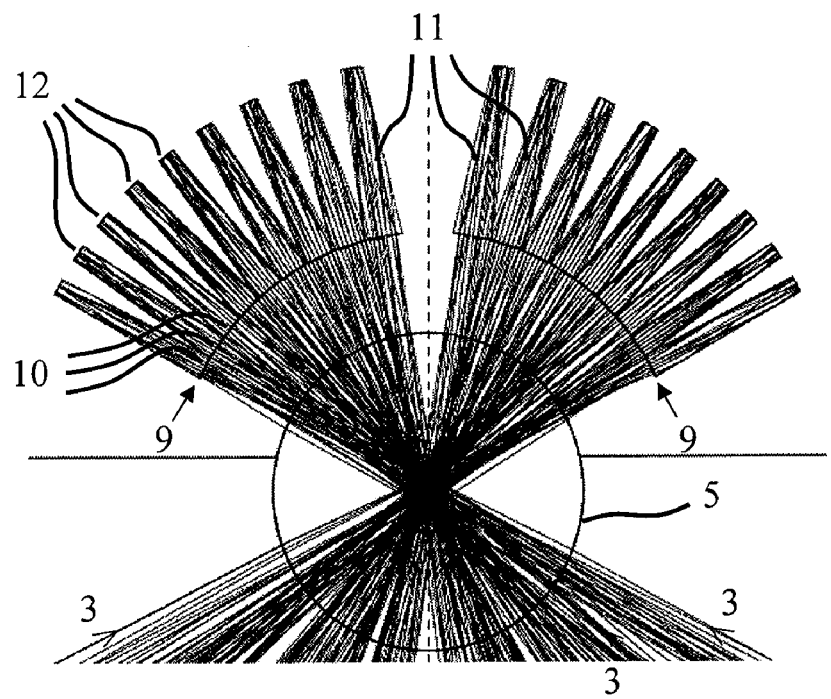
FIG. 38a is a schematic diagram illustrating an alternative embodiment with lightpipes with warped sides at the receiving surface for on-axis illumination.
Figure 38B:
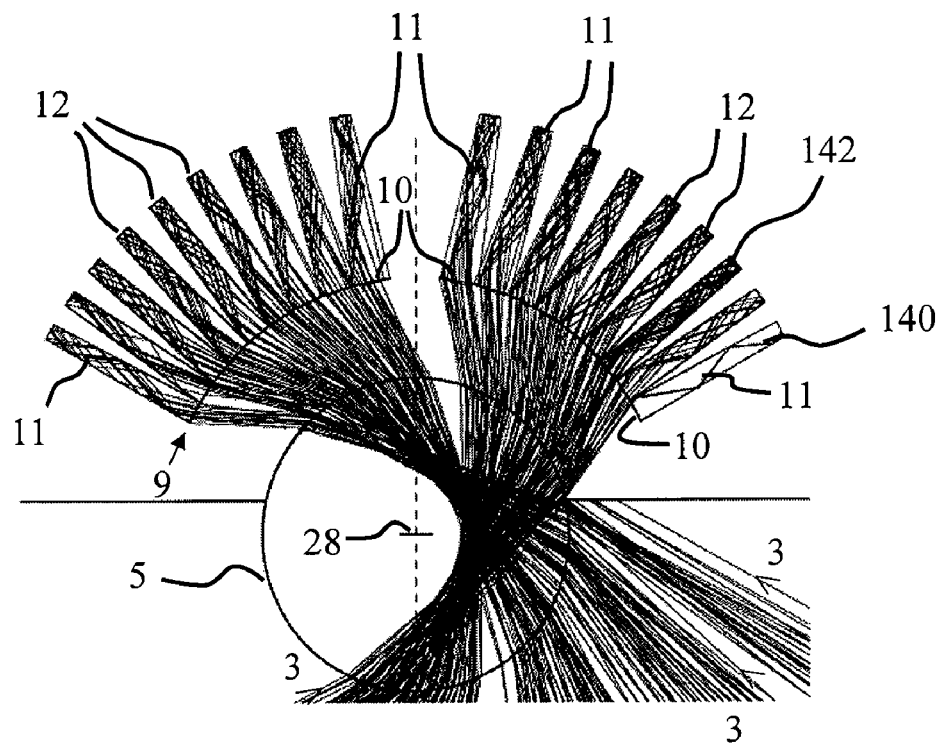
FIG. 38b is a schematic diagram illustrating an alternative embodiment with lightpipes with warped sides at the receiving surface in accordance with that shown in FIG. 38a, but for off-axis illumination.

In this alternative embodiment, a generator 4 is similar to the preferred embodiments with prismatic windows 11 as described above, except that the windows 11 coupling the receiving surface to the photovoltaic cells 15 are extended in thickness to become, in effect, lightpipes. FIG. 38a and FIG. 38b are ray diagrams showing the key optical elements of a generator 4, a ball lens 5, lightpipes 11, with rays 3 propagating through the lightpipes 11, mostly by multiple internal reflections. The lightpipes 11 reformat the already uniform light at the receiving surface 9. The light enters the lightpipes 11 through entrances 10 which have approximately trapezoidal or other polygonal shapes, as required to seamlessly tile the receiving surface 9. The light emerges through output windows 12 of rectangular or square shape. The outputs are tailored to match the photovoltaically sensitive area of rectangular cells 15 (not shown), which are located immediately behind the output windows 12. Preferably, the shapes of the entrance apertures 10 at the receiving surface 9 are formatted so that all pipes 11 receive the same power, which is then propagated to output apertures 12 all of the same size and shape. Preferably the output apertures 12 are square or rectangular, for convenience of manufacture and efficiency of the photovoltaic cells 15 which are placed in very close proximity to the output windows 12. Such reformatting requires the extended window 11 to be constructed with some of the sides warped. Extended lightpipes 11 with multiple reflections provide for adiabatic light propagation. The range of angles of incidence at the exit surface to the photovoltaic cell 15 is approximately equal to $\theta_s\sqrt{C}/n$ for the sun on-axis, and $(\theta_s + \theta_{off})\sqrt{C}/n$ for the sun off-axis. Here $\theta_s$ is the radius of the solar disc and $\theta_{off}$ the off-axis angle of the sun, and "n" is the refractive index of the lightpipe 11.

FIG. 38a and FIG. 38b represent an example of a design for a generator 4 that achieves a concentration of 1000 and for operation with a circular primary paraboloidal reflector 1 of very short focal length, f/0.4. The receiving surface 9 is divided into 336 equal power near-trapezoidal segments, corresponding to the tiling pattern shown in FIG. 9b. Longitudinal sections are shown taken through a generator 4 with elongated lightpipes 11 that reformat the light at the exit apertures 12 to illuminate identical square photovoltaic cells 15 (not shown, immediately behind 12) with uniform illumination. FIG. 38a shows details of rays 3 from an on-axis source propagating through the system. FIG. 38b is the same view but with incoming rays 3 from an off-axis source. The system is configured with a ball lens 5 that yields a critical mispointing angle $\theta_c=1.9°$, and the geometric concentration C from the combination of reimaging by the ball lens 5 and the lightpipes 11 is given by $C=C_1C_2=1180$. In these diagrams, the rays 3 entering the paraboloidal primary 1 of the system from the sun are modeled as coming from a uniform "top-hat" angular distribution extending off the sun-center direction to ¼° radius ($\theta_s$), and spatially distributed at random across the full area of the primary reflector 1. FIG. 38a is for on-axis illumination; and FIG. 38b is for an off-axis sun at an angle of 1°, or $0.53\theta_c$. In these figures, the intensity of light output from a lightpipe 11 is represented by the number of rays shown reflected down that lightpipe 11. For this example of a system having a very short focal length, the illumination in most lightpipes 11 is relatively unchanged for the off-axis illumination at somewhat more than 0.5 of the critical angle. Two specific lightpipes are identified for purposes of illustration in FIG. 38b with reference numerals 140 and 142. As shown in detail in FIG. 38b, the illumination is low for the lightpipe 140 at the extreme right hand side and the illumination is above normal for the lightpipe 142.

An advantage of this embodiment is that all the photovoltaic cells 15 may be made identical in size, and because of the length of the lightpipes 11, the photovoltaic cells 15 are well spaced, simplifying electrical and thermal issues in cell mounting. Another advantage is that uniform illumination of the cells 15 is ensured by the effect of multiple reflections on propagation down the lightpipes 11. In practice, because of their length compared to the secondary reflectors 45 in earlier embodiments, lightpipes 11 should be made from fused silica or glass of especially low solar absorption, to minimize power loss and overheating from absorption of the concentrated light.

The tiling geometry of FIG. 9b is only one example suitable for use with lightpipes 11. In an alternative embodiment, the non-uniformity illustrated in FIG. 37b may be largely mitigated by tiling the outer parts of the receiving surface 9 with lightpipes 11 whose entrance apertures are shaped in the form of narrow radial slices, deep enough in radius to accept off-axis rays of light both from the edge of the receiving surface 9 corresponding to lightpipe 140 in FIG. 38b, but also to accept light from the region of increased flux, as represented by lightpipe 142 in FIG. 38b. In this way the radial averaging to improve mispointing tolerance, accomplished by parallel connections of multiple cells 15 as illustrated in FIG. 17, is accomplished instead by radial averaging within a lightpipe 11. The output of the lightpipes 12 is reformatted to a more compact shape for the photovoltaic cell 15, and convenient for use of receiver assemblies 78, and with bypass diodes 30 in a ring located outside the perimeter of the illuminated receiving surface 9. Such tiling of the receiving surface 9 may be configured for generators 4 to work with square and hexagonal as well as circular primary reflectors 1.

Generator Design Principles

A generator 4 according to this invention may be designed for use with concentrated light delivered by any specified primary reflector 1. For optimum operation, it is necessary that the ball lens 5 within the generator 4 and the configuration of the photovoltaic cells 15 and secondary reflectors 45, if any, be chosen so that desired concentration is realized and the cells 15 conform to the image of the primary reflector 1 formed by the ball lens 5. Both the shape of the image and the distribution of energy across it must be matched. In this section, the relationships needed to optimize such matching are provided. The character of the concentrated light at the receiving surface for a given ball lens is related to the properties of the primary reflector. In addition, the relationships to optimize the secondary reflectors are explained.

Optimization and Design of a Ball Lens for Given Primary Reflector

Figure 44:
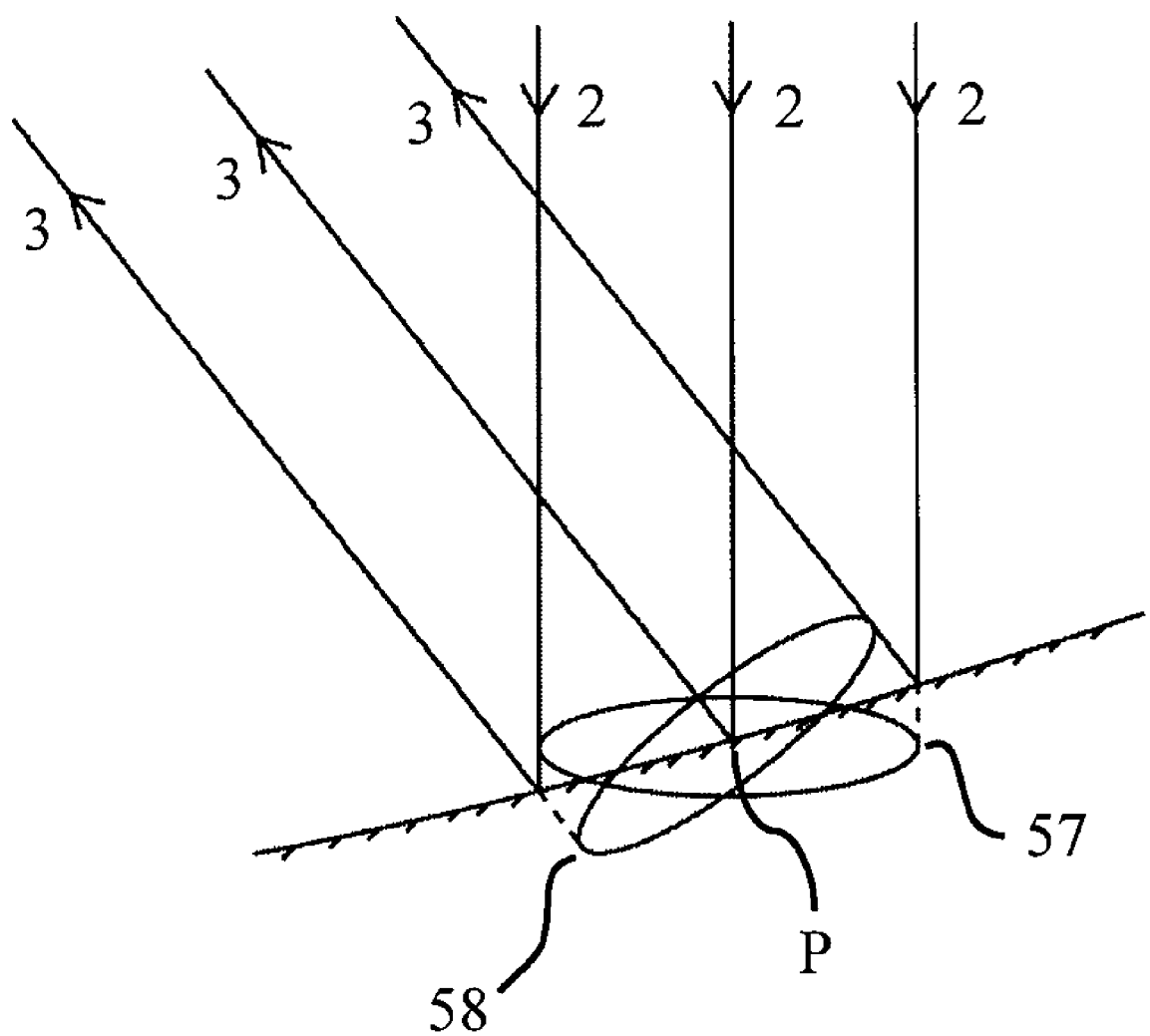
FIG. 44 is a ray diagram showing a detail of reflection at the primary reflector.

Because of the wide angle of imaging provided by the ball lens 5, the concentration variation with distance from the center of the receiving surface 9 is not constant with radius. At a given point on the receiving surface 9, the concentration may be calculated by consideration of FIG. 44, which shows a detail of reflection from a small region of the primary reflector 1 at radius r from the axis. On-axis solar rays 2 are incident at the reflector 1 and confined within the region 57 which is perpendicular to the axis, centered on point "P" of the reflector 1 and has projected area DA. Rays 2 are reflected toward the focus 28 as rays 3. Looking back from the focus 28, the rays appear to originate from the small area 58, which is the reflected image of the incident area 57. This image is centered also in the surface 9 at point "P," is normal to the rays 3 and has the same area DA as the area 57.

Referring to FIG. 8 and FIG. 11, the image of the area 57 formed by the ball lens 5 onto the receiving surface 9 is reduced in size by the distance ratio PC/CS, and thus has area dA equal to $DA\times(PC/CS)^2$. The concentration factor $C_1$ is given simply by $DA/dA=(PC/CS)^2$. From Pythagoras theorem, $PC^2=r^2+(F-r^2/4F)^2$, and $CS=b$ thus:

$$C_1 = \frac{r^2 + (F - r^2/4F)^2}{b^2} = \left(\frac{F}{b}\right)^2\left(1 + \frac{1}{2}\left(\frac{r}{F}\right)^2 + \frac{1}{16}\left(\frac{r}{F}\right)^4\right) \quad (9)$$

where "F" is the focal length of the paraboloid 1 and "b" is the radius of the receiving surface 9, which is concentric about the focus 28 of the paraboloid 1. It follows that the concentration is least at the center of the surface (r=0), where $C=(F/b)^2$. $F/b$ must be large to achieve high concentration at the receiving surface 9, for example, $C_{1center}=625$ for $F/b=25$. Note that since $r/F=2\tan(\theta/2)$ equation (9) may be rewritten as:

$$C_1 = \left(\frac{F}{b}\right)^2\left(1 + 2\left(\tan\frac{\theta}{2}\right)^2 + \left(\tan\frac{\theta}{2}\right)^4\right) \quad (10)$$

In principle, a generator 4 could be built with high concentration for use at the focus 28 of a long paraboloid 1 of large focal ratio f ($f=F/D\gg1$) by use of a spherical lens 5 of large radius. Such a system would yield close to uniform concentration over a substantially flat receiving surface 9. However, for a practical system, the diameter of the ball lens 5 is preferably as small as possible compared to the width or diameter of the paraboloid 1, to minimize the mass of the ball lens 5 and thus the specific cost of fused silica per unit solar collecting area for the system. Given that the ratio F/b is fixed by the desired concentration, the ratio of lens 5 diameter to paraboloid 1 diameter can be reduced only by using a paraboloid of small focal ratio $f=F/D$.

The requirement for small focal ratio drives the design of the generator 4 in two important ways. First there will be a significant difference in concentration across the receiving surface 9, since from equation (1) the ratio of edge to center concentration depends only on f, and is given by:

$$\frac{C_{1edge}}{C_{1center}} = 1 + \frac{1}{8f^2} + \frac{1}{256f^4}. \quad (11)$$

Edge-to-center concentration ratios are given for paraboloid focal ratios f/0.4–f/0.6 in Table 1. Second, because a fast paraboloid 1 as seen from its focus 28 subtends a wide angle, a field lens 5 must image over a wide field of view. This need is advantageously satisfied by the choice of imaging system employed in the present invention—a ball lens 5 focusing onto a deeply dished concentric spherical surface 9—because this imaging system provides a uniquely powerful imaging solution for paraboloidal primary collectors 1 with focal ratios as fast as f/0.4. Preferably the primary paraboloid reflector 1 will have a focal ratio in the range f/0.4 to f/0.6. The full field angle at the focus 28 is equal to $2\tan^{-1}\{1/(2f(1-1/16f^2)\}$, and is listed also in Table 1. In FIG. 3 and FIG. 4, the illustrated paraboloid 1 has focal ratio f/0.5, for which the concentration increases by a factor 1.56 from center to edge and the full field angle is 106°. Note that for paraboloidal primary reflectors 1 in some embodiments that are not circular, such as those shown in FIG. 1 and FIG. 25, the concentration ratio and field angle are not constant around the receiving surface perimeter, but are functions of azimuthal angle.

TABLE 1

| f | $C1_{edge}/C1_{center}$ | Full field angle |
|---|---|---|
| 0.4 | 1.93 | 128° |
| 0.5 | 1.56 | 106° |
| 0.6 | 1.38 | 90° |

Figure 39A:
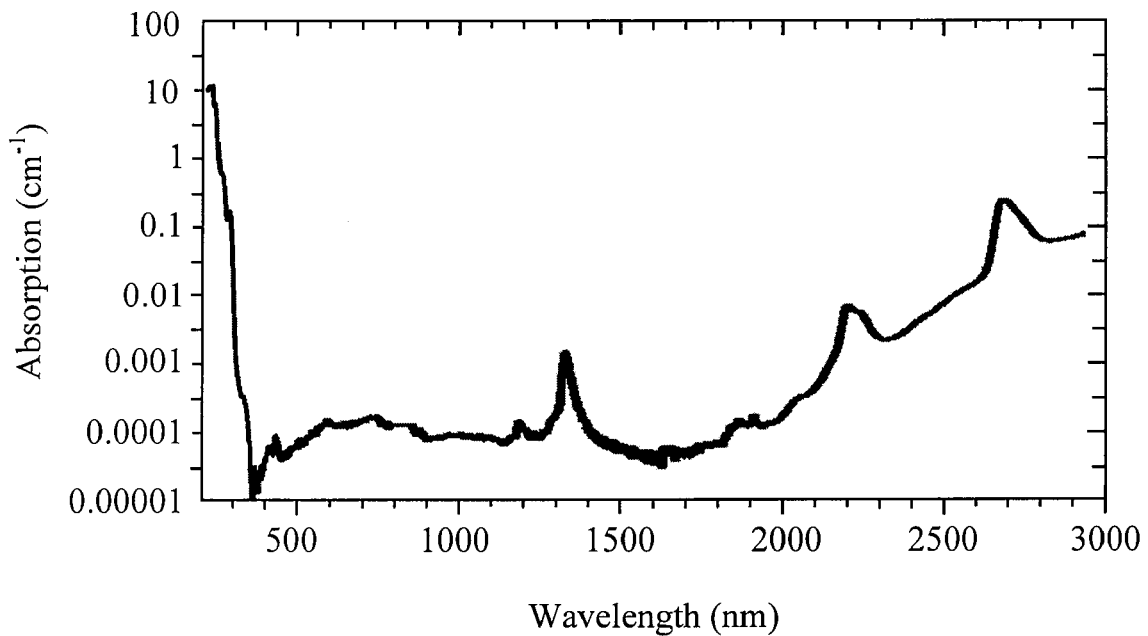
FIG. 39a is a graph showing the absorption of electrically fused quartz across the solar spectrum.
Figure 39B:
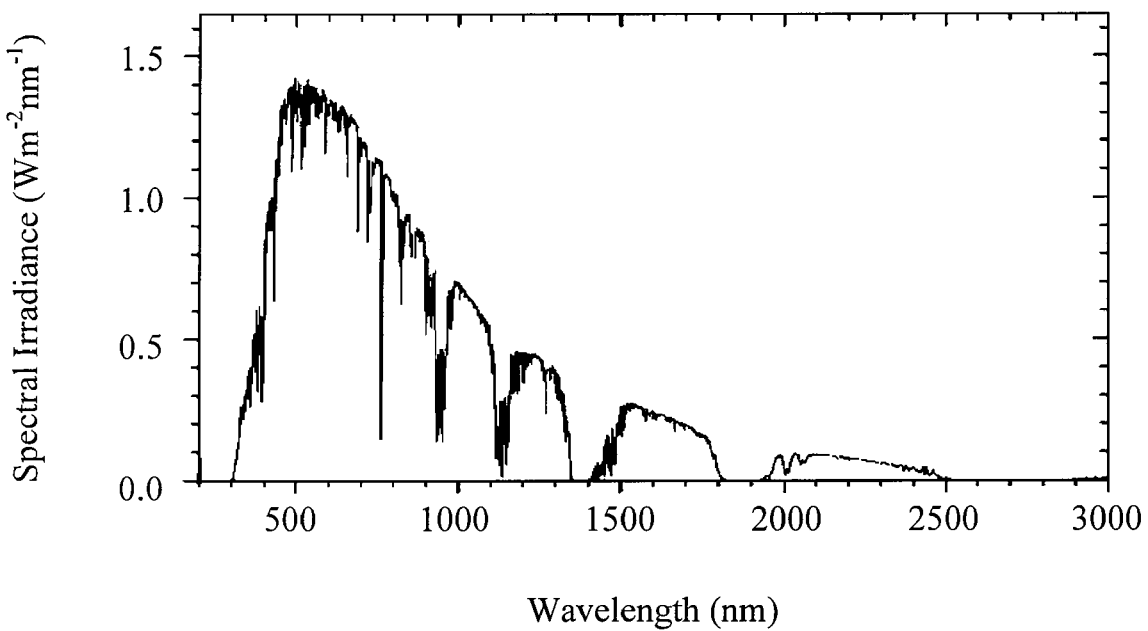

In order to minimize optical absorption in the ball field lens 5, the preferred refractive material used for the ball lens 5 is fused silica with low OH content, for example electrically fused natural quartz. FIG. 39b is a graph showing the spectral intensity of solar radiation after passage through earth's atmosphere. FIG. 39a is a graph depicting the absorption as a function of wavelength of electrically fused natural quartz. These two plots demonstrate that the absorption coefficient of electrically fused natural quartz is below $10^{-4}$/cm from the full range of sensitivity of multijunction cells 15 to solar radiation that is not blocked by atmospheric absorption. The absorption of this material is low enough across the full solar spectrum to avoid overheating of a ball lens 5 used in the preferred embodiments described herein. In addition to low absorption, fused quartz also has low chromatic dispersion, which is desirable to avoid chromatic differences in concentration that could otherwise reduce the efficiency of multijunction cells 15. Use of fused natural quartz is consistent with the essential goal of low overall costs, provided generators 4 are used with primary reflectors 1 of fast focal ratio and moderate aperture, when the mass of the ball lens 5, per unit input area of solar energy, is relatively small.

The refractive index of fused quartz varies across the solar spectrum from 1.470 at 400 nm wavelength to 1.444 at 1550 nm. Given this range, for a spherical ball lens 5 of silica, and for a spherically curved receiving surface 9 concentric with the ball lens 5, the preferred ratio of the radius, represented by the variable "b," to that of the ball lens 5, represented by the variable "a", is b/a=~1.546. This ratio optimizes the quality of the image of the primary paraboloid 1 at the concentric spherical receiving surface 9, when averaged over typical mispointing angles and wavelength.

As an illustrative example, consider optics for a generator 4 to be used with an f/0.5 paraboloid 1 with focal length "F." At a receiving surface 9 of radius b=F/25, the concentration increases from $C_{1center}$=625 to $C_{1edge}$=976, from equation (9). The optimum radius for imaging on the receiving surface 9 by a silica ball lens 5 is given by a=F/25/1.546=0.0129 D. A generator 4 for use with an f/0.5 circular primary reflector 1 of diameter 3 m, as an illustrative example, will require a ball lens 5 of diameter 78 mm for such concentration. The receiving surface 9 would have a radius of curvature 60 mm and a rim diameter of 96 mm. In practice, when secondary reflectors 45 are used, the concentration required at the receiving surface 9 will in general be less than that required at the photovoltaic cells 15, because of additional concentration $C_2$ provided by secondary reflectors 45.

Design, Optimization and Properties of Secondary Reflectors

The properties of any prismatic window 11 or mirrored frame 45 depend on its geometry and refractive index "n," and may be found in detail for any particular case and angle of mispointing by ray tracing. The following approximate analytical expressions are useful in developing the preferred design strategies for a given primary reflector 1 and for estimating the key characteristics of light concentrated by a mirrored frame 45 or prismatic window 11, such as the average concentration increase $C_2$ and the spatial variations of concentration on exit. They also serve to illuminate how mispointing tolerance depends on the desired concentration and the type of secondary reflector used.

FIG. 21 shows the geometry of on-axis rays 7 reflected at the edge of a prismatic window 11, whose edges are tilted off-perpendicular to the faces by a slope angle "s." The rays 7 pass through the center of the ball lens 5 and into a window or frame 11 at distance "b" and subtending angle "α" from the center of the ball 5. The exit face 12 is reduced in length compared to the entrance face 10 by a factor 1−2t·tan(s)/αb and the gap "g" between the active regions of adjacent cells 15 is given by:

$$g = 2t\cdot\tan(s + \alpha/2). \qquad (12)$$

The increase in average concentration produced by any secondary reflector 11, $C_2$, is the ratio of entrance face 10 area to exit face 12 area. In general, the slope angles for different sides of polygonal windows 11 will be different, to optimize gap size and concentration factors. But for illustrative purposes, in the case of an approximately square window 11 with both entrance faces 10 subtending angle "α" and with both edge slopes "s," the concentration increase is given by:

$$C_2 = \{1 - 2t\cdot\tan(s)/\alpha b\}^{-2}. \text{ (square window)} \qquad (13)$$

The total geometric concentration for a system with such a prismatic window 11 is given by the product of $C_2$ and the concentration $C_1$ at the window entrance 10, given by equation (9) or equation (10).

Equations (12) and (13) apply equally well to secondary reflectors made as prismatic windows 11 or mirrored frames 45. The following analysis through equation (17) is derived for secondary reflectors made as prismatic windows 11, and for singly reflected rays. It may be applied also for secondary reflectors made as mirrored frames with external reflection, by setting the refractive index "n" equal to unity.

With reference to FIG. 21, for on-axis rays, the angle of incidence at the window's edge is α/2, and by Snell's law the angle of refraction into the window 11 is, for small α, close to α/2n, where n is the refractive index of the prismatic window. An on-axis ray reflects from the edge 13 of the sloping side at grazing angle s+α/2n and is thus incident at the exit face 12 of the window 11 at angle 2s+α/2n.

For off-axis rays, their path through the window 11 depends on their angle of incidence and position on the face 10. Because optical etendue is preserved for light entering the windows or mirrored frames 11, rays incident on the primary collector 1 at off-axis angle $θ_t$ will, after refraction by the ball lens 5, be deviated from the rays from an on-axis source by angle $\sim\theta_i\sqrt{C_1}$, where $C_1$ is the local concentration at the receiving surface 9. The largest angles of incidence for off-axis rays on the window entrance face 10 occur at the very edges and are up to $\alpha/2+\sim\theta_i\sqrt{C_1}$, when the mispointing is in a direction perpendicular to the reflecting face. Such rays will be refracted into the window 11 at an angle of refraction given by Snell's law, approximately $(\alpha/2+\theta_i\sqrt{C})/n$. After reflection at the sloping edge 13, the angle of incidence at the exit face 12 is given by:

$$\theta_{exit}=2s+(\alpha/2+\theta_i\sqrt{C_1})/n. \quad (14)$$

This angle is of special significance in the design of a prismatic window 11, since light would be lost to total internal reflection at the exit window 12 if $\theta_{exit}$ exceeds the critical angle for total internal reflection, equal to $\sin^{-1}(n_{gap}/n)$, where $n_{gap}$ is the refractive index of the material in the small gap between the window 11 and the cell 15. This critical angle is preferably increased by use of index matching material ($n_{gap}\sim n$) in the gap. Preferably, this material will also be an optical cement that serves also to attach the window 11 to the cell 15.

For the specific geometry illustrated in FIG. 21, with thicker windows 11 optimized for uniform cell illumination, the preferred ratio of window thickness, t, to entrance face width may be shown as follows to depend only on s, n and $\alpha$. Uniform illumination is obtained for on-axis pointing when the extreme edge ray reflects to strike the center of the exit face 12 as illustrated in FIG. 21. Equating the half-width of the entrance face 10 given by the geometries of the incident and refracted rays yields:

$$\tfrac{1}{2}b\cdot\sin\alpha=t\cdot\tan(2s+\alpha/2n),$$

which can be solved to obtain the ratio of window thickness to entrance face width $\alpha b$:

$$t/\alpha b=\tfrac{1}{2}\tan(2s+\alpha/2n), \text{ (for uniform cell illumination)} \quad (15)$$

and the increase in concentration by the secondary reflector from equations (13) and (15) is:

$$C_2=\{1-\tan(s)/\tan(2s+\alpha/2n)\}^{-2} \text{ (for uniform cell illumination).} \quad (16)$$

One further performance consideration for thick windows or mirrored frames 11 is the intercept loss for off-axis rays that are edge-reflected across the window 11 and are refracted out of a prismatic window 11 at the opposite edge instead of reaching the exit face 12 and photovoltaic cell 15. From the geometry of FIG. 5, such loss begins when $\theta_{exit}$ (equation (14) for the rays at the extreme window edge exceeds $\theta_{escape}$ given by:

$$\theta_{escape}=\tan^{-1}\{(\alpha b/t\cdot\tan(s)\}. \quad (17)$$

The following illustrates use of the above analysis to estimate the preferred dimensions for prismatic windows or mirrored frames 11. In these examples, the secondary reflectors are as dimensioned in the outer ring in FIG. 21 with $\alpha=12°$ and edges sloped at angle $s=16°$.

Figure 12A:
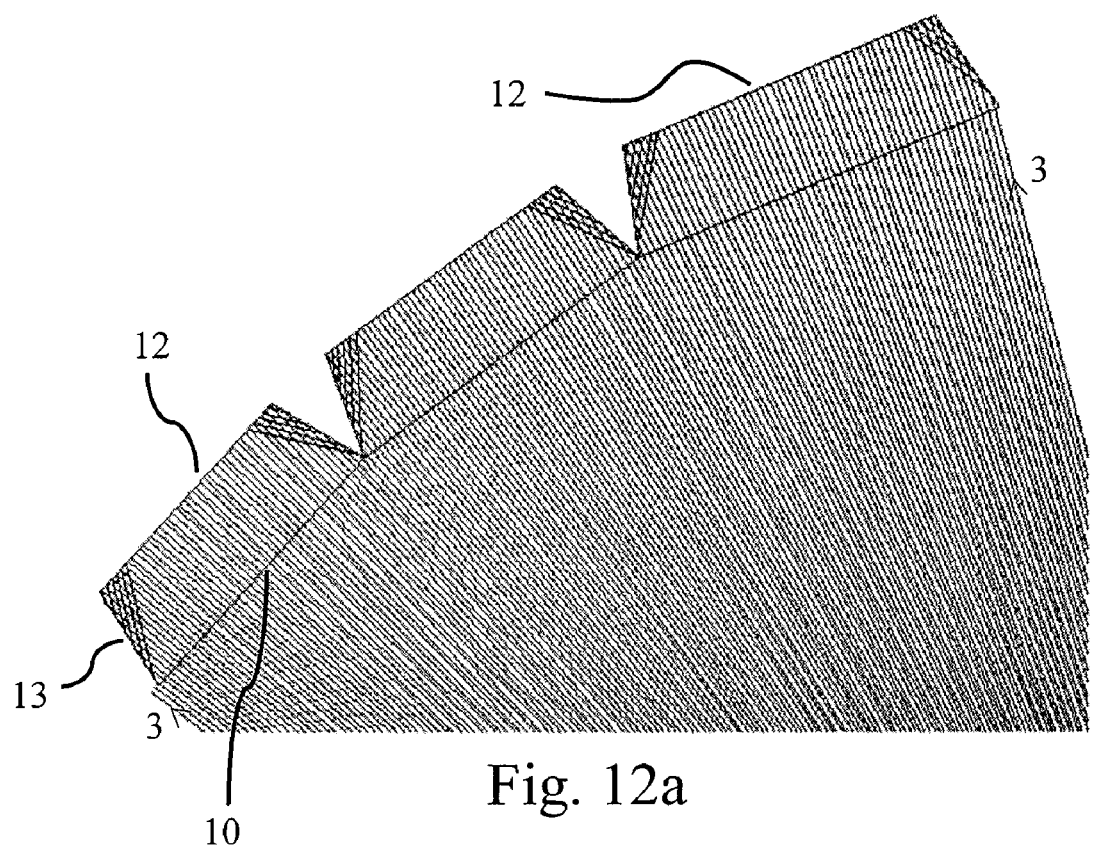
FIG. 12a is a cross section showing on-axis rays passing through a secondary reflector in the form of a thin prismatic window.

For an embodiment of type two with thin prismatic windows 11 and chosen to open gaps between photovoltaic cells 15 which are $\sim\tfrac{1}{4}$ of the active cell width, it follows from equations (12) and (13), using the above values of $\alpha$ and s, that a window thickness 0.31 of the cell width is required, and that the concentration will be increased by edge brightening by a factor $C_2=1.39$ on average, in the square cell approximation. FIG. 12a shows in cross section prismatic windows 11 according to this prescription, with rays 3 reflected by sloping side surfaces 13 onto exit faces 12. The gaps have $\tfrac{1}{4}$ the width of the photovoltaic cells 15, which are not shown but are in contact with (and are matched in size to) the exit faces 12.

Figure 12B:
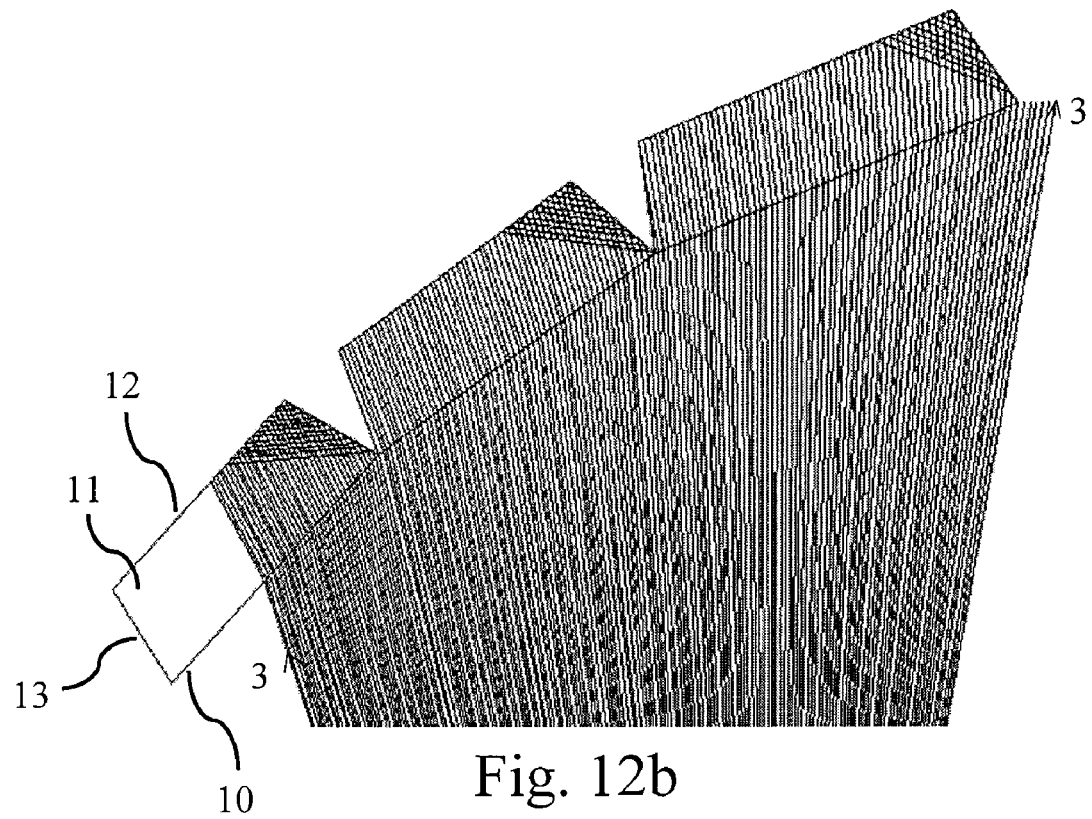
FIG. 12b is a cross section showing off-axis rays passing through a secondary reflector in the form of a thin prismatic window.

FIG. 12b illustrates the same prismatic windows 11 as in FIG. 12a, now showing off-axis rays refracted at the entrance faces 10. The refractive index is taken to be that of fused quartz, n=1.46, though other glasses with low absorption and higher refractive index may be preferred for the prismatic windows 11.

In an alternative preferred embodiment of type three with thicker windows 11 chosen to produce uniform illumination, as illustrated in FIG. 5, the window thickness from equation (15) is 1.12 times the exit face or cell width (0.68 of the front face width). In this case, if the window is square, the increase in concentration $C_2$, from equation (16), is 2.71.

As an illustration of concentrator designs for use with a specified primary reflector 1 and at a specified concentration, consider a concentrator to be used with a circular paraboloidal primary 1 of focal ratio f/0.5. The concentrator is configured with photovoltaic cells 15 behind approximately square secondary reflectors 45, and that a concentration of ~1000 is targeted for the outermost cells 15. For this example, losses from intercepted rays, absorption and reflection at dielectric interfaces, primary reflectivity and mispointing intercepts are estimated at about 20%, and thus for actual concentration 1000 a geometric concentration $C_1C_2$ of ~1200 is needed, for the combined primary concentration (paraboloid 1 plus spherical field lens 5) and secondary concentration (prismatic windows or mirrored frames 11). Two concentrator designs will be considered, both with $\alpha=12°$ and $s=16°$: an embodiment of type two with thin secondary reflectors as in providing secondary concentration $C_2=1.39$, and an embodiment of type three with thick secondary reflectors for uniform concentration at the cells 15 and secondary concentration $C_2=2.71$.

The concentrations $C_1$ at the entrance window 10 for the illustrative thin and thick window 11 embodiments thus need to be $1200/1.39\sim860$ and $1200/2.71\sim440$ respectively, requiring ratios $F/b=24.7$ and 17.5, from equation (9). (Here the average value for r/F is taken to be 0.9, appropriate for the secondary reflectors around the edge of receiving surface matched to the f/0.5 primary reflector). For a ball lens 5 of fused silica, for which the preferred ratio b/a=1.546, the preferred ratios of ball lens 5 radius to paraboloid focal length, a/F, are thus 0.0263 and 0.037 respectively, and from equation (5) the critical angles for mispointing $\theta_c$ at which the power transmitted to the receiving surface 9 drops to zero are 1.5° and 2.12° respectively.

For secondary reflectors in the form of prismatic windows, the following considerations apply for rays that are total internally reflected once. For on-axis illumination, rays entering at the edges of the entrance aperture 10 are incident at the exit face 12 at angle $\theta_{exit}=36°$. For off-axis rays, the angle of incidence at the exit face 12 after reflection by the window edges 13 depends on $C_1$ and may be derived from equation (14). For $C_1=860$ in the thin window illustration, $\theta_{exit}$ is increased to a maximum of 50.5° for rays incident 1° off-axis and 53.4° for rays incident 1.2° off-axis. Since the critical exit angle for total internal reflection from silica to air is 43°, index matching would be needed to prevent reflection loss of these rays. For $C_1=440$ for the illustrative thick window example, the angle $\theta_{escape}$ at which some extreme edge rays 7 begin to miss the photovoltaic cell 15 and exit the edge surfaces is 49.8°, from equation (17), which corresponds to off-axis rays incident at just under 1°, given by equation (14).

Rays incident in the corners of secondary reflectors are reflected twice, at each of the sloping surfaces that form the corner. Angles of incidence at the exit face are larger after the second reflection, and are thus more subject to losses from total internal reflection if no index-matching medium is used.

Since the fraction of doubly reflected rays increases with depth, potential losses from total internal reflection are greater for thick secondary reflectors implemented as prismatic windows.

The above analysis and equations are useful for estimating initial design parameters. For any specific implementation of the invention, detailed performance analysis of such aspects as the local concentration and intercept, total power throughput, the propagation of doubly reflected corner rays, and reflection from warped reflectors are preferably analyzed and optimized by ray tracing. This process allows for detailed modeling of single and multiple reflections in square, trapezoidal or polyhedral secondary reflectors and lightpipes, and takes account of the spread of ray angles due to the width of the sun's disc and projected errors from mispointing or mirror figure error. Examples of such ray tracing are illustrated in FIG. 13a and FIG. 13b, and in FIG. 38a and FIG. 38b.

The illustrative examples above are representative only. It will be apparent that the optical design of the invention is capable of delivering concentrations larger or smaller than 1000, in the event that more efficient photovoltaic cells 15 become available for which higher or lower concentrations, respectively, are preferred for optimum cost performance. An especially preferred concentration is greater than 1000. A preferred concentration is in the range of 800 to 1000. A less preferred concentration is in the range of 500 to 1000.

The choice between total internal or external reflection also will come down to cost, performance and reliability. Total internal reflection in a prismatic window 11 is itself loss free. Losses from dielectric or total internal reflection at the interface between a prismatic window 11 and the photovoltaic cell 15 are preferably eliminated through the use of index matching material in the gap. However, index matching materials with adequate longevity at very high levels of solar concentration may not be available, and the cost of larger prismatic windows 11 made from an optically stable and highly transparent dielectric material may prove high.

External reflection provides an alternative that avoids the difficulties of a coupling medium, but will incur some loss. Clean bare silver in unpolarized light incident 70° from normal incidence has reflectivity of 96.2% @ 400 nm, 97.5% @ 900 nm and 96.5% @ 1400 nm, thus averaging ~97% across the solar spectrum. Therefore the total loss of an ideal deep secondary reflector (with ⅔ of the light reflected) will be around 2%. Protective coatings may increase this loss somewhat. External reflection at a mirrored frame is likely to be preferred for larger secondary reflectors in generators 4 using larger square photovoltaic cells 15, in order to minimize manufacturing costs.

A Method of Manufacture for a Concave Receiver Assembly Carrying a Plurality of Photovoltaic Cells A generator 4 incorporating a plurality of photovoltaic cells 15 in a concave array may be manufactured with the cells 15 supported by a continuous curved shell 20 made of thermally conductive ceramic, as shown in the exploded view formed by FIGS. 41a, 41b, 41c and 41d. In the example illustrated, FIG. 41a shows a shell 20 faceted in a pattern suitable for carrying cells 15 in a circular radial tiling pattern as illustrated in FIG. 13a. The shell 20 acts as a curved substrate for a printed circuit with traces as shown in FIG. 41b, formed from a copper layer 17 bonded to the ceramic shell 20. Copper layers 17 may be directly bonded to both concave and convex sides of the ceramic shell 20, so as to achieve a composite sandwich structure whose thermal expansion coefficient matches that of the photovoltaic cells 15, and whose shape is stable over the range of operating temperatures. The cells 15 and bypass diodes 30 shown in FIG. 41c are affixed to the copper layer 17 preferably by a thermally conductive material such as solder 16. If secondary reflectors in the form of prismatic windows 11 are to be part of the generator 4, as shown in FIG. 41d, these are preferably bonded to the cells 15 with optically transmitting material 14 and thus supported by the ceramic shell 20, via the cells 15. The four layers shown in the exploded view of FIGS. 41a, 41b, 41c and 41d together form a one-piece, multi-cell receiver assembly 78, as shown in the cutaway view of FIG. 15. Here prismatic windows 11 are seen attached to photovoltaic cells 15, which connect through copper pads 17 to a ceramic shell 20.

The continuous curved shell 20 forms the boundary between two sealed chambers, as illustrated in FIG. 2. The concave side forms a chamber 8, which is preferably sealed from the outside atmosphere by the spherical ball lens 5, or by an external window 101, as illustrated in FIG. 26. The convex side forms part of a second sealed chamber to contain the cooling fluid 22. To prevent chemical interaction between the ceramic 20 and the cooling fluid 22 and to prevent bimetallic type distortion, the convex polyhedral surface will preferably have on it also a copper layer 21. The outer copper layer 21 is preferably textured or formed into protruding pins to facilitate heat transfer into the cooling fluid 22. Cooling by the fluid 22 may be by boiling, as in a heat pipe, or by pumped liquid.

The advantage of attaching a plurality of photovoltaic cells 15 to a single sandwich structure of copper and ceramic is that it provides a direct thermal path to cooling fluid in a sealed chamber, by a means that both lends itself to mass production and avoids the use of a thermal interface medium. A continuous supporting structure made as a sandwich structure of ceramic 20 and copper 17 is preferred to one made of bulk metal, because suitable metals of high thermal conductivity, such as copper or aluminum, also have high electrical conductivity and a high thermal expansion coefficient. As a result, a continuous metal support will in general require that cells 15 be attached via transition layers of both ceramic for electrical insulation and a flexible thermal interface medium (TIM) to allow for differential thermal expansion. Such interface layers add complexity in construction and potential long-term reliability problems from the TIM. Another advantage of mounting a plurality of cells 15 on a single ceramic support 20 is that low-cost printed circuit technology may be used throughout to make electrical connections to bypass diodes 30 and between the cells 15. Both components may be simply attached to a one-sided printed circuit, because of the gaps opened between the photovoltaic cells 15 by use of the secondary reflectors 45 according to this invention.

The supporting ceramic shell 20 is preferably manufactured as a single monolithic piece, and thus will have high structural integrity and should provide a long life with leak-free operation of the fluid 22 used to cool the cells 15. By locating all the electrical components and wiring around the inside perimeter of the cup 20, no penetrations of the shell 20 are needed. A preferred method of construction is with direct bonded copper layers, DBC, on both sides of the ceramic shell 20. DBC layers are common on aluminum nitride, alumina and beryllia ceramics used to make flat sandwich panels, for high power electronic circuit boards as well as for flat thermally-conductive substrates for single multi-junction photovoltaic cells 15. In the concave composite structure of this invention, the copper layer thicknesses are preferably chosen so the expansion coefficient of the composite shell matches that of the multifunction photovoltaic cells 15. The thickness of the inner layer of copper 17 is chosen also to carry the photovoltaic current with minimal resistive loss. In order to manufacture a circuit 46 on a concave faceted substrate, photoresist on the concave copper cup surface will preferably be exposed by contact printing or by reimaging a concave master pattern onto the cup by a custom built optical relay. A preferred form of such a relay is a spherical lens with a smaller diameter and/or higher index than the generator field lens 5 but placed at the same center, and it would be used to image a concave master. Such a lens would include a concentric aperture stop preferably formed by an equatorial groove cut into the sphere.

Figure 42:
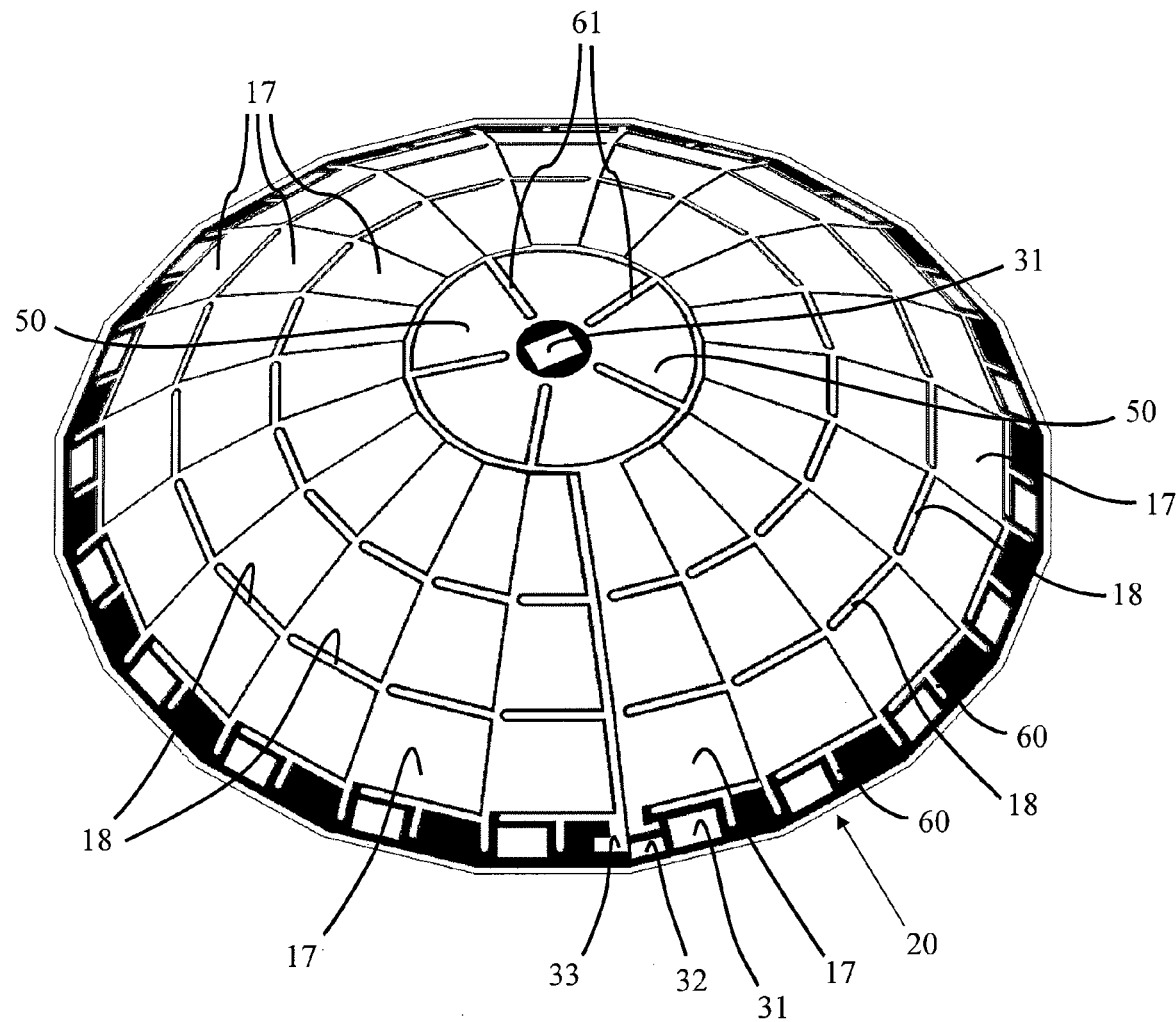
FIG. 42 is a perspective view showing details of the printed circuit copper layer of FIG. 41b, and providing the electrical connections shown schematically in FIG. 17.

FIG. 42 illustrates in more detail an example of a curved printed circuit 46 formed on the inner surface of the supporting ceramic bowl 20, and providing for parallel and series interconnections between the photovoltaic cells 15 as needed for the circuit of FIG. 17. The traces 17 and 18 are formed from the same single copper layer etched away in the areas 47 shown in black to form the illustrated pattern shown in FIG. 42. The etched away area 47 delineates base pad traces 17 for photovoltaic cells 15. The base pad traces 17 are linked radially so that when photovoltaic cells 15 are mounted on the base pad traces 17, the cell bases will be electrically connected to form parallel radial groups of cells 15. The etched away area 47 also forms conductive copper traces 18 extending between base pads 17, and electrically isolated from the base pad traces 17 by an etched line provided in the copper layer 17. The cross-sectional view shown in FIG. 15 illustrates how traces 18 provide the conductive connection indicated with reference numeral 18. Thus, by providing interconnects 19 between the edge busbars on the face of the photovoltaic cells 15 and the traces 18, radial groups of parallel connected cells 15 are connected in series with each other, i.e., the traces 18 provide the desired azimuthal series routing connections. It will be appreciated by those skilled in the art that this etched printed circuit 46 on the ceramic shell 20 shown in FIG. 42 conveniently provides the electrical connections desired for the circuit configuration shown schematically in FIG. 17.

Referring to FIG. 42, the printed circuit 46 also comprises pads 31 for parallel bypass diodes 30 around the perimeter of the ceramic shell 20. Interconnects are made from the bypass diodes 30 to the short radial fingers 60 adjacent to each bypass diode pad 31. In the layout illustrated, which corresponds to the circuit of FIG. 17, five central cells 15 are mounted on pad traces 50, which provide electrical connection of the central cells 15 in parallel. The pad trace 30 is provided for the bypass diode 30 for the central cells, which has interconnects to the central base pad 50 and one or more of the inner radial traces 61. A first output pad 32 and a second output pad 33 are provided for external connection to the receiving assembly. The output of the central cells 15 is routed to the perimeter by a wire or conductor (not shown) that provides electrical connection between the central pad 50 and the first output pad 32. A wire may be provided that runs in one of the v-shaped gaps between the sloping sides 13 of windows 11. This wire completes the circuit made otherwise entirely by solder of interconnects to the printed circuit 46, etched into traces from a single polygonal copper sheet 17 and 18. The output of all of the photovoltaic cells 15 in the array would then be available to conductors 54 and 53 routed to the output pads 32 and 33, respectively, shown in FIG. 43.

Figure 31:
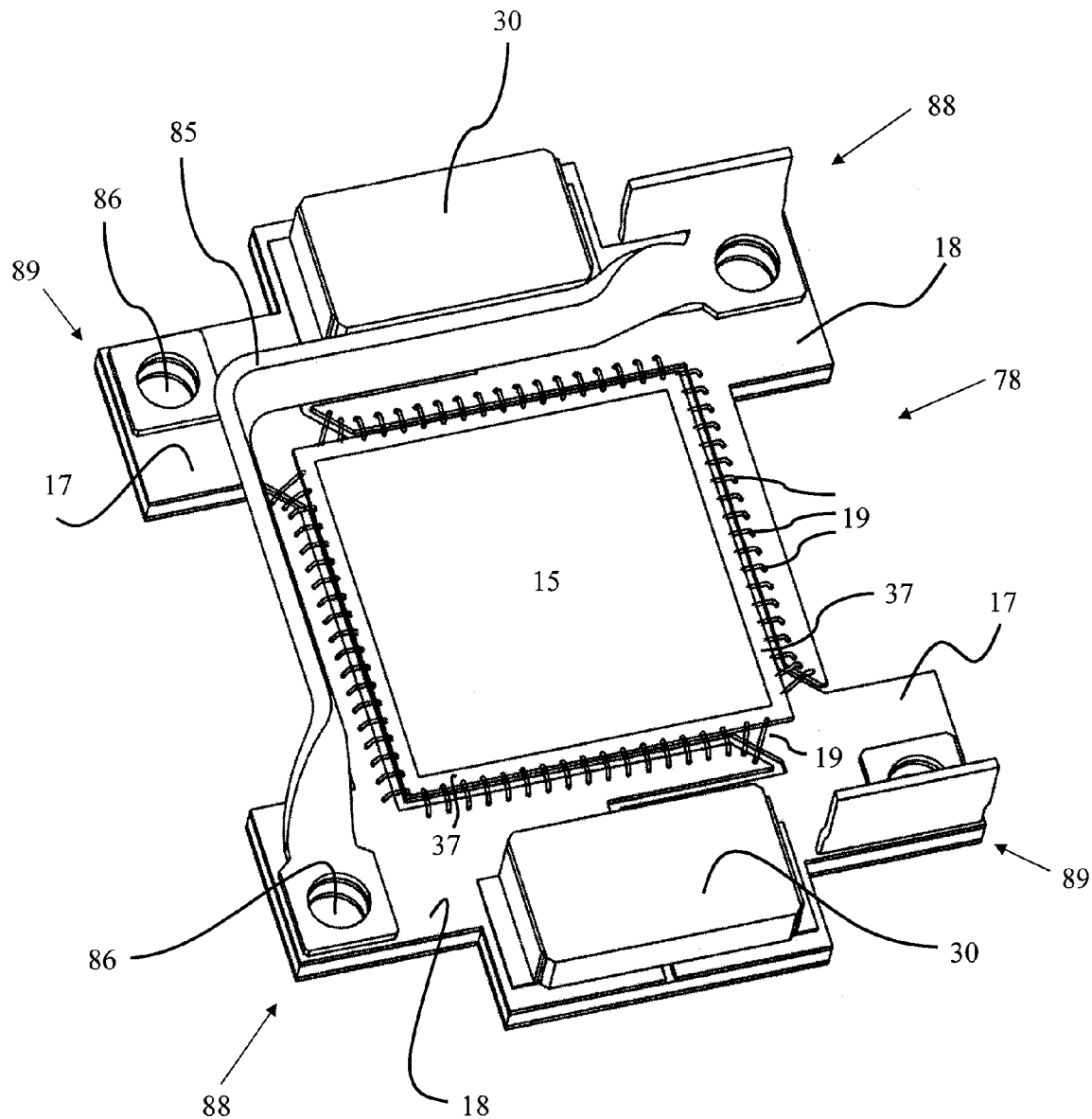
FIG. 31 is a perspective view of a single receiver assembly.
Figure 43:
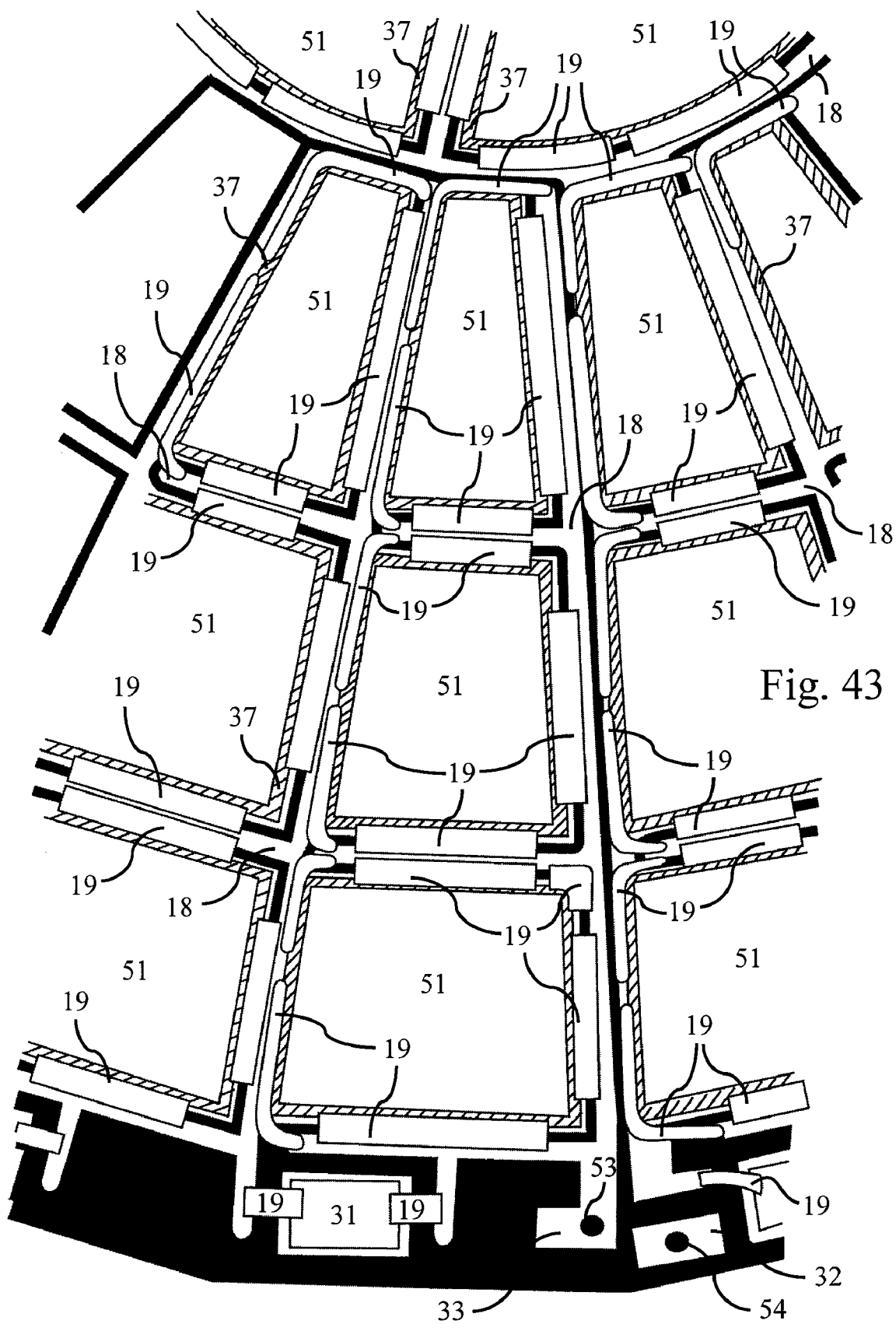
FIG. 43 is a partial top view of the printed circuit of FIG. 15 showing schematically the location of photovoltaic cells, bypass diodes and interconnects.

The edge busbars 37 of the cells 15 are electrically connected to the fingers 18 on the printed circuit 46 by interconnects 19, as may be better understood with reference to FIG. 43 and FIG. 20. Each photovoltaic cell 15 has a photovoltaically active face 51 that is responsive to solar radiation to generate electricity. Each photovoltaic cell 15 includes around its edge a perimeter busbar 37 that receives the photocurrent via the thin contact grid wires 70 across the active face 51. The interconnects preferably take the form of conductive ribbons or thin wires attached around the edges of the cells. The interconnects 19 provide a low resistance path to the printed circuit to minimize Joule losses. The example shown in FIG. 43 is illustrative only. Thus the dog-leg interconnects that attach to the left hand sides of the trapezoidal cells 15 and extend around to the fingers 18 that extend above and below the cells 15 may in practice overlap the right-hand interconnects of the cells 15 immediately to the left. In this case, insulation may be used to separate the overlapping interconnects. The interconnects 19 may alternatively be in the form of a multiplicity of thin wires, as illustrated in FIG. 31.

The advantage of a generator constructed with a concave, multi-cell receiver assembly is likely to be simplicity of construction and longevity. Construction of this type is applicable to both types of generators with secondary reflectors, shallow and deep, described in the embodiments above. This method of construction has the potential for low cost when built in very high volume, once development, engineering and tooling costs are amortized. These non-recurring costs are likely to be high, because mature manufacturing capability for ceramics with direct bond copper is currently limited to flat boards. Another challenge for this method of construction that is likely to be overcome with very high volume is that of making and attaching cells 15 with high enough reliability to achieve high yield for the completed assemblies.

An alternative construction which requires less advanced development but maintains the advantage of direct thermal conduction from the cell 15 through a DBC ceramic to cooling fluid is depicted in FIG. 21. Here individual receiver assemblies are bonded in a skeletal frame of metal of low thermal expansion coefficient to match that of the cell and receiver assembly. Since most of the heat flow does not pass through the metal skeleton, nickel alloy with expansion coefficient matching that of the receiver assemblies may be used for the skeleton, despite the poor thermal conductivity of such alloys. Electrical connections between cells 15 are made by soldered conductors linking the individual receiver assemblies. Construction of this type is applicable to both types of generators 4 with secondary reflectors described in the embodiments above, including generators 4 for use with non-circular primary reflectors 1 such as the embodiments shown in FIG. 1 and FIG. 19.

Those skilled in the art, after having the benefit of this disclosure, will appreciate that modifications and changes may be made to the embodiments described herein, different materials may be substituted, equivalent features may be used, changes may be made in the steps of manufacturing processes, and additional elements and steps may be added, all without departing from the scope and spirit of the invention. This disclosure has set forth certain presently preferred embodiments and examples only, and no attempt has been made to describe every variation and embodiment that is encompassed within the scope of the present invention. The scope of the invention is therefore defined by the claims appended hereto, and is not limited to the specific examples set forth in the above description.

What is claimed is:

1. An apparatus for generating electricity from solar radiation, comprising:
   a dish-shaped reflector, said dish-shaped reflector having a focus and being adapted to concentrate solar radiation at said focus;
   a substantially spherical lens positioned near the focus of said dish-shaped reflector;

a plurality of photovoltaic cells positioned at a receiving surface located in the optical path beyond said substantially spherical lens, said photovoltaic cells being operative to generate electricity when said photovoltaic cells are illuminated with solar radiation; and, wherein said dish-shaped reflector is operative to reflect solar radiation to said substantially spherical lens, said substantially spherical lens is operative to spread the solar radiation to said photovoltaic cells, said photovoltaic cells being operative to generate electricity when solar radiation is focused upon said photovoltaic cells by said dish-shaped reflector and said substantially spherical lens.

2. The apparatus for generating electricity according to claim 1, wherein:

said plurality of photovoltaic cells are configured to form a concave array positioned around said substantially spherical lens, said plurality of photovoltaic cells being substantially centered on the focus of said dish-shaped reflector.

3. The apparatus for generating electricity according to claim 2, wherein:

a plurality of secondary reflectors are positioned around each of said plurality of photovoltaic cells, each of said plurality of secondary reflectors being configured in corresponding relationship with an associated photovoltaic cell selected from said plurality of photovoltaic cells to reflect solar radiation onto the associated photovoltaic cell, said plurality of secondary reflectors being arranged wherein a first secondary reflector selected from said plurality of secondary reflectors is positioned adjacent to a second secondary reflector selected from said plurality of secondary reflectors, each photovoltaic cell having one or more photovoltaically active areas and one or more inactive areas that do not generate electricity, each of said secondary reflectors being positioned in an inward-sloping configuration relative to the associated photovoltaic cell in order to reflect solar radiation onto a photovoltaically active area of the associated photovoltaic cell that would otherwise be lost on an inactive area that does not generate electricity, where the inward-sloping secondary reflectors for adjacent photovoltaic cells are joined together without substantial gaps so that substantially all of the solar radiation directed toward adjacent photovoltaic cells is reflected onto a photovoltaically active area of one of said photovoltaic cells.

4. The apparatus for generating electricity according to claim 2, further comprising:

a plurality of secondary reflectors positioned around an associated photovoltaic cell selected from said plurality of photovoltaic cells, the associated photovoltaic cell having one or more photovoltaically active areas and one or more inactive areas that do not generate electricity, each secondary reflector being positioned in an inward-sloping configuration relative to the associated photovoltaic cell in order to reflect solar radiation onto a photovoltaically active area of the associated photovoltaic cell that would otherwise be lost on an inactive area that does not generate electricity.

5. The apparatus for generating electricity according to claim 4, wherein:

the plurality of secondary reflectors completely surround the associated photovoltaic cell.

6. An apparatus for generating electricity from solar radiation, comprising:

a dish-shaped primary reflector adapted to concentrate solar radiation at a focus, said dish-shaped primary reflector having a reflective surface with an axis of symmetry and a substantially paraboloidal curvature;

a substantially spherical lens positioned near the focus of said dish-shaped primary reflector which refracts the concentrated solar radiation to form an image of said dish-shaped primary reflector, said image coming to a focus on a concave image surface that is approximately concentric with the lens, the position of said image on said concave image surface being substantially stabilized against mispointing of said dish-shaped primary reflector away from the sun, the illumination of said image being locally substantially uniform, and the rays forming said image being directed approximately normal to said concave image surface, when the dish-shaped primary reflector is aligned to the sun;

a plurality of photovoltaic cells in a concave array to receive the solar radiation forming said image, and to generate electricity when illuminated with solar radiation;

secondary reflectors located between said substantially spherical lens and said photovoltaic cells, said secondary reflectors being adapted to aid in reflecting solar radiation from said substantially spherical lens onto said photovoltaic cells; and, wherein said dish-shaped primary reflector is adapted to reflect solar radiation to said substantially spherical lens; said substantially spherical lens is adapted to spread the solar radiation to said photovoltaic cells; and said photovoltaic cells being adapted to generate electricity when solar radiation is focused upon said photovoltaic cells by said dish-shaped primary reflector and said substantially spherical lens.

7. The apparatus for generating electricity according to claim 6, wherein:

said dish shaped primary reflector has a perimeter which is substantially square, when projected along said axis of symmetry of said dish-shaped primary reflector.

8. The apparatus for generating electricity according to claim 6, wherein:

said substantially spherical lens forms a hermetically sealed entrance window to a chamber formed between said substantially spherical lens and said photovoltaic cells, said chamber surrounding and protecting said photovoltaic cells and said secondary reflectors against contamination.

9. The apparatus for generating electricity according to claim 6, wherein:

said photovoltaic cells are individually substantially flat, and are tilted with respect to each other so as to form said concave array.

10. The apparatus for generating electricity according to claim 6, wherein:

said photovoltaic cells are densely packed as a mosaic of photovoltaic cells, and the mosaic has a shape and size that substantially coincides with the shape and size of said image of said dish-shaped primary reflector formed by said substantially spherical lens, such that a large fraction of the concentrated solar radiation refracted by said substantially spherical lens falls directly on said photovoltaic cells.

11. The apparatus for generating electricity according to claim 6, wherein:

a plurality of said photovoltaic cells each have a photovoltaically active area and the photovoltaically active areas are of different sizes;

wherein the plurality of photovoltaic cells are arrayed with photovoltaically active areas decreasing in area with increasing distance from said axis of symmetry in order to compensate for differences in the intensity of concentrated solar radiation focused upon each of the plurality of photovoltaic cells, so that each of the plurality of photovoltaic cells receives substantially the same power and generates substantially the same electrical current.

12. The apparatus for generating electricity according to claim 6, wherein:

photovoltaic cells that generate substantially the same current are electrically connected in series.

13. The apparatus for generating electricity according to claim 6, further comprising:

bypass diodes located outside the region of concentrated solar radiation that forms said image of said dish-shaped primary reflector, said bypass diodes being electrically connected in parallel with corresponding photovoltaic cells to provide an electrical bypass of the corresponding photovoltaic cells when a corresponding photovoltaic cell fails to generate adequate current.

14. The apparatus for generating electricity according to claim 6, wherein:

said secondary reflectors comprise substantially continuous, inward-sloping reflecting surfaces arranged as a mirrored frame, each of the mirrored frames being positioned around a corresponding photovoltaic cell selected from said plurality of photovoltaic cells, each corresponding photovoltaic cell having a photovoltaically active area and one or more light insensitive regions;

the edge of said substantially continuous, inward-sloping reflecting surfaces of each mirrored frame nearest the substantially spherical lens forming a substantially planar entrance aperture with a substantially continuous perimeter, said entrance aperture being located substantially tangent to the surface of said concave image surface formed by said substantially spherical lens of said dish-shaped primary reflector;

the edge of said substantially continuous, inward-sloping reflecting surfaces of each mirrored frame nearest the corresponding photovoltaic cell forming a substantially planar exit aperture with a substantially continuous perimeter located close to the photovoltaically active area of the corresponding photovoltaic cell, said exit aperture being smaller than said entrance aperture and configured to match closely in shape and size the photovoltaically active area of the corresponding photovoltaic cell;

wherein each mirrored frame is adapted to relay solar radiation from a section of said image formed by said substantially spherical lens onto the photovoltaically active area of the corresponding photovoltaic cell that would otherwise impinge on a light-insensitive region and be wasted; and wherein said mirrored frames are configured adjacent to each other and space is provided between adjacent mirrored frames for electrical components and connections between said plurality of photovoltaic cells.

15. The apparatus for generating electricity according to claim 14, wherein:

said substantially continuous, inward-sloping reflecting surface has a substrate made of a thermally conductive material, and said substrate is mounted to provide a thermal path to conduct away heat absorbed from concentrated solar radiation incident on said surface.

16. The apparatus for generating electricity according to claim 14, where:

said electrical components include a plurality of bypass diodes, each bypass diode being connected electrically in parallel with one of said plurality of photovoltaic cells and being located in said space between adjacent mirrored frames.

17. The apparatus for generating electricity according to claim 14, wherein:

said dish-shaped primary reflector has a perimeter which is substantially square, and the entrance aperture of each mirrored frame is quadrilateral, the four corners of said quadrilateral entrance apertures being defined by rays, said rays originating from a flat regular square grid set before said dish-shaped primary reflector, said grid having the same square aperture as said dish-shaped primary reflector and oriented normal to said axis of symmetry;

wherein said rays are projected parallel to said symmetry axis onto said dish-shaped primary reflector, where they are reflected to pass undeviated through the center of said substantially spherical lens, and which terminate on said concave image surface formed by said substantially spherical lens of said dish-shaped primary reflector; and wherein said quadrilateral entrance apertures are approximately but not exactly square and at least one said entrance aperture has a different size compared with at least one other of said quadrilateral entrance apertures, and wherein said quadrilateral entrance apertures intercept substantially the same optical power when said dish-shaped primary reflector is oriented with said axis of symmetry directed toward the sun.

18. The apparatus for generating electricity according to claim 17, wherein:

said dish-shaped primary reflector has a perimeter which is substantially square;

the photovoltaically active area of each corresponding photovoltaic cell is substantially square;

the exit aperture of each said mirrored frame being substantially square, the substantially square exit aperture of each mirrored frame closely matching the substantially square photovoltaically active area of the corresponding photovoltaic cell; and, each said mirrored frame comprising four of said substantially continuous, inward-sloping reflecting surfaces, said four reflecting surfaces of each said mirrored frame meeting along four corners, said four reflecting surfaces being generally non-planar, said four reflecting surfaces comprising a plurality of slightly tilted planar facets, where each of said four reflecting surfaces links one side of the approximately but not exactly square entrance aperture of each said mirrored frame to the corresponding side of the substantially square exit aperture of the mirrored frame.

19. The apparatus for generating electricity according to claim 18, wherein:

said four substantially continuous, inward-sloping reflecting surfaces are configured to substantially uniformly distribute solar radiation falling on a photovoltaic cell, by angling the reflecting surfaces inward such that rays of concentrated solar radiation pass close to the center of said substantially spherical lens when said dish-shaped primary reflector is aligned with said axis of symmetry aimed at the sun, and wherein such rays which are reflected once by a reflecting surface will extend from an edge to approximately half way across the substantially square photovoltaically active areas of said photovoltaic cells.

20. The apparatus for generating electricity according to claim 19, wherein:

the solar radiation falling on the substantially square photovoltaically active area of a photovoltaic cell has a concentration that is increased from said entrance aperture to said exit aperture of said mirrored frame by a factor greater than two.

21. The apparatus for generating electricity according to claim 6, wherein:

said photovoltaic cells are electrically connected in parallel in radially-oriented groups, wherein the photovoltaically active areas of the photovoltaic cells are configured so that each such group of photovoltaic cells connected electrically in parallel produce substantially the same photovoltaic current when said dish-shaped primary reflector is pointed at the sun.

22. The apparatus for generating electricity according to claim 21, wherein:

each such group of photovoltaic cells are electrically connected in parallel in radially-oriented groups so that cell current differences are spatially averaged when said dish-shaped primary reflector is mispointed away from the sun.

23. The apparatus for generating electricity according to claim 21, wherein:

a plurality of such groups of photovoltaic cells each includes at least one photovoltaic cell located at the perimeter of said concave image surface and at least one adjacent photovoltaic cell located inward toward the center of said concave image surface to minimize changes in the current through the photovoltaic cells of such groups when said dish-shaped primary reflector is mispointed away from the sun as compared to the current through the photovoltaic cells of such groups when said dish-shaped primary reflector is pointed directly at the sun.

24. The apparatus for generating electricity according to claim 21, further comprising:

bypass diodes electrically connected to such groups of photovoltaic cells to provide conductivity at times that a photovoltaic cell is not sufficiently illuminated.

25. The apparatus for generating electricity according to claim 21, wherein:

a plurality of such groups of photovoltaic cells yielding substantially the same photovoltaic current are connected in series.

26. The apparatus for generating electricity according to claim 6, wherein:

said photovoltaic cells in the concave array are each mounted individually on a substantially flat ceramic circuit board.

27. The apparatus for generating electricity according to claim 26, further comprising:

a bypass diode located on each said ceramic circuit board and electrically connected to at least one corresponding photovoltaic cell.

28. The apparatus for generating electricity according to claim 26, wherein:

said ceramic circuit boards are configured in a circular radial tiling pattern to substantially conform to said concave image surface.

29. The apparatus for generating electricity according to claim 6, further comprising:

a shell faceted in a circular radial tiling pattern, said photovoltaic cells each being affixed to an individual corresponding substantially flat facet of said shell by a thermally conductive material, said shell comprising a composite structure having a copper layer, said shell forming part of a chamber containing cooling fluid, said thermally conductive material being configured to facilitate heat transfer from said photovoltaic cells to said copper layer, and said copper layer being configured to provide a thermal path to said cooling fluid.

30. The apparatus for generating electricity according to claim 29, wherein:

said copper layer includes protruding pins to facilitate heat transfer into said cooling fluid.

31. The apparatus for generating electricity according to claim 29, wherein:

said shell comprises a ceramic circuit board.

32. The apparatus for generating electricity according to claim 6, further comprising:

a ceramic shell faceted in a circular radial tiling pattern having an inner concave side and an outer convex side, said photovoltaic cells each being affixed to an individual corresponding substantially flat facet on the inner concave side of said shell by a thermally conductive material, said shell comprising a composite structure having a copper layer, the outer convex side of said shell forming part of a chamber containing cooling fluid, said thermally conductive material and said copper layer providing a thermal path to said cooling fluid.

33. The apparatus for generating electricity according to claim 32, wherein:

said ceramic shell includes pins protruding from the outer convex side of said ceramic shell into said cooling fluid to facilitate heat transfer into said cooling fluid.

34. An apparatus for generating electricity from solar radiation, comprising:

a dish-shaped primary reflector adapted to concentrate solar radiation at a focus, said dish-shaped primary reflector having a reflective surface with an axis of symmetry and a substantially paraboloidal curvature;

a substantially spherical lens positioned near the focus of said dish-shaped primary reflector which refracts the concentrated solar radiation to form an image of said dish-shaped primary reflector, said image coming to a focus on a concave image surface that is approximately concentric with the lens, the position of said image on said concave image surface being substantially stabilized against mispointing of said dish-shaped primary reflector away from the sun, the illumination of said image being locally substantially uniform, and the rays forming said image being directed approximately normal to said concave image surface, when the dish-shaped primary reflector is aligned to the sun;

a plurality of photovoltaic cells in a concave array to receive the solar radiation forming said image, and to generate electricity when illuminated with solar radiation; and, wherein said dish-shaped primary reflector is adapted to reflect solar radiation to said substantially spherical lens; said substantially spherical lens is adapted to spread the solar radiation to said photovoltaic cells; and said photovoltaic cells being adapted to generate electricity when solar radiation is focused upon said photovoltaic cells by said dish-shaped primary reflector and said substantially spherical lens.

35. The apparatus for generating electricity according to claim 34, further comprising:

a plurality of lightpipes having an entrance aperture for receiving solar radiation from said substantially spherical lens, each said lightpipe having an exit aperture corresponding to a photovoltaic cell in the concave array for illuminating said corresponding photovoltaic cell with solar radiation.

36. An apparatus for generating power from solar radiation, comprising:
- a dish-shaped reflector, said dish-shaped reflector having a focus and being adapted to concentrate solar radiation at said focus;
- a tracker supporting said dish-shaped reflector, said tracker being movable and operative to orient said dish-shaped reflector to receive solar radiation from the sun and to track the position of the sun during daylight hours;
- a ball lens positioned near the focus of said dish-shaped reflector, said ball lens being supported by said tracker; and,
- a generator configured to receive sunlight reflected from said dish-shaped reflector through said ball lens, said generator including a concave array of a plurality of photovoltaic cells, said ball lens being operative to form a concave image of the dish-shaped reflector upon the concave array of photovoltaic cells, said generator being supported by said tracker, said generator being operative to convert solar radiation into usable power.

37. The apparatus for generating power according to claim 36, further comprising:
- a protective window positioned between said dish-shaped reflector and said ball lens, said protective window and said ball lens forming a sealed enclosure to prevent contamination of the ball lens.

38. The apparatus for generating power according to claim 37, wherein:
said protective window is made substantially larger in area than said ball lens, so that the intensity of concentrated solar radiation at said protective window is substantially less than at said ball lens.

39. The apparatus for generating power according to claim 36, wherein:
said ball lens comprises fused silica glass.

40. An apparatus for generating power from solar radiation, comprising:
- a tracker for tracking the movement of the sun, said tracker having a base support, said tracker comprising a movable steel structure supported by said base support;
- a plurality of dish-shaped reflectors, each said dish-shaped reflector having a focus and being adapted to concentrate solar radiation at said focus, said dish-shaped reflectors being supported by the steel structure of said tracker in a co-axial array;
- a ball lens positioned near the focus of each said dish-shaped reflector and supported by the steel structure of said tracker; and,
- a generator configured to receive sunlight from said ball lens, said generator comprising a plurality of photovoltaic cells configured in a concave array around said ball lens, said ball lens being adapted to provide substantially uniform illumination of the plurality of photovoltaic cells, said generator being supported by the steel structure of said tracker, said generator being operative to convert solar radiation into usable power;
- whereby power is generated from solar radiation by the generators when the array of dish-shaped reflectors, and corresponding ball lenses and generators, are pointed at the sun.

41. The apparatus for generating power according to claim 40, wherein:
the ball lens is a full sphere.

42. The apparatus for generating power according to claim 40, wherein:
the generator includes secondary reflectors located between the ball lens and the concave array of photovoltaic cells, the secondary reflectors being adapted to aid in reflecting solar radiation from the ball lens onto the photovoltaic cells.

43. The apparatus for generating power according to claim 42, wherein:
the ball lens is a full sphere.

44. The apparatus for generating power according to claim 43, wherein:
the dish-shaped reflectors are paraboloidal reflectors.

45. The apparatus for generating power according to claim 44, wherein:
the tracker is a two-axis tracker.

* * * * *